(12) United States Patent
Kawashima et al.

(10) Patent No.: US 6,351,304 B1
(45) Date of Patent: Feb. 26, 2002

(54) MULTIPLE EXPOSURE METHOD

(75) Inventors: Miyoko Kawashima, Tochigi-ken; Yumiko Ohsaki, Utsunomiya, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/584,736

(22) Filed: Jun. 1, 2000

(30) Foreign Application Priority Data

Jun. 4, 1999  (JP) ........................................... 11-157837
Jun. 4, 1999  (JP) ........................................... 11-157854
Jun. 4, 1999  (JP) ........................................... 11-157891

(51) Int. Cl.[7] ........................ G03B 27/52; G03B 13/24; G03B 27/54; A61N 5/00; G03L 5/00
(52) U.S. Cl. ............................. 355/55; 355/44; 355/53; 355/67; 355/77; 250/492.2; 250/492.22; 430/311; 430/312
(58) Field of Search ............................ 355/44, 53, 55, 355/67, 77; 250/492.2, 492.22; 430/311, 312

(56) References Cited

U.S. PATENT DOCUMENTS 4,777,641 A * 10/1988 Inagaki et al. ................ 378/34
5,524,131 A    6/1996 Uzawa et al. ................. 378/34

FOREIGN PATENT DOCUMENTS

JP          2-100311        4/1990

* cited by examiner

*Primary Examiner*—Russell Adams
*Assistant Examiner*—Khaled Brown
(74) *Attorney, Agent, or Firm*—Fitzpatrick, Cella, Harper & Scinto

(57) ABSTRACT

An exposure method for exposing a substrate through a multiple exposure process including a first exposure using a first pattern having fine line elements of different directions, and a second exposure using a second pattern including a periodic pattern, wherein a periodicity direction of the periodic pattern is registered with a direction along which fine line elements of a predetermined direction, of the different directions, are arrayed, while, at least in a portion of the periodic pattern, a pattern or a boundary between adjacent patterns as well as a portion of or the whole of the fine line elements of the particular direction are adapted to be printed at the same location, and wherein the second pattern is so structured that one or those of the fine line elements of the first pattern extending in a particular direction different from the predetermined direction are not superposed with the periodic pattern.

36 Claims, 47 Drawing Sheets

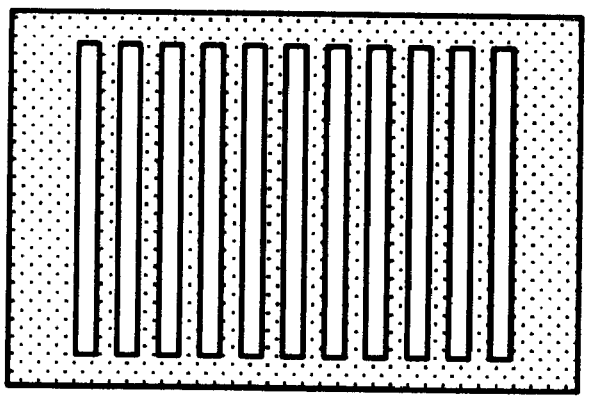
FIG. 2A  PERIODIC PATTERN
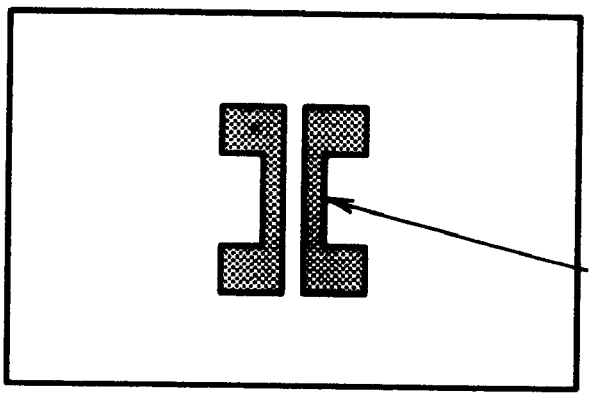
FIG. 2B  STANDARD EXPOSURE PATTERN / FINE LINE
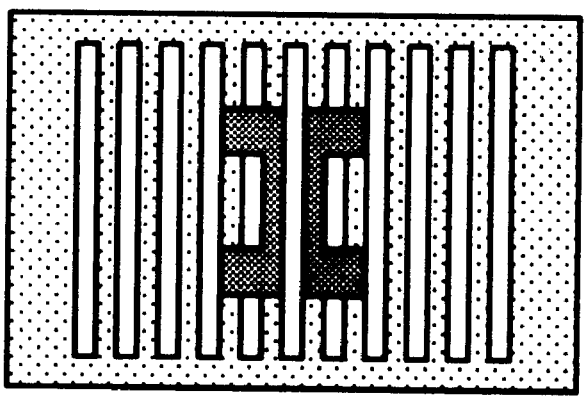
FIG. 2C  COMPOSITE PATTERN

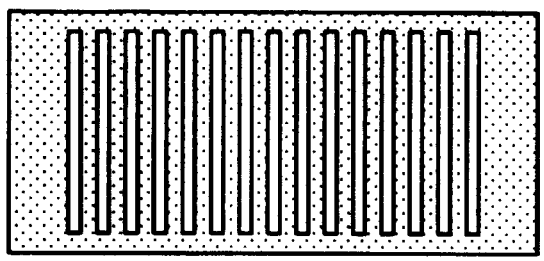
FIG. 3A  PERIODIC PATTERN
PATTERN SPACING A
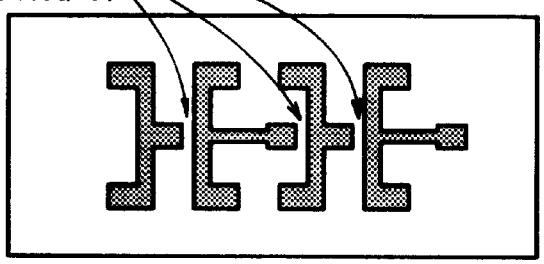
FIG. 3B  STANDARD EXPOSURE PATTERN
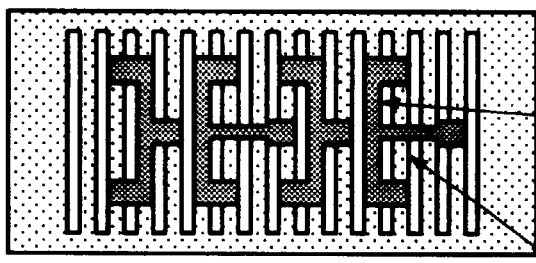
FIG. 3C  COMPOSITE PATTERN
FINE LINE ORTHOGONAL TO PERIODICITY DIRECTION OF PERIODIC PATTERN
FINE LINE PARALLEL TO PERIODICITY DIRECTION OF PERIODIC PATTERN

| SINGLE-EXPOSURE PERIODIC PATTERN | TWICE-EXPOSURE (MULTIPLE VALUE) STANDARD PATTERN | DUAL EXPOSURE |
|---|---|---|
| 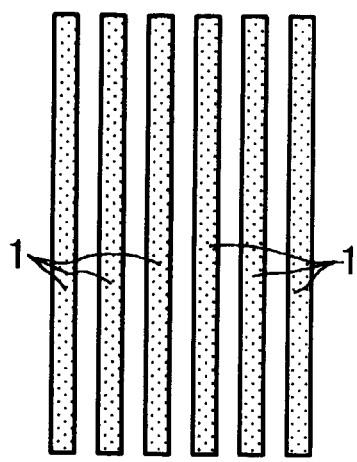 | 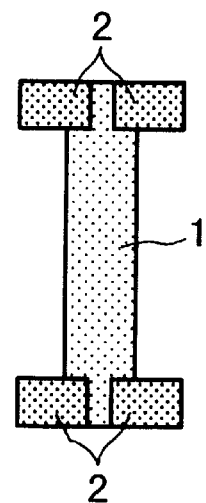 | 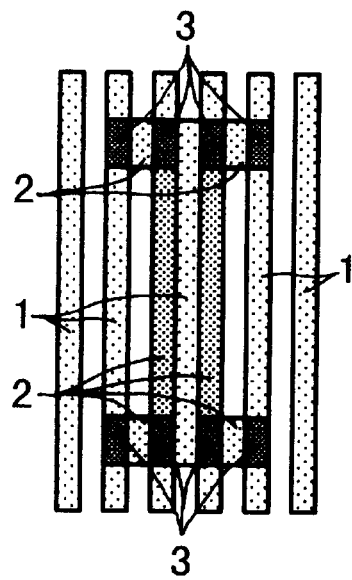 |
| FIG. 5A | FIG. 5B | FIG. 5C |
| PERIODIC PATTERN (PHASE SHIFT MASK) | STANDARD PATTERN (LIGHT TRANSMITTING PATTERN TYPE MASK) | STANDARD PATTERN (LIGHT BLOCKING PATTERN TYPE MASK) |
| 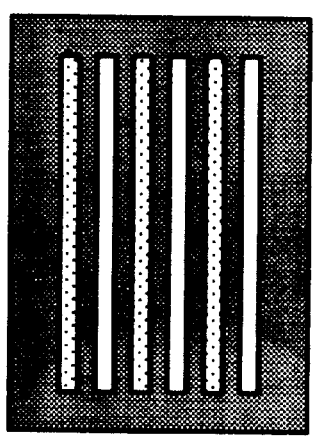 | 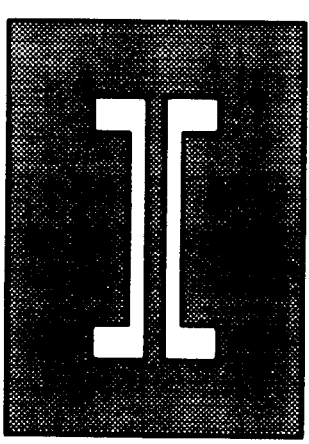 | 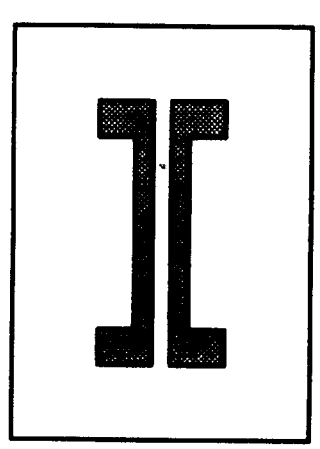 |
| FIG. 6A | FIG. 6B | FIG. 6C |

PERIODIC PATTERN

STANDARD EXPOSURE PATTERN

STANDARD EXPOSURE

EXPOSURE BASED
ON FIRST EMBODIMENT

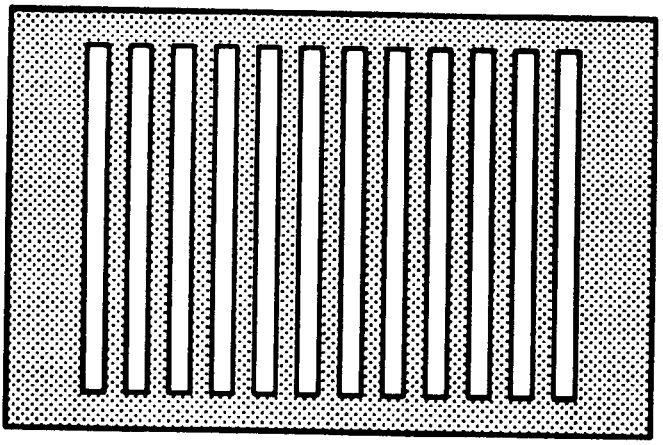
FIG. 12A  PERIODIC PATTERN
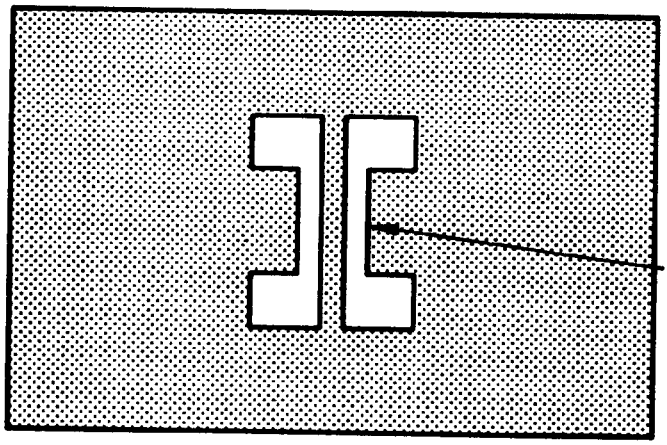
FIG. 12B  STANDARD EXPOSURE PATTERN — FINE LINE
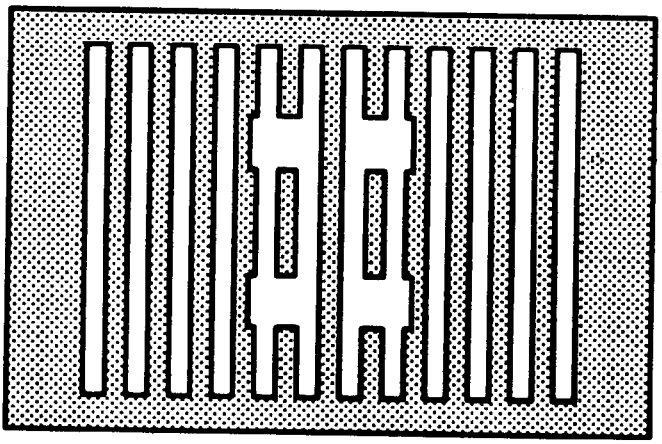
FIG. 12C  COMPOSITE PATTERN

PERIODIC PATTERN

STANDARD EXPOSURE PATTERN

PERIODIC PATTERN

STANDARD EXPOSURE PATTERN

PERIODIC PATTERN

STANDARD EXPOSURE PATTERN

PERIODIC PATTERN

STANDARD EXPOSURE PATTERN

PERIODIC PATTERN

STANDARD EXPOSURE PATTERN

PERIODIC PATTERN

STANDARD EXPOSURE PATTERN

PERIODIC PATTERN

STANDARD EXPOSURE PATTERN

PERIODIC PATTERN

STANDARD EXPOSURE PATTERN

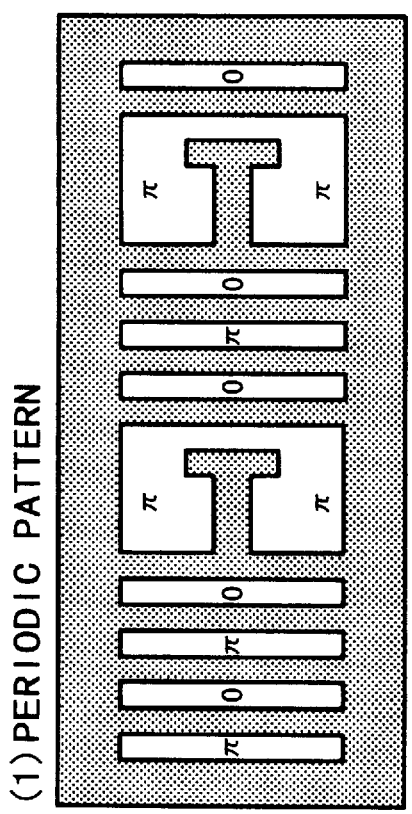
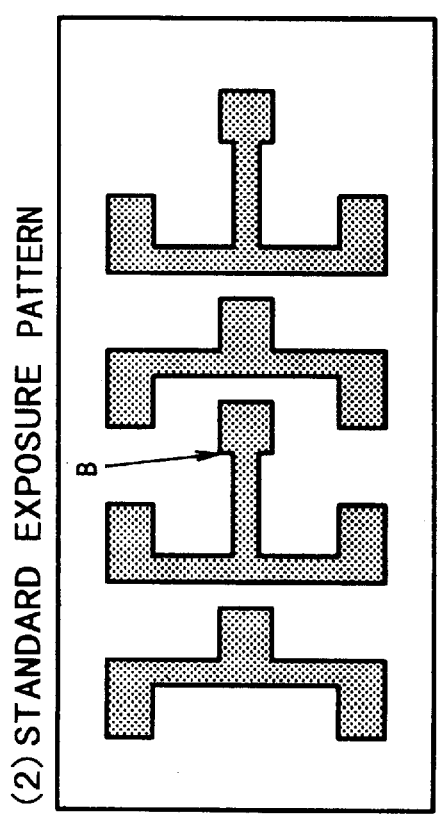
(1) PERIODIC PATTERN  (2) STANDARD EXPOSURE PATTERN
FIG. 23A
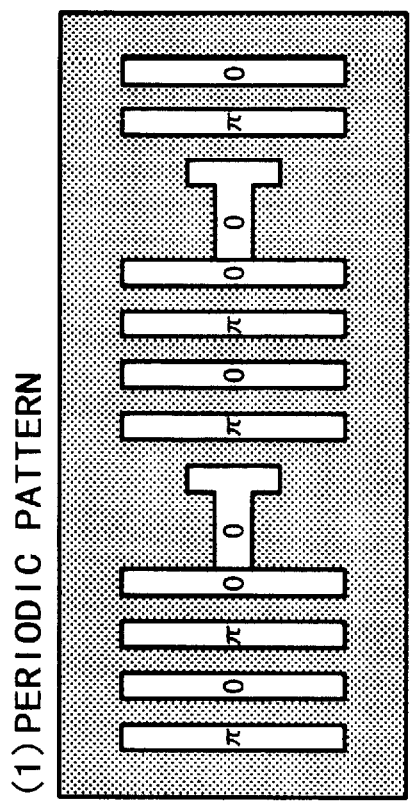
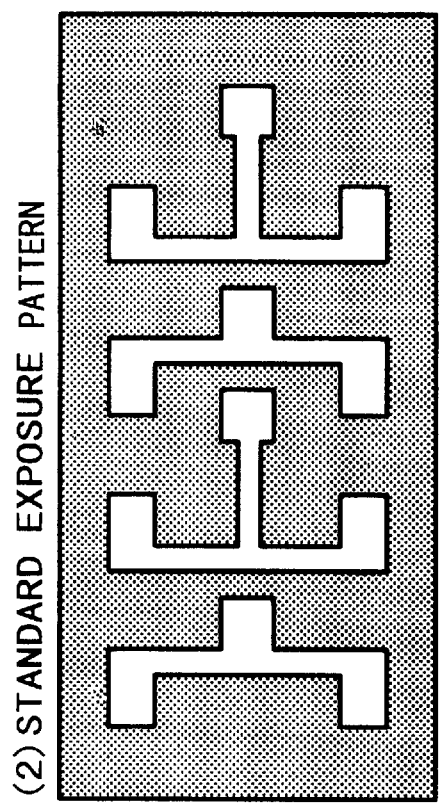
(1) PERIODIC PATTERN  (2) STANDARD EXPOSURE PATTERN
FIG. 23B

BEFORE CORRECTION
OF THINNING

AFTER CORRECTION
OF THINNING

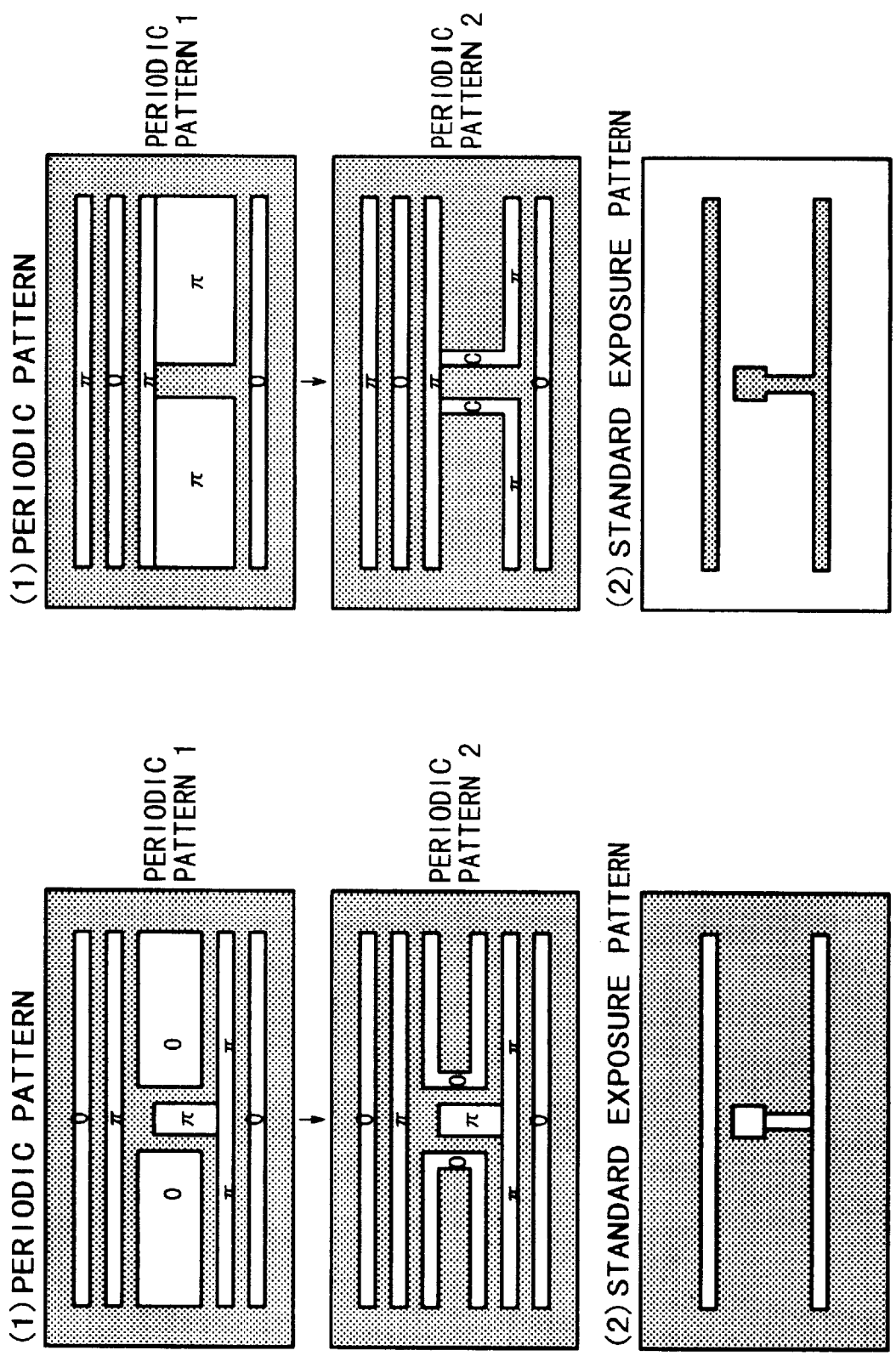

PERIODIC PATTERN

PERIODIC PATTERN 1     PERIODIC PATTERN 2

STANDARD EXPOSURE PATTERN

PERIODIC PATTERN

STANDARD EXPOSURE PATTERN

IMAGE OF
PERIODIC PATTERN 1

IMAGE OF
PERIODIC PATTERN 2

DUAL EXPOSURE WITH
PERIODIC PATTERN 1

COMPOSITE IMAGE WITH
PERIODIC PATTERN 2

PERIODIC PATTERN 1

PERIODIC PATTERN 2

↔ EDGE EFFECT BY OPPOSITE PHASES
←--→ ZERO-INTENSITY EFFECT AT LIGHT TRANSMITTING PORTION AND LIGHT BLOCKING PORTION

PERIODIC PATTERN 1
IS USED
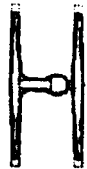
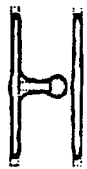
FIG. 33A
PERIODIC PATTERN 2
IS USED
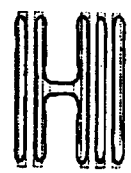
FIG. 33B
PERIODIC PATTERN 3
IS USED
FIG. 33C

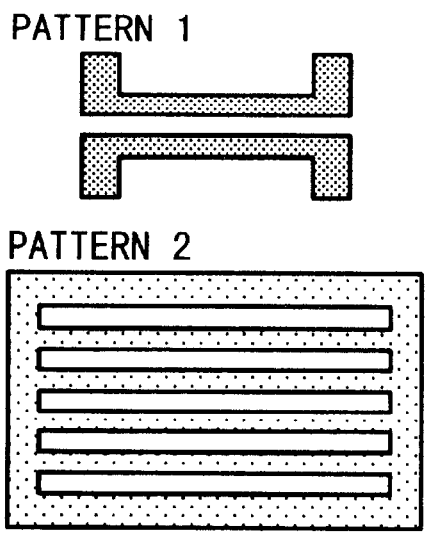
PATTERN 1
PATTERN 2
FIG. 39A
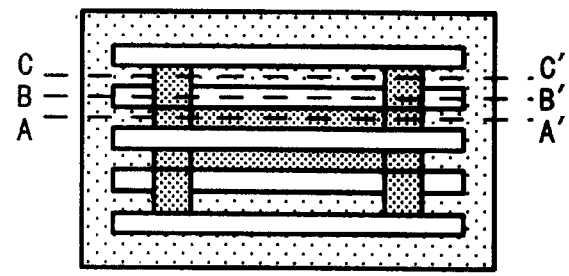
FIG. 39B
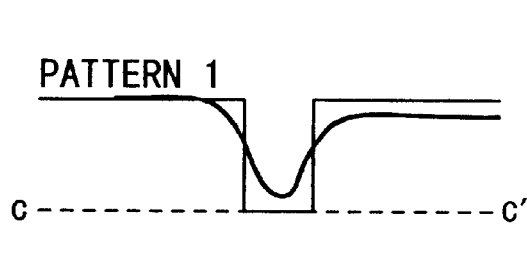
PATTERN 1
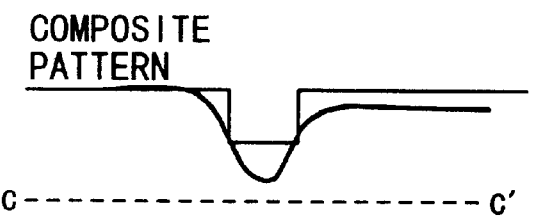
COMPOSITE PATTERN
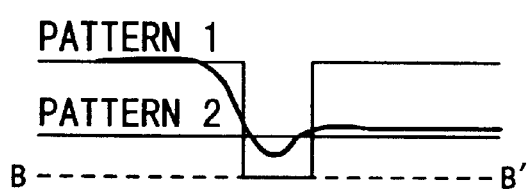
PATTERN 1
PATTERN 2
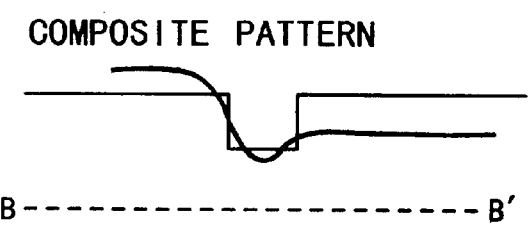
COMPOSITE PATTERN
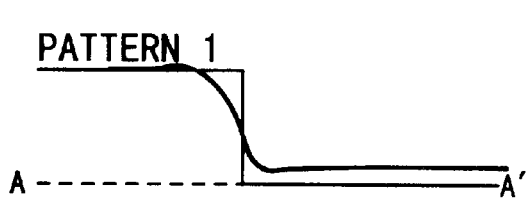
PATTERN 1
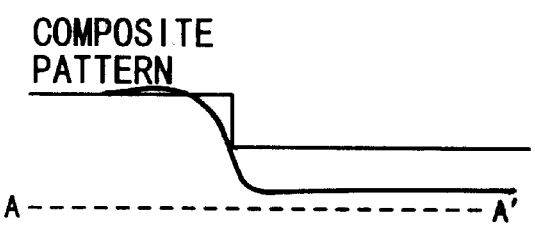
COMPOSITE PATTERN
FIG. 39C
FIG. 39D

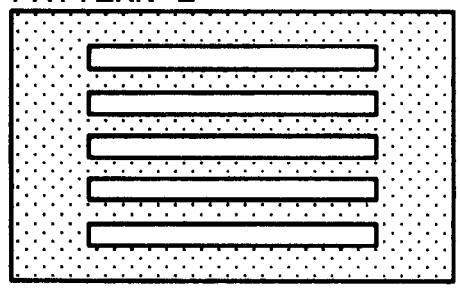
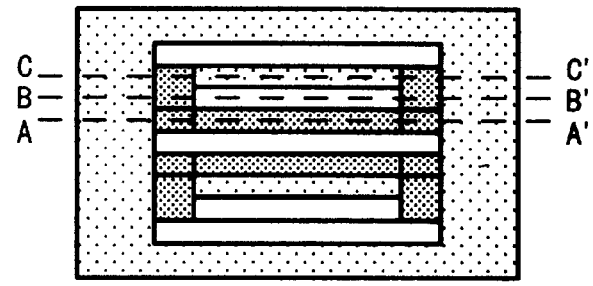
FIG. 40B
FIG. 40A
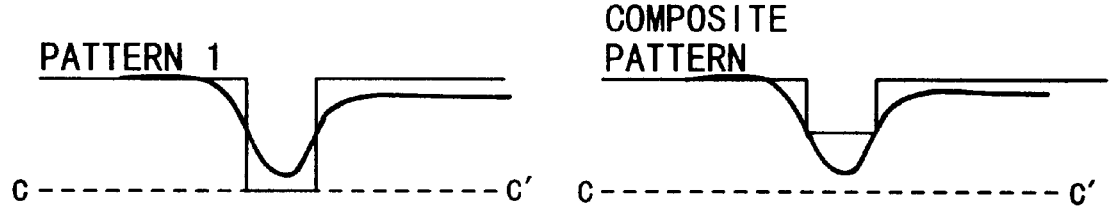
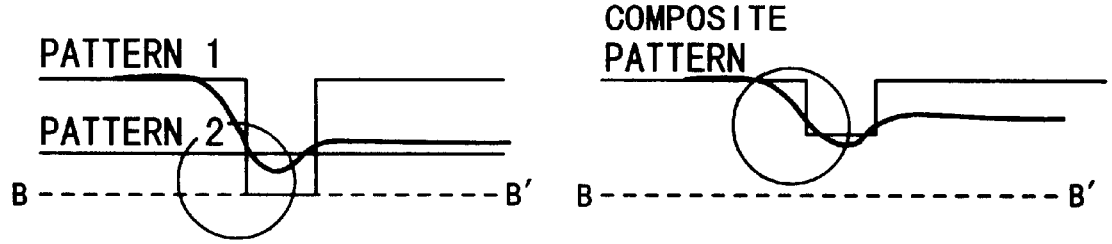
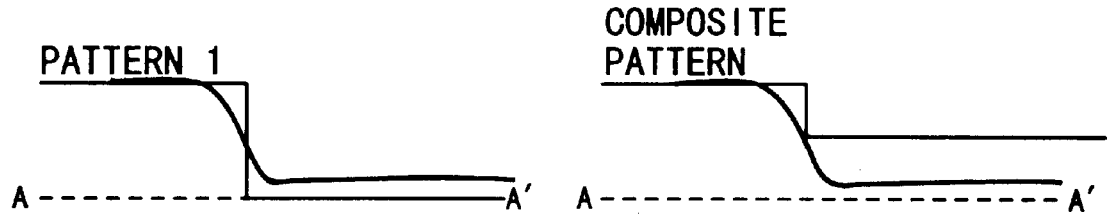
FIG. 40C        FIG. 40D (1) PERIODIC PATTERN 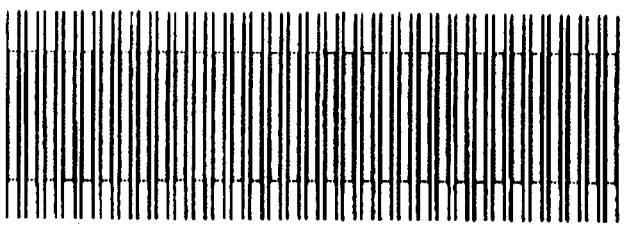
(2) STANDARD EXPOSURE PATTERN 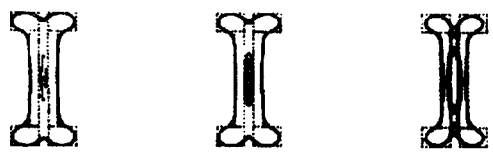
(3) COMPOSITE PATTERN 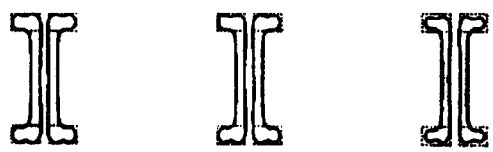
FIG. 41
(1) PERIODIC PATTERN 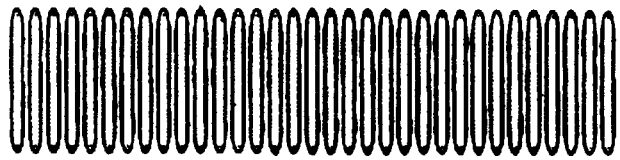
(2) STANDARD EXPOSURE PATTERN 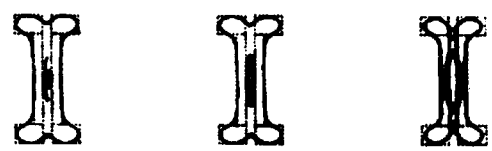
(3) COMPOSITE PATTERN 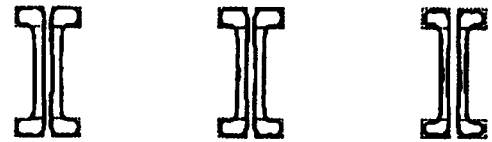
FIG. 42

|  | def=0.0 | def=0.2 | def=0.4 |
|---|---|---|---|
(1) PERIODIC PATTERN
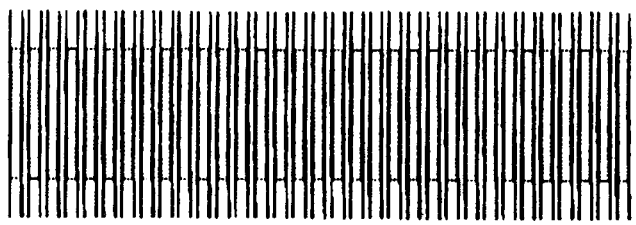
(2) STANDARD EXPOSURE PATTERN
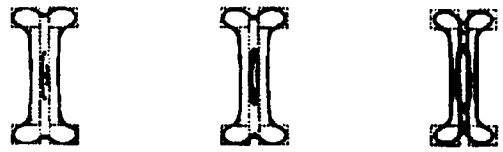
(3) COMPOSITE PATTERN
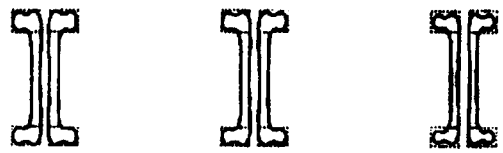
FIG. 43A
|  | def=0.0 | def=0.2 | def=0.4 |
|---|---|---|---|
(1) PERIODIC PATTERN
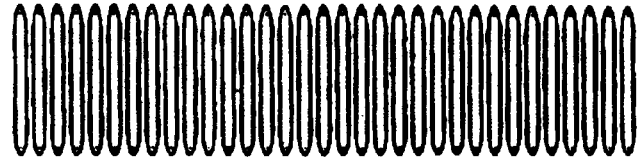
(2) STANDARD EXPOSURE PATTERN
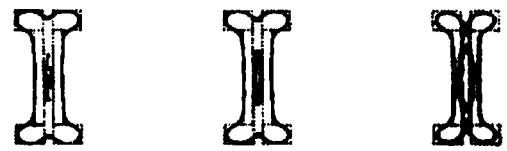
(3) COMPOSITE PATTERN
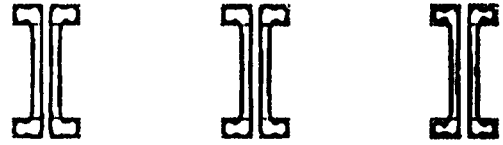
FIG. 43B

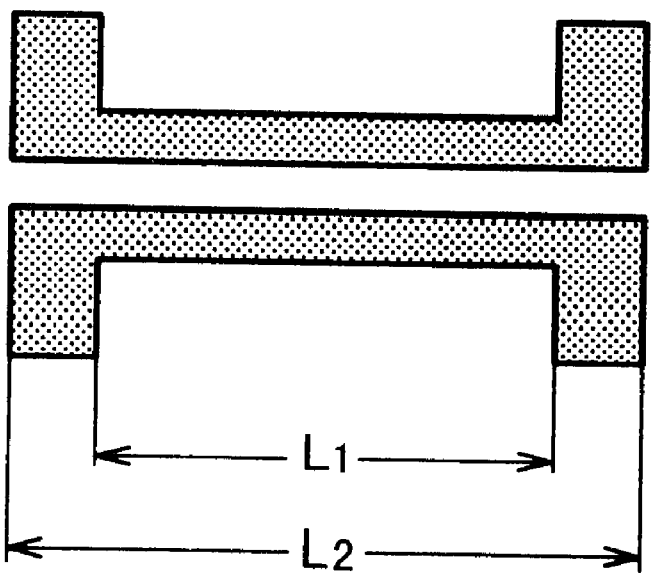
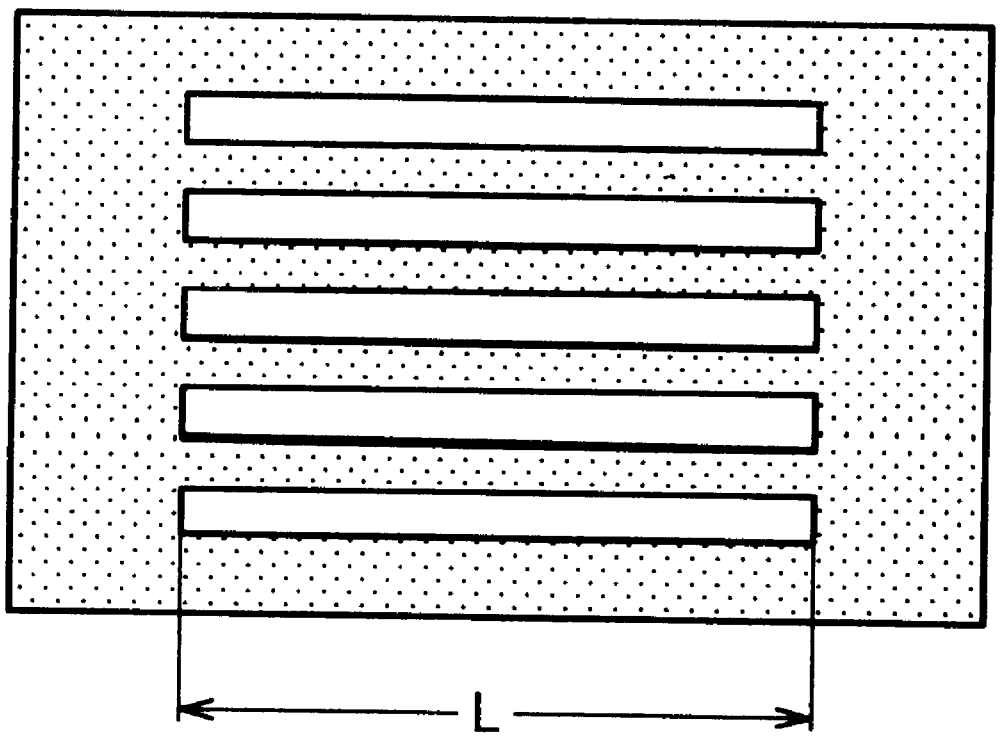
FIG. 44

(1) EDGE TYPE PHASSE SHIFT MASK
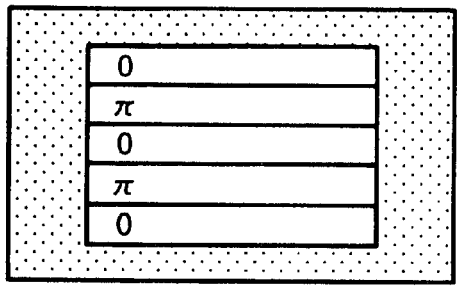
(1) BINARY MASK (TRANSMITTING PATTERN TYPE)
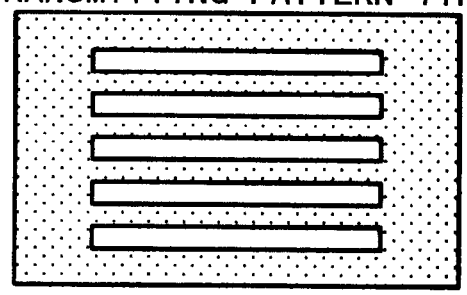
(2) STANDARD PATTERN
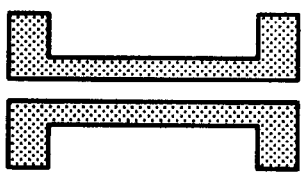
(2) STANDARD PATTERN
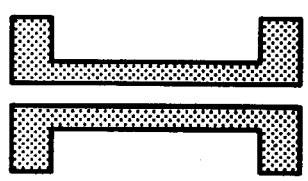
(3) COMPOSITE PATTERN
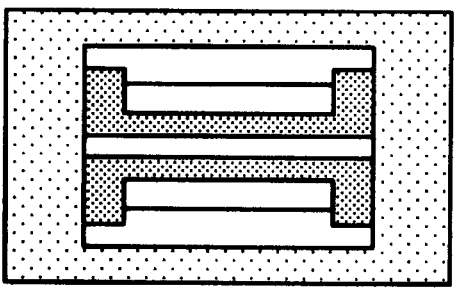
(3) COMPOSITE PATTERN
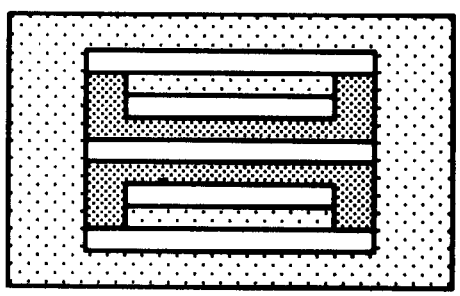
FIG. 45A
FIG. 45B (1) PERIODIC PATTERN
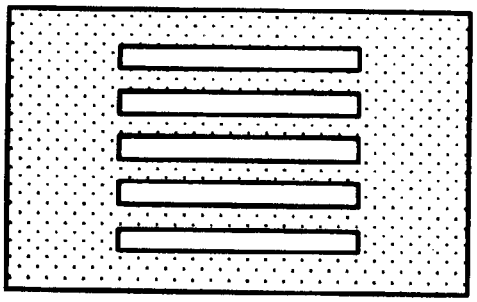
(1) PERIODIC PATTERN
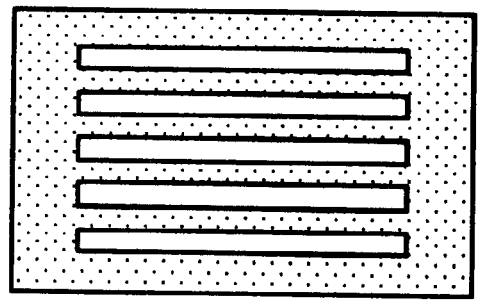
(2) STANDARD PATTERN
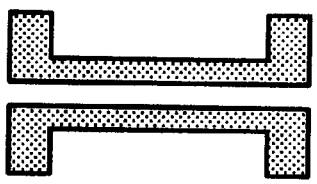
(2) STANDARD PATTERN
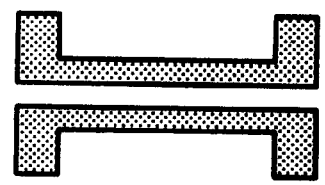
(3) COMPOSITE PATTERN
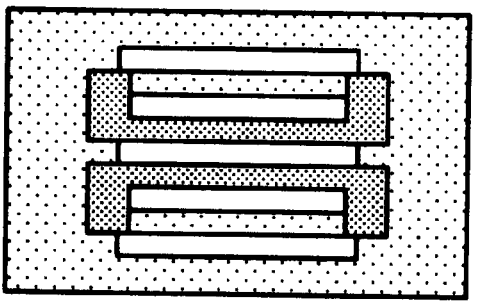
(3) COMPOSITE PATTERN
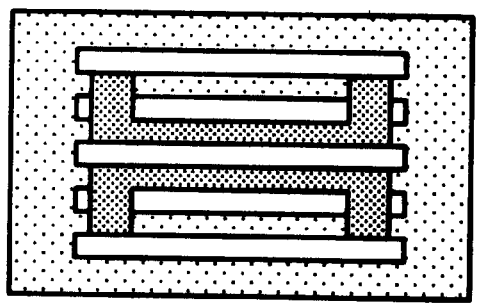
FIG. 46A
FIG. 46B

MULTIPLE EXPOSURE METHOD

FIELD OF THE INVENTION AND RELATED ART

This invention relates to an exposure method, an exposure apparatus and a device manufacturing method. More particularly, the invention concerns an exposure method and apparatus for transferring a very fine circuit pattern onto a photosensitive substrate through multiple exposures. The exposure method and apparatus of the present invention are suitably usable for manufacture of various devices such as semiconductor chips (e.g., ICs or LSIs), display devices (e.g., liquid crystal panels), detecting devices (e.g., magnetic heads), or image pickup devices (e.g., CCDs), or for production of patterns to be used in micro-mechanics.

The manufacture of microdevices such as ICs, LSIs or liquid crystal panels, for example, use a projection exposure method and a projection exposure apparatus wherein a circuit pattern formed on a photomask or reticle (hereinafter, "mask") is projected through a projection optical system onto a photosensitive substrate such as a silicon wafer or a glass plate (hereinafter, "wafer") which is coated with a photoresist, for example, by which the circuit pattern is transferred (photoprinted) to the wafer.

In order to meet enlargement of integration of a device (chip), miniaturization of a pattern to be transferred to a wafer, that is, improvements in resolution, as well as enlargement in area of each chip have been desired. Thus, in a projection exposure method and projection exposure apparatus which plays a main role in wafer microprocessing procedure, many attempts have been made to improve the resolution and to enlarge the exposure area in order that an image of a size (linewidth) of 0.5 micron or less can be formed in a wider range.

FIG. 1 is a schematic view of a conventional projection exposure apparatus, wherein denoted at 191 is an excimer laser which is a deep ultraviolet light exposure light source. Denoted at 192 is an illumination optical system, and denoted at 193 is illumination light. Denoted at 194 is a mask, and denoted at 195 is object side exposure light emitted from the mask 194 and entering an optical system 196 which is a reduction projection optical system. Denoted at 197 is image side exposure light emitted from the optical system 196 and impinging on a substrate 198 which is a photosensitive substrate (wafer). Denoted at 199 is a substrate stage for holding the photosensitive substrate.

Laser light emitted from the excimer laser 191 is directed by a guiding optical system to the illumination optical system 192, by which the laser light is adjusted to provide the illumination light 193 having a predetermined light intensity distribution, a predetermined orientation distribution, and a predetermined opening angle (numerical aperture NA), for example. The illumination light 193 then illuminates the mask 194.

The mask 194 has formed thereon a pattern of a size corresponding to the size of a fine pattern to be formed on the wafer 198 but as being multiplied by an inverse of the projection magnification of the projection optical system 196 (namely, 2x, 4x or 5x, for example). The pattern is made of chromium, for example, and it is formed on a quartz substrate. The illumination light 193 is transmissively diffracted by the fine pattern of the mask 194, whereby the object side exposure light 195 is provided. The projection optical system 196 serves to convert the object side exposure light 195 to the image side exposure light 197 with which the fine pattern of the mask 194 can be imaged upon the wafer 198 at the projection magnification and with a sufficiently small aberration. As shown in a bottom enlarged view portion of FIG. 1, the image side exposure light 197 is converged on the wafer 198 with a predetermined numerical aperture NA (=sin θ), whereby an image of the fine pattern is formed on the wafer 198. The substrate stage 199 is movable stepwise along the image plane of the projection optical system to change the wafer 198 position relative to the projection optical system 196, such that fine patterns are formed sequentially on different regions on the wafer 198 (e.g., shot regions each covering one or more chips).

However, with projection exposure apparatuses currently used prevalently and having an excimer laser as a light source, it is still difficult to produce a pattern image of 0.15 micron or less.

As regards the resolution of the projection optical system 196, there is a limitation due to a "trade off" between the depth of focus and the optical resolution attributable to the exposure wavelength (used for the exposure process). The resolution R of a pattern to be resolved and the depth of focus DOF of a projection exposure apparatus can be expressed by Rayleigh's equation, such as equation (1) and (2) below.

$$R = k_1(\lambda/NA) \tag{1}$$

$$DOF = k_2(\lambda/NA^2) \tag{2}$$

where λ is the exposure wavelength, NA is the image side numerical aperture which represents the brightness of the projection optical system 196, and $k_1$ and $k_2$ are constants which are determined by the development process characteristics, for example, and which are normally about 5–0.7. From equations (1) and (2), it is seen that, while enhancement of resolution, that is, making the resolution R smaller, may be accomplished by enlarging the numerical aperture NA (NA enlarging), since in a practical exposure process the depth of focus DOF of the projection optical system 196 can not be shortened beyond a certain value, increasing the numerical aperture NA over a large extent is not attainable, and also that, for enhancement of resolution, narrowing the exposure wavelength λ (band-narrowing) is any way necessary.

However, such band-narrowing encounters a critical problem. That is, there will be no glass material available for lenses of the projection optical system 196. In most glass materials, the transmission factor is close to zero, in respect to the deep ultraviolet region. Although there is fused silica which is a glass material produced for use in an exposure apparatus (exposure wavelength of about 248 nm) in accordance with a special method, even the transmission factor of fused silica largely decreases in respect to the exposure wavelength not longer than 193 nm. It is very difficult to develop a practical glass material for a region of an exposure wavelength of 150 nm or shorter, corresponding to a very fine pattern of 0.15 micron or less. Further, glass materials to be used in the deep ultraviolet region should satisfy various conditions, other than the transmission factor, such as durability, uniformness of refractive index, optical distortion, easiness in processing, etc. In these situations, the availability of practical glass materials is not large.

As described, in conventional projection exposure methods and projection exposure apparatuses, the band-narrowing of exposure wavelength to about 150 nm or shorter is required for formation of a pattern of 0.15 micron or less upon a wafer 198 whereas there is no practical glass material for such wavelength region. It is therefore very difficult to produce a pattern of 0.15 micron or less on a wafer.

Recently, an exposure method and apparatus for performing a dual exposure process, comprising a periodic pattern exposure and a standard (ordinary) exposure, to a substrate (photosensitive substrate) to be exposed, has been proposed in an attempt to producing a circuit pattern including a portion of 0.15 micron or less.

Here, the term "standard exposure" or "ordinary exposure" refers to an exposure process by which an arbitrary pattern can be photoprinted although the resolution is lower than that of the periodic pattern exposure. A representative example of it is the exposure process to be performed by projection of a mask pattern with a projection optical system.

A pattern to be printed by the standard exposure (hereinafter, "standard exposure pattern") may include a very fine pattern less than the resolution. The periodic pattern exposure is a process for forming a periodic pattern of a similar linewidth as that of the very fine pattern.

Such periodic pattern exposure may use a Levenson type phase shift mask, for example. An example of a dual exposure process is shown in FIGS. 2A–2C. A periodic pattern (FIG. 2A) and a standard exposure pattern (FIG. 2B) are printed on the same position, by which a very fine pattern (FIG. 2C) corresponding to a composite image of them is produced.

In this manner, a pattern to be produced finally is photoprinted as a standard exposure pattern, but, since the standard exposure pattern contains a pattern portion smaller than the resolution, a periodic pattern of high resolution is printed there. By this, the resolution of the standard exposure pattern can be improved and, finally, a desired pattern including a very fine line smaller than the resolution can be produced.

In the dual exposure process, in order to improve the resolution of a standard exposure pattern (FIG. 2B), a high resolution periodic pattern (FIG. 2A) is printed on the same position. In such dual exposure process, if the elongation direction of the fine-line portion of the pattern of FIG. 2B is registered with the periodicity direction in FIG. 2A, no particular problem arises.

If however a standard exposure pattern includes fine lines different directions, such as shown in FIG. 3B wherein there are fine lines extending in the same direction as the periodicity and fine lines extending in a direction perpendicular thereto, while the fine lines in the same direction as the periodicity may be resolved, the fine lines extending perpendicularly to the periodicity may not be resolved.

Details will be described with reference to a pattern called a gate pattern or a T gate pattern, used with a positive type resist material, in conjunction with FIGS. 2A–2C and 3A–3C. It is assumed now that in these drawings the periodic pattern comprises such pattern that light passes therethrough by which its phase is inverted. This periodic pattern has a periodicity not less than 2. The standard exposure pattern comprises such pattern that light passes through the peripheral portion around the pattern which blocks light, and it has a binary amplitude with constant phase.

For example, in FIGS. 2A–2C, each fine line of the gate pattern of FIG. 2B (standard exposure pattern) is oriented in the same direction as the periodic pattern of FIG. 2A. Thus, the resolution of fine line of the gate pattern of FIG. 2A (standard exposure pattern) can be increased.

In the example of a T gate pattern shown in FIG. 3B, there are additional fine lines extending, like T-shape, orthogonally to fine lines of a gate pattern. Thus, there are fine lines extending in different directions.

If there are fine lines extending longitudinally and laterally, resolution is particularly difficult to achieve in such zone (hard-resolution zone) where a fine line and a pattern are juxtaposed with each other with a spacing not larger than the resolution. In order to attain improved resolution for such zone, use of a periodic pattern such as shown in FIG. 3A is necessary. However, mere use of such periodic pattern would not result in successful resolution of fine lines extending in a direction perpendicular to the periodicity, although resolution may be accomplished for the hard-resolution zone.

Therefore, when a dual exposure process using a periodic pattern and a standard exposure pattern is to be performed, a pattern to be produced finally is limited in some cases, depending on the orientation of the periodic pattern used. Particularly, as regards a pattern having fine lines extending in a direction different from the periodicity direction of the periodic pattern, it is difficult to well meet the same, with the dual exposure process used conventionally. For example, at the pattern spacings "A", adjacent patterns may become continuous and they may not be separated sharply.

SUMMARY OF THE INVENTION

It is accordingly an object of the present invention to provide an exposure method, an exposure apparatus and/or a device manufacturing method, by which, even where a standard exposure pattern contains fine lines extending in different directions, a desired pattern can be produced finally in a dual exposure process.

In accordance with an aspect of the present invention, there is provided an exposure method for exposing a substrate through a multiple exposure process including a first exposure using a first pattern having fine line elements of different directions, and a second exposure using a second pattern including a periodic pattern: wherein a periodicity direction of the periodic pattern is registered with a direction along which fine line elements of a predetermined direction, of the different directions, are arrayed, while, at least in a portion of the periodic pattern, a pattern or a boundary between adjacent patterns as well as a portion of or the whole of the fine line elements of the particular direction are adapted to be printed at the same location; and wherein the second pattern is so structured that one or those of the fine line elements of the first pattern extending in a particular direction different from the predetermined direction are not superposed with the periodic pattern.

In accordance with another aspect of the present invention, there is provided an exposure method for exposing a substrate through a multiple exposure process including a first exposure using a first pattern having fine line elements of different directions, and a second exposure using a second pattern including a periodic pattern: wherein a periodicity direction of the periodic pattern is registered with a direction along which fine line elements of a predetermined direction, of the different directions, are arrayed, while, at least in a portion of the periodic pattern, a light blocking area or a boundary of a phase serviceable as a light blocking area as well as a portion of or the whole of the fine line elements of the particular direction are adapted to be printed at the same location; and wherein the second pattern is so structured that one or those of the fine line elements of the first pattern extending in a particular direction different from the predetermined direction are not superposed with the periodic pattern.

The periodicity direction of the periodic pattern may be registered with a direction along which most fine line elements are arrayed.

The particular direction different from the predetermined direction may correspond to the periodicity direction.

The periodic pattern may comprise a periodic pattern having a periodicity not less than 2 and being provided by one of a Levenson type phase shift mask, an edge type phase shift mask and a binary type mask.

The second pattern may have a region where no periodic pattern is formed, and an isolated line element may be formed in that region so that the isolated line element is to be superposed with a fine line element of a direction different from the predetermined direction.

The periodic pattern and the isolated line element may be defined by one of a light blocking area and a light transmitting area.

The isolated line element may have a size or a shape which is different in accordance with a fine line element of a direction different from the predetermined direction.

Those of the fine line elements of a direction different from the predetermined direction may include at least one having a linewidth larger than a resolution.

In accordance with a further aspect of the present invention, there is provided an exposure method for exposing a substrate through a multiple exposure process including a first exposure using a first pattern and a second exposure using a second pattern: wherein the first pattern includes a periodic pattern and has a region for execution of correction of pattern distortion due to an optical proximity effect in the exposure of the second pattern.

The region for execution of the correction of pattern distortion due to the optical proximity effect may be provided by a region inside a pattern region for the periodic pattern of the first pattern where no periodic structure is formed.

The second pattern may be adapted to produce a light intensity distribution of multiple levels, upon a surface of the substrate.

The second pattern may have a shape directly corresponding to a design pattern to be produced on the substrate or similar to the design pattern.

The first pattern may be arranged so that the correction of pattern distortion due to the optical proximity effect is performed such that a light intensity distribution to be provided thereby may become similar to the design pattern.

The first and second patterns may be arranged so that the correction of pattern distortion due to the optical proximity effect is performed such that a light intensity distribution of a composite image to be produced by superposed exposures of the first and second patterns, becomes similar to the design pattern.

In the region inside the periodic pattern region of the first pattern where there is no periodic structure, a region having a locally thickened linewidth may be defined by which the correction of pattern distortion due to the optical proximity effect is performed.

In the region inside the periodic pattern region of the first pattern where there is no periodic structure, and in such portion where a fine line element of the second pattern, of a direction not orthogonal to a periodicity direction of the first pattern, there may be an isolated line element formed, and a linewidth of the isolated line element may be made larger than the linewidth of the fine line element of the second pattern.

The linewidth of the isolated line element may be optimized so that a fine line element of a composite image to be produced by the periodic pattern of the first pattern and a fine line element of a composite image to be produced by the isolate line element have substantially the same linewidth.

A correction pattern may be formed in a region inside the periodic pattern region of the first pattern where no periodic structure is formed, by which the correction of pattern distortion due to the optical proximity effect is performed.

When an isolated line element to be superposed with a fine line element of the second pattern, of a direction not orthogonal to the periodicity direction of the first pattern, is present in the region inside the periodic pattern region of the first pattern where no periodic structure is formed, the correction pattern may be formed to substantially correct contraction of the isolated line element.

In the first pattern, a pattern having a linewidth at least three times larger than the narrowest line element of the second pattern may be formed with a light blocking portion, for light quantity adjustment.

In the first pattern, the linewidth may be adjusted to adjust the whole light quantity balance of the first pattern.

The first pattern may include intersecting patterns, and a light blocking portion may be defined at or adjacent an intersection of the intersecting patterns.

The first pattern may include L-shaped orthogonal patterns, and a light blocking portion may be defined at or adjacent an intersection of the orthogonal patterns.

The first pattern may include a T-shaped orthogonal patterns, and a light blocking portion may be defined at or adjacent an intersection of the orthogonal patterns.

The first pattern may comprise a periodic pattern having a periodicity not less than 2 and being provided by one of a Levenson type phase shift mask and a binary type mask.

In accordance with a still further aspect of the present invention, there is provided an exposure method for exposing a substrate through a multiple exposure process including a first exposure using a first pattern having a fine line and a second exposure using a second pattern having a periodic pattern: wherein a length of a predetermined light passing region of the periodic pattern is made shorter than another light passing region of the periodic pattern, to thereby suppress distortion in a predetermined portion of the first pattern ranging to the predetermined light passing region in the multiple exposure process.

In accordance with a yet further aspect of the present invention, there is provided an exposure method for exposing a substrate through a multiple exposure process including a first exposure using a first pattern having a fine line and a second exposure using a second pattern having a periodic pattern: wherein a length of a predetermined light passing pattern of the periodic pattern is set so that an exposure amount distribution at an edge of the predetermined light passing pattern of the periodic pattern has a tilt opposite to that of an exposure amount distribution at an edge of a predetermined portion of the first pattern, ranging to the predetermined light passing pattern, such that they are combined with each other during the multiple exposure process.

In accordance with a still further aspect of the present invention, there is provided an exposure method for exposing a substrate through a multiple exposure process including a first exposure using a first pattern having a fine line and a second exposure using a second pattern having a periodic pattern: wherein the second pattern is arranged so as to suppress distortion in a predetermined portion of the first pattern during the multiple exposure process.

The length of the periodic pattern may be adjusted such that a length of a periodic pattern upon the substrate in its lengthwise direction is made equal to the length of the first pattern in the same direction as the lengthwise direction of the periodic pattern.

The length of the periodic pattern upon the substrate may be set within an extent from the length equal to a length of a fine line element of the first pattern in the same direction as the lengthwise direction of the periodic pattern, to a length as determined by subtracting, from the length of the fine line element, a pattern width of of a pattern portion of the first pattern, ranging from the periodic pattern.

As regards the length of the periodic pattern upon the substrate, a length corresponding to the periodic pattern length plus a length corresponding to contraction of the periodic pattern may be accumulated.

The periodic pattern may comprise a periodic pattern having a periodicity not less than 2 and being provided by one of a Levenson type phase shift mask, an edge type phase shift mask and a binary type mask.

In accordance with a yet further aspect of the present invention, there is provided a mask usable with an exposure method such as recited above, for supplying the first pattern in that exposure method.

In accordance with a yet further aspect of the present invention, there is provided a mask usable with an exposure method as recited above, for supplying the second pattern in that exposure method.

In accordance with a yet further aspect of the present invention, there is provided a device manufacturing method including a process for producing a device by use of an exposure method as recited above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A–2C are schematic views for explaining an example of pattern layout for a dual exposure process, where no inconvenience is caused.

FIGS. 3A–3C are schematic views for explaining another example of pattern layout for a dual exposure process, where, due to presence of fine line elements in different directions, inconveniences are caused.

FIGS. 5A–5C are schematic views, respectively, for explaining the principle of dual exposure process.

FIGS. 6A–6C are schematic views similar to FIGS. 5A–5C, respectively, and for explaining the principle of dual exposure process.

FIGS. 12A–12C are schematic view for explaining an example of pattern layout in a dual exposure process, using a negative type resist.

FIGS. 23A and 23B are schematic views, respectively, for explaining a procedure for making a periodic pattern in an embodiment of the present invention, wherein FIG. 23A shows a case where a pattern is provided by a light blocking portion, and FIG. 23B shows a case where a pattern is provided by a light transmitting area.

FIGS. 25A and 25B are schematic views, respectively, for explaining a procedure for making a periodic pattern in a further embodiment of the present invention, wherein FIG. 25A shows a case where a pattern is provided by a light transmitting area, and FIG. 25B shows a case where a pattern is provided by a light blocking area.

FIGS. 33A, 33B and 33C are schematic views, respectively, showing results of simulation in this embodiment.

FIGS. 39A–39D are schematic views, respectively, for explaining an example where the periodic pattern length is not optimized, wherein FIG. 39A shows a state before patterns 1 and 2 are superposed, FIG. 39B shows a stage when the patterns 1 and 2 are superposed, FIG. 39C shows an intensity distribution before the combination, and FIG. 39D shows an intensity distribution after the combination.

FIGS. 40A–40D are schematic views, respectively, for explaining an example where the periodic pattern length is optimized in an embodiment of the present invention, wherein FIG. 40A shows a state before patterns 1 and 2 are superposed, FIG. 40B shows a stage when the patterns 1 and 2 are superposed, FIG. 40C shows an intensity distribution before the combination, and FIG. 40D shows an intensity distribution after the combination.

FIG. 41 is a schematic view for explaining a comparative example wherein optimization of the periodic pattern length is not carried out.

FIG. 42 is a schematic view for explaining an example where, as compared with FIG. 41, the periodic pattern length is optimized.

FIGS. 43A and 43B are schematic views, respectively, for explaining effects of optimization of the periodic pattern length in an embodiment of the present invention, wherein FIG. 43A shows an example without periodic pattern optimization and with a light quantity proportion 20%, and wherein FIG. 43B shows an example with periodic pattern length optimization and with a light quantity proportion 25%.

FIG. 44 is a schematic view for explaining optimization of the periodic pattern length in an embodiment of the present invention.

FIGS. 45A and 45B are schematic views, respectively, for explaining a procedure for producing opposite-tilt edges by using an edge type phase shift mask, in an embodiment of the present invention.

FIGS. 46A and 46B are schematic views, respectively, for explaining an example where in the length is made slightly longer while expecting contraction of a periodic pattern, in an embodiment of the present invention.

DESCRIPTION OF THE PREFERRED EMBODIMENTS

Briefly, in the present invention, a periodic pattern is modified such that, even where a standard exposure pattern has very fine lines extending in different directions, the fine lines in these directions can be solved, and a good pattern can be produced.

The dual exposure process is such that two patterns are photoprinted at the same position by which enhancement of resolution is attained. Thus, periodic patterns to be used here are all designed in accordance with the shape of a standard exposure pattern.

Figure 7:
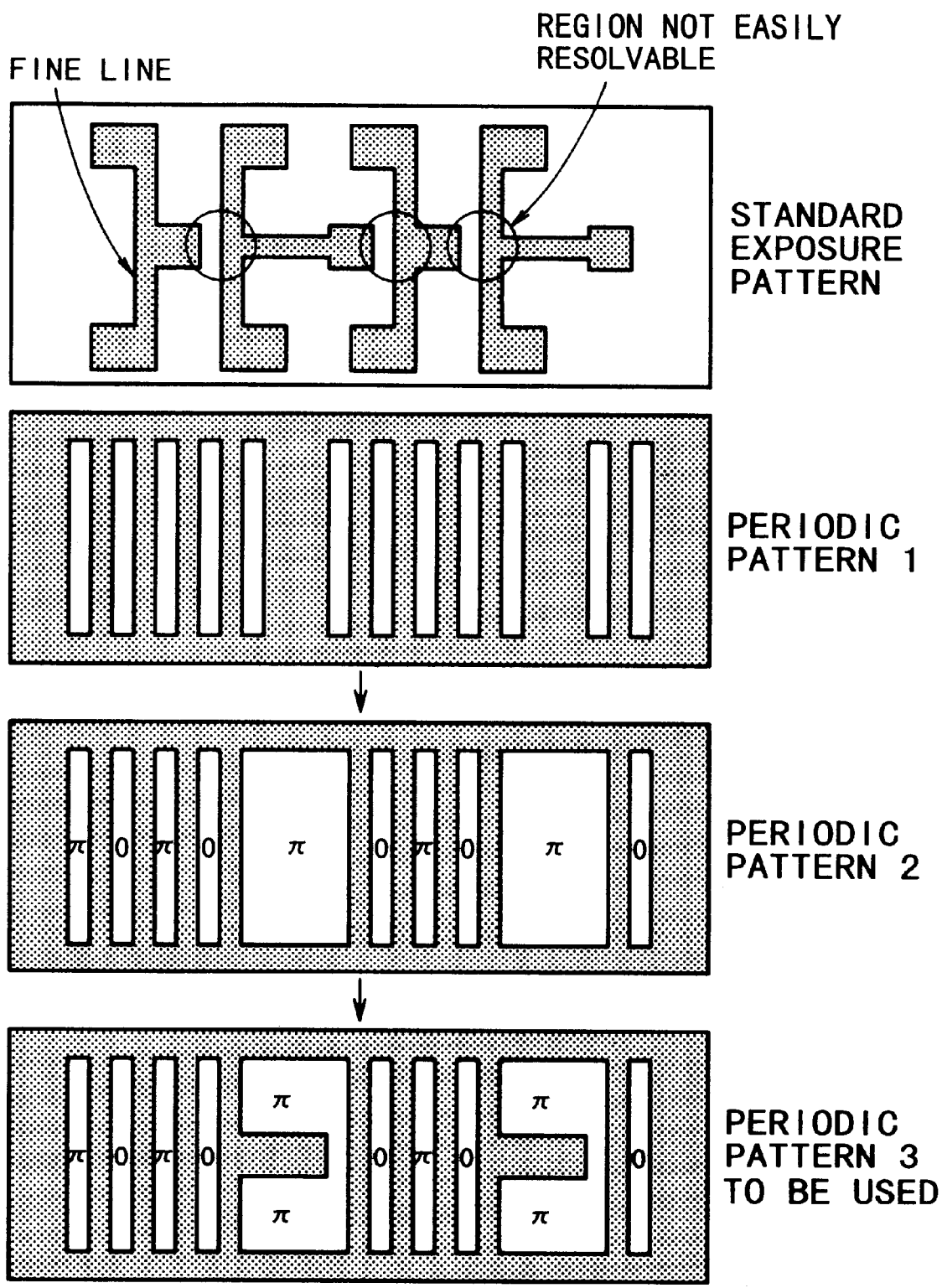
FIG. 7 and FIGS. 8A and 8B are schematic views, respectively, for explaining a procedure for making a periodic pattern in a first embodiment of the present invention.

Referring now to FIG. 7, an example of a T-shaped gate pattern where a periodic pattern is determined on the basis of a standard exposure pattern will be described, in relation to use of a positive type resist where a pattern is to be defined by a light blocking area. In FIG. 7, a standard exposure pattern shown at the top of FIG. 7 is the same as that shown in FIG. 3B, and there are fine line elements in the same direction as the periodicity as well as fine line elements extending in a longitudinal direction. In this standard exposure pattern, patterns are juxtaposed with each other with spacings not larger than the resolution.

For determination of a periodic pattern in accordance with this standard exposure pattern, first, as shown in FIG. 7 as a periodic pattern 1, the orientation of the periodic pattern is determined to be registered with a direction in which many fine lines of the standard exposure pattern extend, or with a direction of periodicity which enables resolution for a hard-resolution zone as shown in the standard exposure pattern of FIG. 7. Thus, the periodic pattern placement is made while making a particular note to the fine lines and the hard-resolution region. Here, such a hard-resolution zone refers to a zone in which patterns are juxtaposed with each other with a spacing not larger than the resolution, or a zone wherein patterns having a linewidth smaller than the resolution are juxtaposed with each other with a spacing not larger than the resolution.

Here, the length of a periodic pattern should preferably be made to be not shorter than the length of the fine line of the standard exposure pattern.

Then, as shown in FIG. 7 as a periodic pattern 2, as regards a region corresponding to the fine lines extending in an orthogonal direction to the periodicity, a large pattern is formed, and phases are set alternately by 0 and π, including this large pattern. In FIG. 7, light transmitting areas are depicted by white (blank) while light blocking areas are illustrated by black (painted). Further, as shown in FIG. 7 as a periodic pattern 3, the region corresponding to the fine lines of the standard exposure pattern, extending in the direction orthogonal to the periodicity direction of the periodic pattern, is coated with a light blocking chromium (Cr) material. By this light blocking area, an isolated line is defined in the periodic pattern, in a direction orthogonal to the periodicity. Thus, when printed in superposition with the standard exposure pattern, the fine lines in the direction orthogonal to the periodicity direction can be resolved.

By use of the periodic pattern 3 thus prepared, a good image can be produced even if a standard exposure pattern has fine lines in different directions as shown in FIG. 7.

In summary, when a periodic pattern is to be prepared in accordance with a standard exposure pattern, first, the orientation of the periodic pattern is determined to be registered with a direction in which many fine lines of the standard exposure pattern extend, or with a direction of periodicity which enables resolution for the hard-resolution zone. Thus, the periodic pattern placement is made to enable resolution of fine lines or a hard-resolution zone. Then, as regards a region where fine lines extending in an orthogonal direction to the periodicity are present, no periodic pattern is placed but one large pattern is formed. Here, the phases of the periodic pattern should be set to be alternately by 0 and π, including this large pattern. Further, in the standard exposure pattern, it is necessary to produce a Cr light blocking area, that is, an isolated line, so that the fine line region in the orthogonal direction to the periodicity can be resolved.

As described above, in an exposure method for executing a dual exposure process with a standard exposure pattern and a periodic pattern, and particularly when the standard exposure pattern comprises a pattern having very fine lines extending longitudinally and laterally, a good composite image can be produced with use of a periodic pattern being specified as follows.

(1) A periodic pattern should be used to enable resolution for a hard-resolution zone. Also, a periodic pattern having a periodicity in one of the longitudinal and lateral directions should be used.

(2) In the periodic pattern region to be superposed with fine lines in a direction different from the periodicity direction of the periodic pattern, no periodic pattern should be placed.

(3) An isolated line should be defined to enable resolution of fine line portions in a direction different from the periodicity direction of the periodic pattern.

While the foregoing description has been made with reference to use of a positive type resist where a pattern is defined by a light blocking area of a mask, substantially the same advantageous results are attainable with use of a negative type resist where a pattern is defined by a light transmitting area of a mask. Details of pattern placement will be described later, in conjunction with embodiments.

Further, in some embodiments of the present invention, for a multiple exposure process using a periodic pattern and a standard exposure pattern, the periodicity of a simple periodic pattern is locally destroyed. By doing so, even if a complicated pattern such as a pattern having fine lines extending in different directions, is to be produced, all the fine lines can be reproduced satisfactorily.

Since the periodicity of a periodic pattern is locally destroyed, then the pattern is defined by a portion having a periodic structure and another portion without having it. For convenience, such a pattern is still called a periodic pattern, in this specification.

With a specific arrangement for the periodic pattern, such as described above, pattern distortion due to an optical proximity effect which may be produced when a fine pattern narrower than the resolution is going to be made, can be avoided.

As regards a multiple exposure process, particularly the dual exposure process is such that two patterns are photoprinted at the same position by which enhancement of resolution is attained. Thus, periodic patterns to be used here are all designed in accordance with the shape of a standard exposure pattern.

Although details will be described later in conjunction with preferred embodiments, a periodic pattern in this connection may be arranged as follows.

(1) By changing the linewidth of a periodic pattern relatively to a standard exposure pattern, pattern distortion due to the optical proximity effect is corrected.

(2) By changing the shape of a periodic pattern relatively to a standard exposure pattern, pattern distortion due to the optical proximity effect is corrected.

(3) If the linewidth of a periodic pattern is very large, as three times larger or more than the fine line element, a light blocking area is provided to adjust the light quantity.

(4) Where a periodic pattern has an L-shaped intersection, a light blocking area is provided adjacent the intersection of L-shape, to avoid intensity concentration at the intersection.

(5) Where a periodic pattern has a T-shaped intersection, a light blocking area is provided adjacent the intersection of T-shape, to avoid intensity concentration at the intersection.

With a periodic pattern having such an arrangement as described above, pattern distortion due to the optical proximity effect can be corrected even when a pattern having fine line elements in different directions is used. Thus, a good composite image can be produced.

In the following description concerning preferred embodiments of the present invention, use of a positive type resist will be described with reference to first and second embodiments, while use of a negative type resist will be described in relation to a third embodiment.

Figure 1:
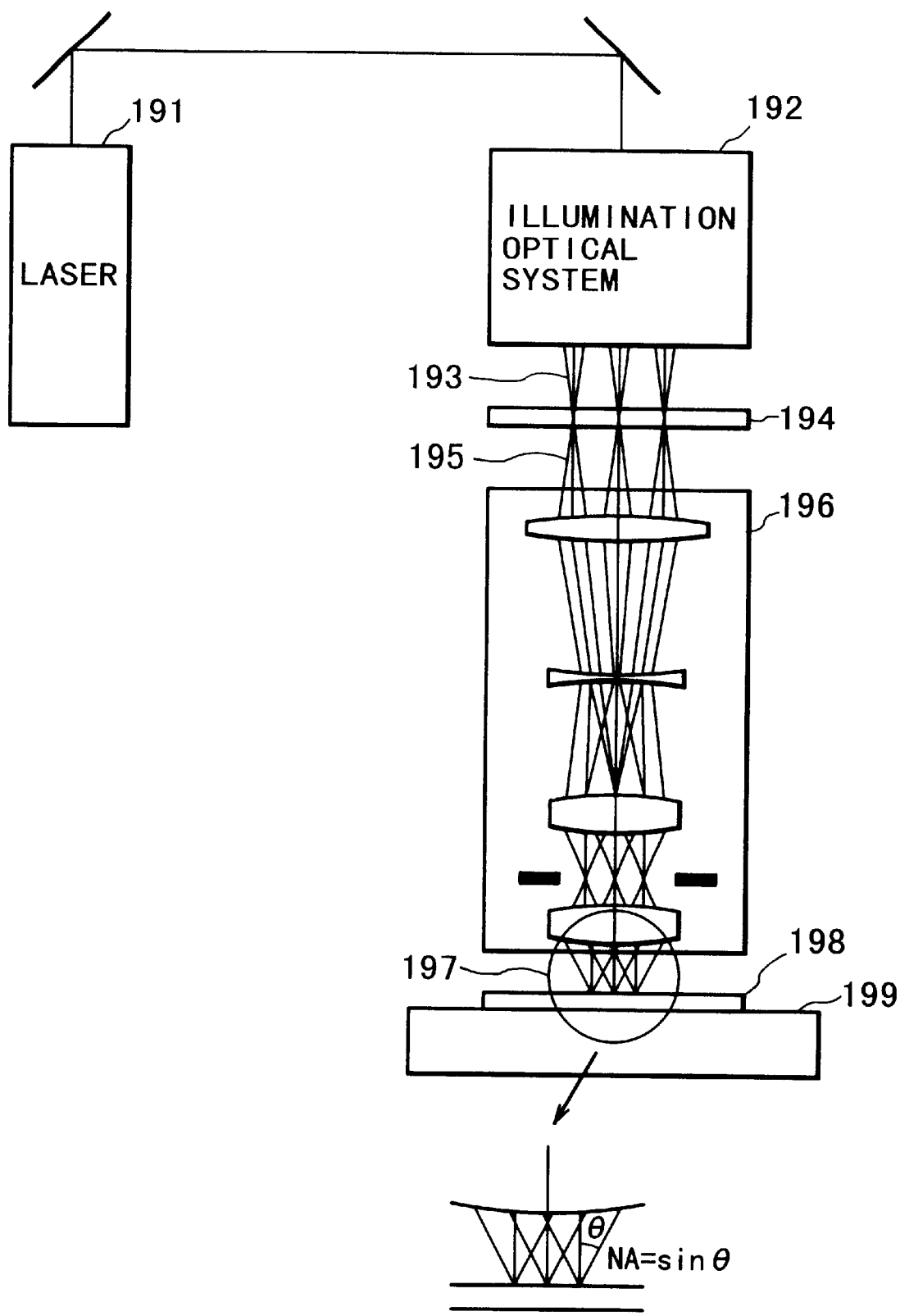
FIG. 1 is a schematic view of a conventional projection exposure apparatus.
Figure 4:
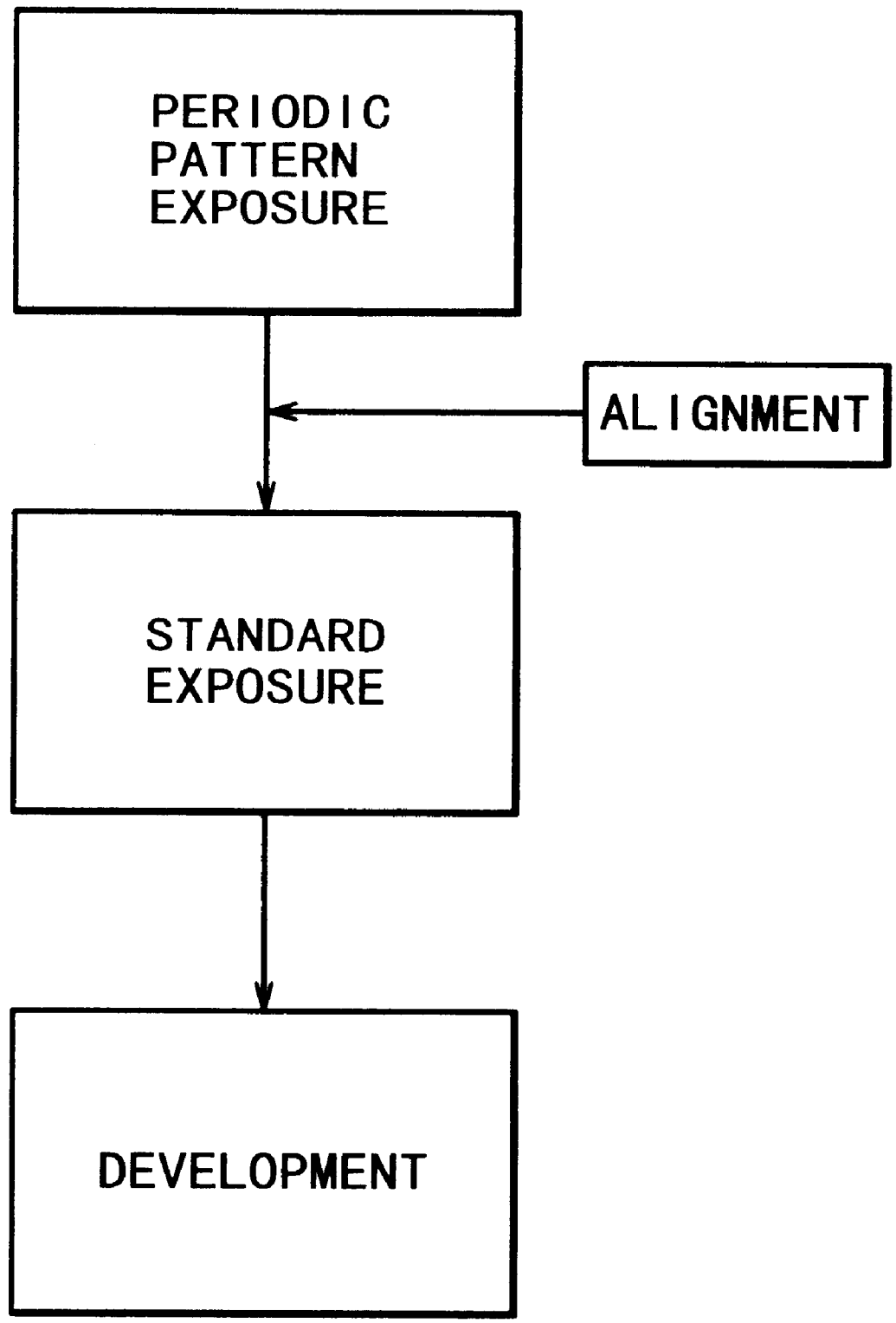
FIG. 4 is a flow chart for a dual exposure process.

FIG. 4 is a flow chart of a dual exposure process. The blocks in FIG. 4 illustrate the flow of procedures, that is, periodic pattern exposure, standard exposure and development. The order of the periodic pattern exposure and the standard exposure may be the one shown in the drawing, but it may be reversed. If one or both of the periodic exposure and the standard exposure comprise plural exposure steps, they may be made alternately.

Between the periodic pattern exposure and the standard exposure, a process for precise alignment between a mask and a wafer may be performed. Description of details of such alignment operation will be omitted here.

This embodiment relates to a specific arrangement of a periodic pattern, for use in a dual exposure process (periodic pattern exposure and standard pattern exposure) to be performed through a stepper having a KrF excimer laser of a wavelength 248 nm, for example.

Now, the principle of dual exposure process will be explained.

The dual exposure process is a method in which a standard exposure step and a periodic pattern exposure step are carried out without intervention of a development process. More specifically, a periodic pattern is printed at a level not greater than an exposure threshold of a resist and, thereafter, a standard exposure is executed with an exposure amount having a multiple-level distribution. As regards the exposure amount of the standard exposure, different exposure amounts are applied to small zones of an exposure pattern region (exposure region). Each exposure amount may be either larger or smaller than the exposure threshold level. Here, the exposure amount referred to in the specification relates to an exposure amount with respect to a resist.

Referring now to FIGS. 6A–6C, an example of a gate pattern having a shape such as shown in these drawings will be described, in relation to production of a circuit pattern (lithography pattern) obtainable photolithographically.

The gate pattern has a smallest linewidth of 0.1 micron in the lateral direction, whereas it has a smallest linewidth in the longitudinal direction of 0.2 micron or more which is within the range of resolution of standard exposure. In accordance with the dual exposure method, for such two-dimensional pattern having a smallest linewidth pattern in which high resolution is required only in a one-dimensional direction, that is, lateral direction, a periodic pattern exposure with dual beam interference exposure, for example, may be performed only in relation to the one-dimensional direction in which high resolution is required. Namely, a one-dimensional periodic pattern is used as the periodic pattern, and the periodicity direction of this periodic pattern is placed in registration with the lateral direction of the gate pattern.

FIGS. 5A–5C show exposure amount distributions at corresponding exposure stages. Numerical values given in these drawings represent exposure amounts at the resist.

FIG. 5A shows an exposure amount distribution as provided by a periodic exposure pattern having repetitions only in a one-dimensional direction. The exposure amount at a portion other than the pattern is zero, and that at the pattern portion is 1.

FIG. 5B shows an exposure amount distribution produced by a multiple-level standard exposure. The exposure amount at a portion other than the pattern is zero, and that at the pattern portion is 1 or 2. Thus, two-level distribution is produced here.

When a dual exposure process including these exposure steps is carried out without intervention of a development process, an accumulated distribution of exposure amounts is produced on the resist, and thus an exposure amount distribution such as shown in FIG. 5C is obtainable. Here, if the resist sensitivity threshold level is between 1 and 2, the zones exposed with a level more than 1 (i.e., level 2 or 3 in the drawing) are "printed", such that a pattern as depicted by a thick dark line in FIG. 5C can be produced, after a development process.

On the other hand, an exposure pattern corresponding to the periodic pattern which is outside the zones depicted by the thick dark line, has been exposed with a level lower than the resist exposure threshold, such that it will disappear after the development process.

As regards those zones exposed by the standard exposure with an exposure amount distribution less than the resist exposure threshold level, such a zone where the sum (accumulation) of the exposure amount distribution provided by the standard exposure and the exposure amount distribution provided by the periodic pattern exposure becomes not lower than the resist exposure threshold level, can be developed by the development process as a "print". As a result, an exposure pattern having the same resolution as of the exposure pattern by the periodic pattern exposure can be produced, at the superposed portions of the exposure patterns provided by the standard exposure and the periodic pattern exposure.

As regards the zones of the exposure pattern exposed by the standard exposure with an exposure amount distribution not less than the resist exposure threshold level, an exposure pattern having the same resolution as of an exposure pattern by the standard exposure is produced as the superposition of exposure patterns of the standard exposure and the periodic pattern exposure.

FIGS. 6A–6C illustrate a pattern and a mask for producing exposure amount distributions shown in FIGS. 5A–5C. FIG. 6A shows a pattern and a mask adapted to produce a repetition pattern, being repeated only in a one-dimensional direction in which a high resolution is required. This mask may be provided by a Levenson type phase shift mask, for example. When such a Levenson type phase shift mask is used, phases are mutually inverted between white (blank) areas and gray (dark) areas in the drawing. With the phase inversion effect, a high-contrast periodic exposure pattern can be produced in accordance with the dual beam interference exposure process. The mask is not limited to a Levenson type phase shift mask, but anyone can be used if it produces such an exposure amount distribution.

Here, the exposure pattern has a periodicity of 0.2 micron, and it comprises a line-and-space pattern with lines and spaces each having a linewidth of 0.1 micron. It serves to produce the exposure amount distribution shown in FIG. 5A. As regards a mask and a pattern for producing such a multiple-level exposure amount distribution, a mask having formed thereon a pattern analogous to a circuit pattern to be produced finally, may be used. In this example, a mask having formed with a gate pattern such as shown in FIG. 6B is used.

As described hereinbefore, portion of a gate pattern formed by fine lines (longitudinal line elements in this example) consist of patterns narrower than the resolution of standard exposure. Therefore, these two linear patterns comprising very fine lines are not resolved on a resist, and a distribution with low and even intensity is produced. As compared therewith, patterns at the opposite ends of the fine line elements have a linewidth in a range of the resolution of standard exposure of the exposure apparatus, they can be resolved as a high intensity pattern.

Therefore, as the pattern and mask of FIG. 6B is photoprinted, a multiple-level exposure amount distribution such as shown in FIG. 5B is produced.

In this example, a light transmission type pattern is used to provide an exposure amount distribution corresponding to a pattern to be produced. However, light blocking type pattern may be used if a mask such as shown in FIG. 6C is prepared. A light blocking type pattern is usable with a mask arranged so that light passes through a region other than the pattern, while the pattern functions to block light. In such light blocking type pattern, a pattern larger than the resolution functions to block light, such that it provides an exposure amount distribution of zero. On the other hand, a fine pattern narrower than the resolution does not completely block light, so that an exposure amount about a half of the exposure amount distribution in the region around the pattern is distributed. As a result of it, a multiple-level exposure amount distribution is produced.

The principle of dual exposure process described above, is summarized as follows.

(1) An exposure pattern in a zone not exposed by a standard exposure, as produced by a periodic pattern exposure and having a largest exposure amount not greater than the resist exposure threshold level, will disappear as a result of a development process.

(2) As regards an exposure pattern region (exposure region) provided by a standard exposure, in which an exposure amount not greater than the resist exposure threshold has been supplied to the resist, an exposure pattern having the same resolution as of an exposure pattern by the periodic pattern exposure and being determined by the combination of exposure patterns to be produced by the standard exposure and the periodic pattern exposure, is produced.

(3) As regards an exposure pattern region (exposure region) provided by a standard exposure, in which an exposure amount not lower than the resist exposure threshold level has been supplied to the resist, an exposure pattern having the same resolution as of an exposure pattern by the standard exposure and being determined by the combination of exposure patterns to be produced by the standard exposure and the periodic pattern exposure, is produced.

An advantage of the dual exposure method is that, when a periodic pattern exposure to which a highest resolution is required is performed in accordance with a dual-beam interference exposure method using a phase shift mask, for example, a depth of focus quite larger than that as attainable with the imaging of a periodic pattern by ordinary projection exposure is attainable.

As regards the order of the periodic pattern exposure and the standard exposure, while in the foregoing description the periodic pattern exposure is made first, these exposures may be made in a reverse order or they may be made at the same time.

Now, some preferred embodiments will be described below in conjunction with examples of periodic patterns specifically arranged for use with a stepper having a KrF excimer laser of a wavelength 248 nm, and with a dual exposure process including a periodic pattern exposure and a standard exposure for a wafer.

Embodiment 1

The first embodiment uses a Levenson type phase shift mask for a periodic pattern. This embodiment will be described in conjunction with FIGS. 7, 8A and 8B.

Figure 8A:
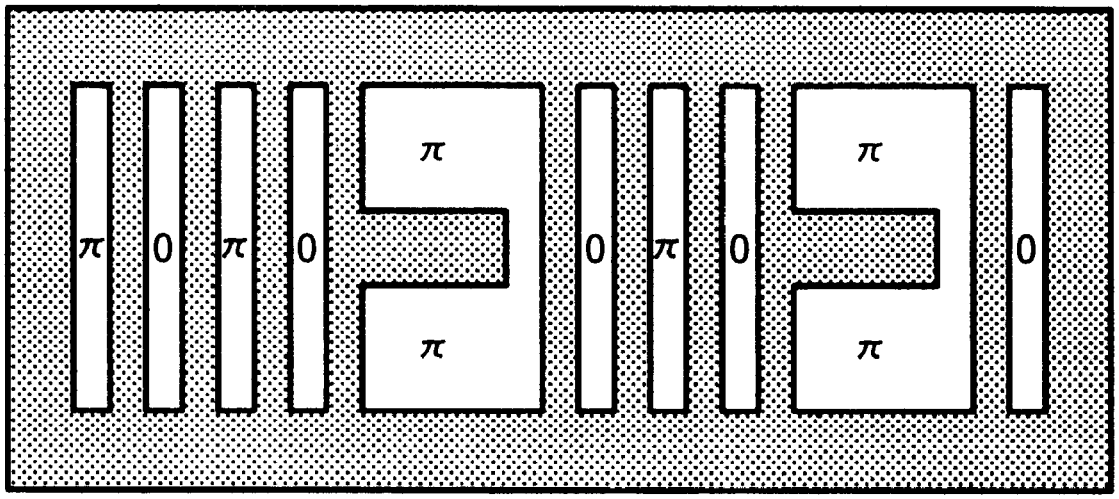
Figure 8B:
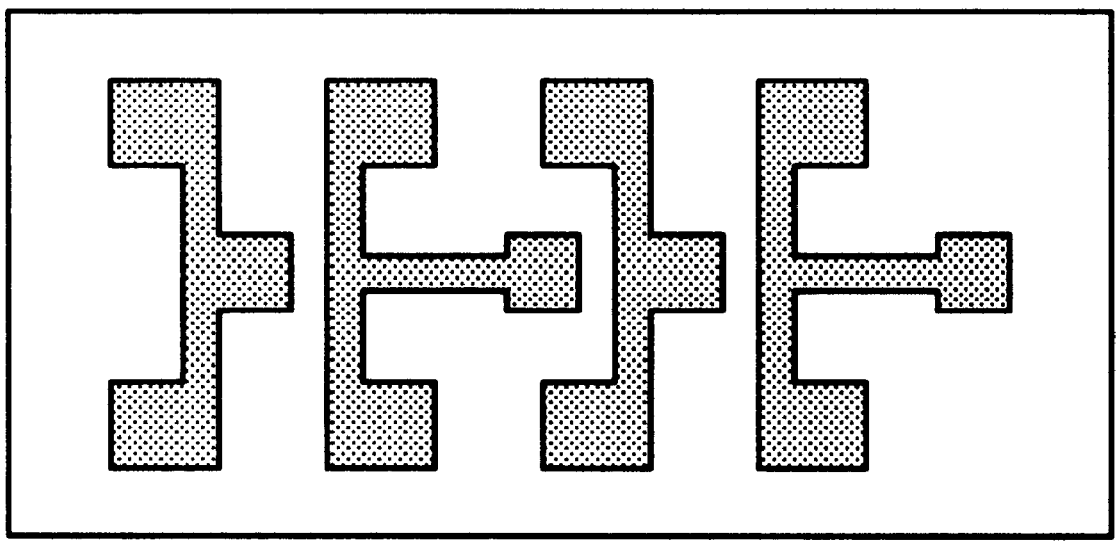

FIG. 7 illustrates the procedure for making a periodic pattern in accordance with a standard exposure pattern. FIGS. 8A and 8B show a periodic pattern and a standard exposure pattern to be used practically. By combining theses patterns, a pattern of the same shape as of a standard exposure pattern of FIG. 8B, is just to be produced finally.

The standard exposure pattern shown in FIG. 7 includes four fine line elements extending in a longitudinal direction, and two fine line elements extending in a lateral direction. A zone (hard-resolution zone) which is difficult to be resolved is the portion wherein, as illustrated, patterns are juxtaposed with each other with a spacing not larger than the resolution of the stepper with respect to a mask for standard exposure. In consideration of it, the periodicity direction is placed in registration with the lateral direction in which many fine lines are present and in which the hard-resolution zone can be resolved.

In this manner, a particular note is given to the "hard-resolution zone" where a fine line and a pattern are juxtaposed with each other with a spacing not larger than the resolution, and then the placement of the periodic pattern is determined. Thus, it is necessary to place the periodic pattern in the region as depicted by a periodic pattern 1 in the drawing. Here, the length of the periodic pattern should be not shorter than the length of the fine lines of the standard exposure pattern.

As regards a region where those fine lines of the standard exposure pattern extending in the periodicity direction are present, a large pattern is then formed. No periodic pattern should be placed there. If a periodic pattern is placed there, thinning will be produced in the fine line extending in the periodicity direction. Then, the phases are determined as shown in the drawing as a periodic pattern 2, so that, including this large pattern, adjacent patterns have alternate or opposite phases as 0 and π.

Further, such periodic pattern region to be superposed with fine lines in the periodicity direction are covered by a light blocking Cr material to block passage of light therethrough. That is, a light blocking isolated pattern is formed there. A periodic pattern 3 thus prepared is the mask periodic pattern to be used practically in the dual exposure process. In this example, the pattern is defined by a light blocking area. Thus, in order to enable resolution of fine lines in the periodicity direction, this light blocking area is provided. Therefore, in a case where the linewidth of a fine line of the pattern to be produced is 1 L, the light blocking area may have a slightly large width of 1.5 L or 2 L–3 L, for example, to prevent unwanted exposure to diffraction light, for example.

By using such a periodic pattern having a thickened isolated line as described above, it is assured that, after the dual exposure process, the portion having a periodic structure and the isolated line have the same linewidth. The linewidth of this isolated line changes with the linewidth of a fine line to be produced finally.

Namely, when, for the dual exposure process, an isolated line is formed in the region of the periodic pattern to be superposed with a fine line of a standard exposure mask, in a direction different from the fine lines of the periodic pattern, the linewidth of this isolated line is made slightly wider than the linewidth of the fine line. The resolvability can be improved by such optical proximity effect correction (OPC). Thus, a good image can be produced even with use of a pattern having fine lines in a direction different from the direction of the fine lines of the periodic pattern.

This advantageous result is not limited to use of a light blocking pattern. Even if a pattern is defined by a light transmitting area, substantially the same results are attainable when similar optical proximity effect correction (OPC) is made.

As described above, by changing the linewidth of a line constituting a periodic pattern in accordance with the linewidth of a fine line of the standard exposure pattern, the optical proximity effect correction can be made, whereby a good composite image can be produced.

On the other hand, it is not necessary that the linewidth of each line constituting the periodic pattern has the same width as the spacing between the lines. The linewidth may be enlarged, and the spacing may be omitted. In that occasion, as will be described with reference to the subsequent embodiment, the pattern linewidth may preferably be in a range of 0<"periodic pattern linewidth" ≦2 L.

As described, resolution for a hard-resolution zone is accomplished by using a periodic pattern while, on the other hand, resolution of a fine line in a direction perpendicular to the periodicity is attained by the provision of a light blocking isolated line. Thus, by combining periodic pattern 1 of FIG. 8A and the standard exposure pattern of FIG. 8B, being arranged as such, a good pattern can be produced satisfactorily even in a case where there are fine lines in a direction different from the periodicity direction.

Figure 11A:
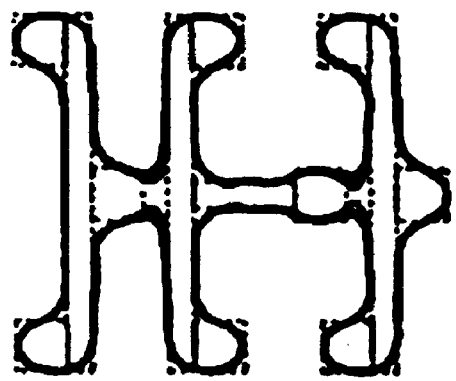
FIGS. 11A and 11B are schematic views, respectively, showing results of simulations according to a standard exposure and according to the method of the first embodiment.
Figure 11B:
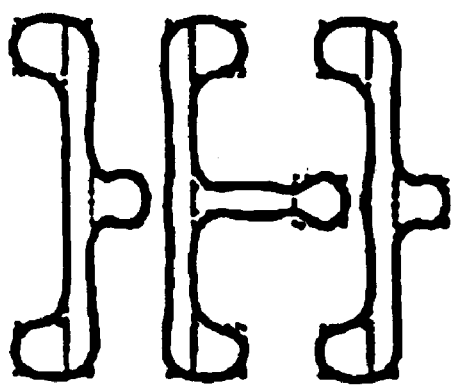

FIGS. 11A and 11B show results of simulations made in relation to a standard exposure method and the method of this embodiment, respectively.

Broken lines in the drawings depict a desired pattern to be produced. Solid lines depict an image obtained by the simulation. It is seen that, with the present embodiment, an image very close to a desired shape is produced, and that good separation appears in zones where resolution is difficult.

Embodiment 2

The second embodiment concerns use of an edge type phase shift mask for a periodic pattern. This embodiment will be described in conjunction with FIGS. 9, 10A and 10B.

An edge type phase shift mask has juxtaposed patters of opposite phases. When it is exposed, the light intensity at the juxtaposed portion becomes near zero. Thus, it has substantially the same effect as of a Levenson type phase shift mask described with reference to the first embodiment. The peripheral portion of the pattern may have a light blocking property, or it may have a light transmitting property.

Figure 9:
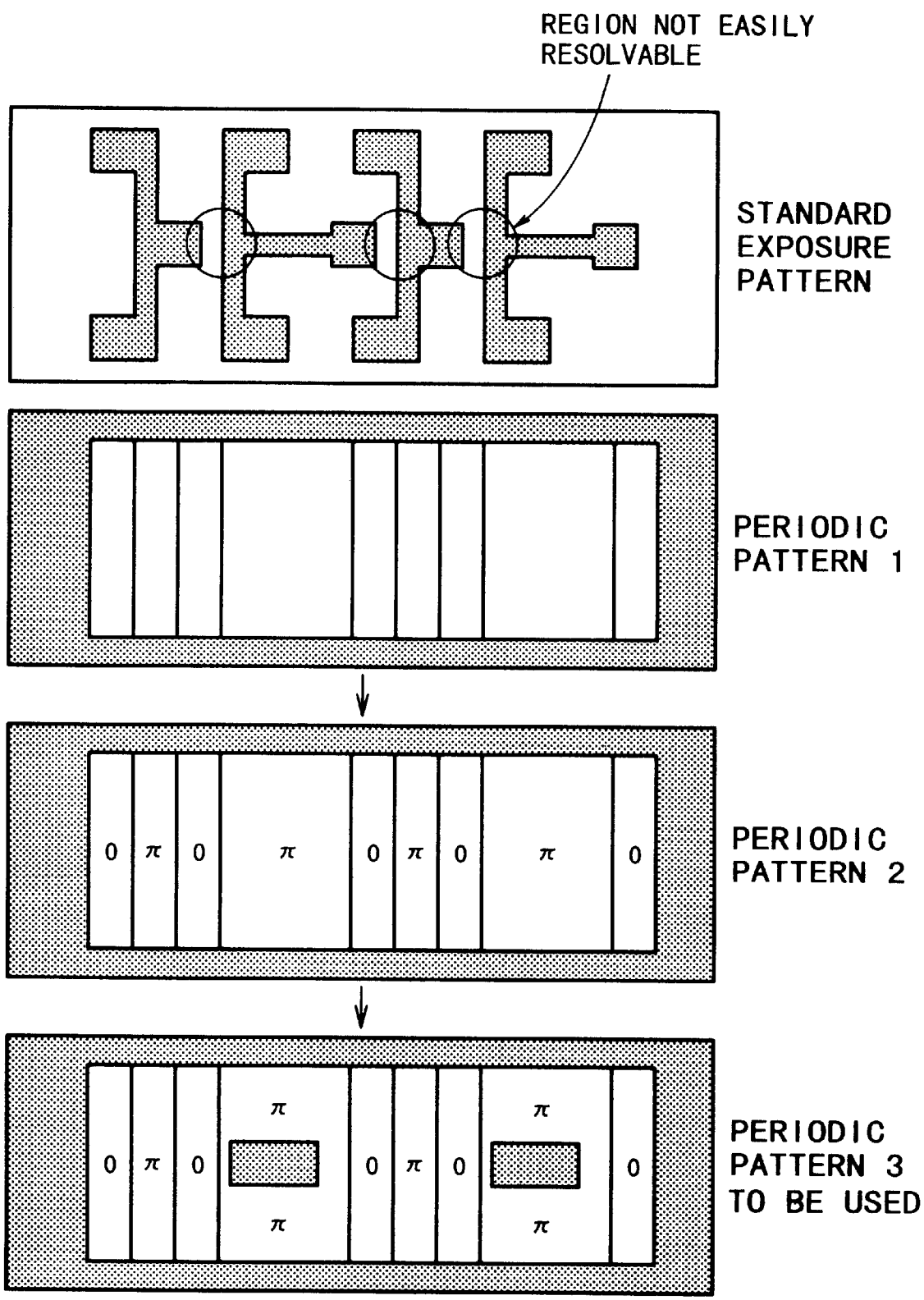
FIG. 9 is a schematic view for explaining a procedure for making a periodic pattern in a second embodiment of the present invention.
Figure 10A:
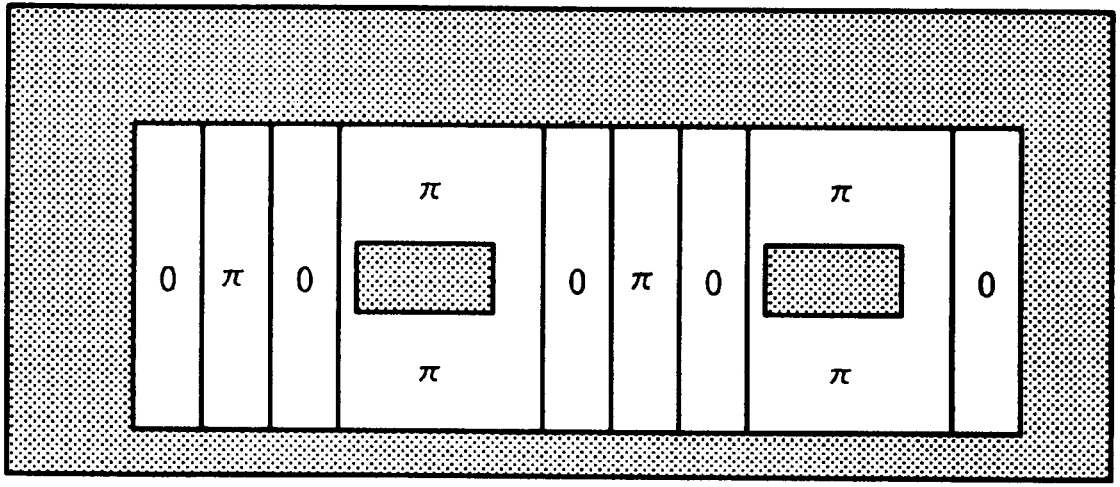
FIGS. 10A and 10B are schematic views, respectively, for explaining a procedure for making a periodic pattern, in the second embodiment of the present invention.
Figure 10B:
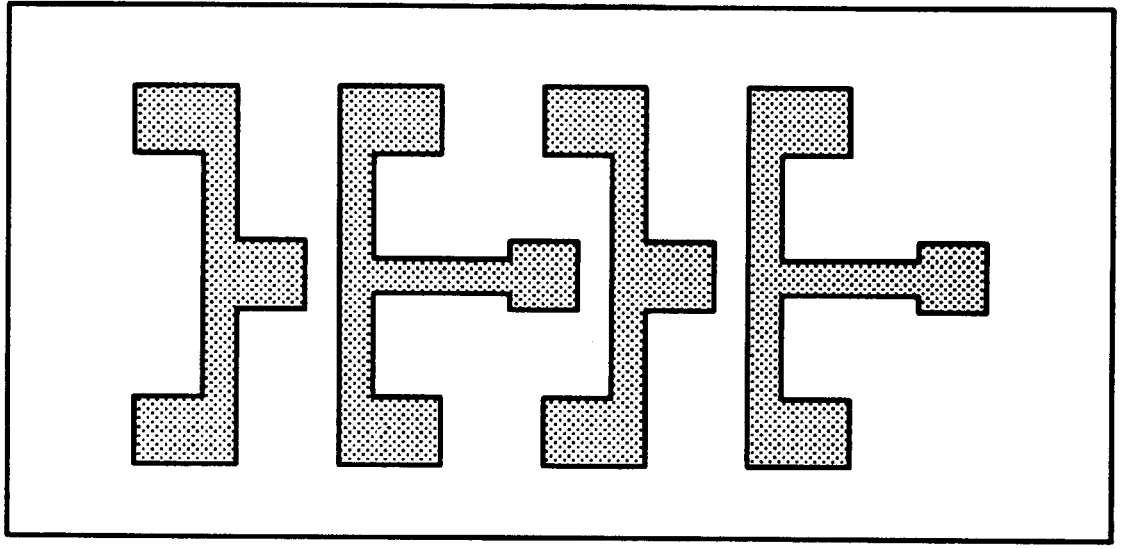

FIG. 9 illustrates the procedure for making a periodic pattern in accordance with a standard exposure pattern. FIGS. 10A and 10B show a periodic pattern and a standard exposure pattern to be used practically. By combining theses patterns, a pattern of the same shape as of a standard exposure pattern of FIG. 10B, is to be produced finally. This pattern is the same as of the first embodiment.

The standard exposure pattern shown in FIG. 9 includes four fine line elements extending in a longitudinal direction, and two fine line elements extending in a lateral direction. A zone (hard-resolution zone) which is difficult to be resolved is the portion wherein patterns are juxtaposed with each other with a spacing not larger than the resolution of the stepper with respect to a mask for standard exposure. In consideration of it, the periodicity direction is placed in registration with the lateral direction in which many fine lines are present and in which the hard-resolution zone can be resolved.

In this manner, a particular note is given to the "hard-resolution zone" where a fine line and a pattern are juxtaposed with each other with a spacing not larger than the resolution, and then the placement of the edge is determined. Thus, it is necessary to place the edge in the region as depicted by a periodic pattern 1 in the drawing. Here, the length of the periodic pattern should be not shorter than the length of the fine lines of the standard exposure pattern.

As regards a region where those fine lines extending in the periodicity direction are present, a large pattern is then formed. No edge should be placed there. If an edge is placed there, thinning will be produced in the fine line extending orthogonally to the periodicity direction. Then, the phases are determined as shown in the drawing as a periodic pattern 2 of FIG. 9, so that, including this large pattern, adjacent patterns have alternate or opposite phases as 0 and π.

Further, such periodic pattern region to be superposed with fine lines in the periodicity direction is covered by a light blocking Cr material, to block passage of light therethrough. That is, a light blocking isolated pattern is formed there. Namely, with regard to the orthogonal direction, edges of a light blocking area and a light transmitting area are used. The effect resulting from phase inversion of the periodic pattern as well as the zero-intensity portion caused by the provision of the light blocking area, are utilized.

A periodic pattern 3 of FIG. 9 thus prepared is the mask periodic pattern to be used practically in the dual exposure process. In this example, the pattern is defined by a light blocking area. Thus, in order to enable resolution of fine lines in the periodicity direction, this light blocking area is provided. Therefore, in a case where the linewidth of a fine line of the pattern to be produced is 1 L, the light blocking area may have a slightly large width of 2 L–3 L, for example, to prevent unwanted exposure to diffraction light, for example.

By combining the periodic pattern 1 of FIG. 10A and the standard exposure pattern of FIG. 10B, being arranged as such, a good pattern can be produced satisfactorily even in a case where there are fine lines in a direction different from the periodicity direction.

Embodiment 3

The third embodiment concerns use of a negative type resist for defining a pattern by a light blocking area, as compared with the first embodiment wherein a positive type resist is used.

FIGS. 12A–12C show a conventional process of a negative resist for preparing a pattern by a light transmitting area. In the case of a negative resist, like a positive type resist, resolution is attainable without any inconvenience if the fine line portion of a gate is registered with the direction of a periodic pattern. However, like the positive resist, if there is a fine line extending in a direction different from the fine line of the periodic pattern and if patterns are juxtaposed with each other with a spacing not greater than the resolution, a satisfactory result is not easily attainable with the conventional method. In consideration of it, in this embodiment, as compared with the first embodiment, a negative resist for defining a pattern by a light transmitting area is used.

Figure 13:
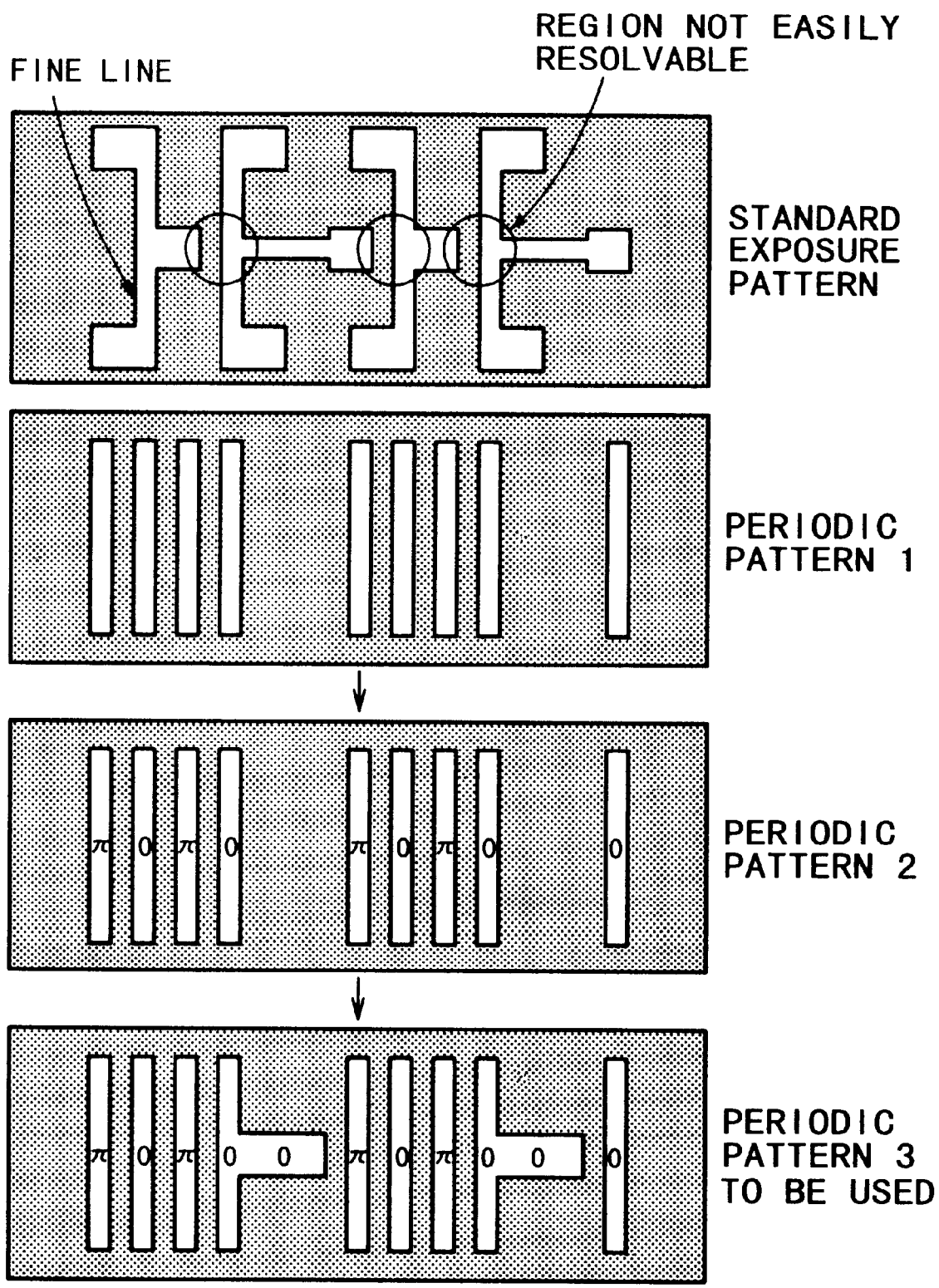
FIG. 13 is a schematic view for explaining a procedure for making a periodic pattern in a third embodiment of the present invention.
Figure 14A:
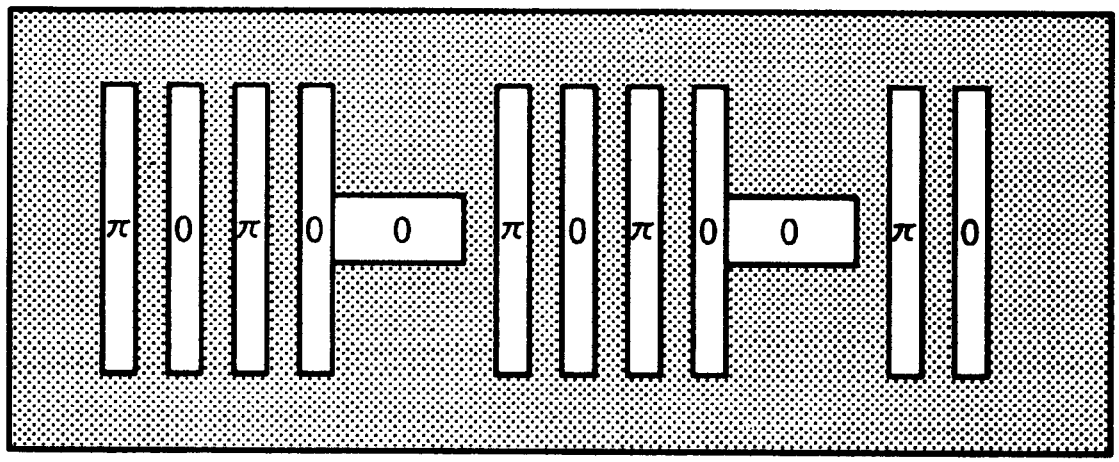
FIGS. 14A and 14B are schematic views, respectively, for explaining a procedure for making a periodic pattern, in the third embodiment of the present invention.
Figure 14B:
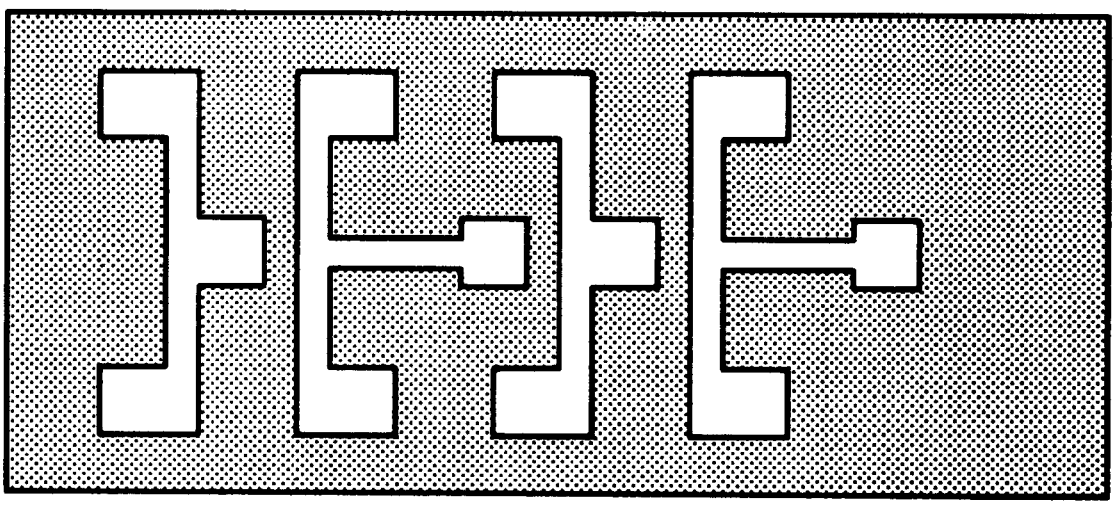

FIG. 13 illustrates the procedure for making a periodic pattern in accordance with a standard exposure pattern. FIGS. 14A and 14B show a periodic pattern and a standard exposure pattern to be used practically. By combining theses patterns, a pattern of the same shape as of a standard exposure pattern of FIG. 14B, is just to be produced finally.

The standard exposure pattern shown in FIG. 13 includes four fine line elements extending in a longitudinal direction, and two fine line elements extending in a lateral direction, like the pattern of FIG. 8 of the first embodiment. A zone (hard-resolution zone) which is difficult to be resolved is the portion wherein, as illustrated, patterns are juxtaposed with each other with a spacing not larger than the resolution. In consideration of it, the periodicity direction is placed in registration with the lateral direction in which many fine lines are present and in which the hard-resolution zone can be resolved.

In this manner, a particular note is given to the "hard-resolution zone" where a fine line and a pattern are juxtaposed with each other with a spacing not larger than the resolution, and then the placement of the periodic pattern is determined. Thus, it is necessary to place the periodicity as depicted by a periodic pattern 1 in the drawing.

As regards a region where those fine lines extending in the periodicity direction are present, no periodic pattern is placed there, but a light blocking area is defined there so that the same light intensity as of the standard exposure pattern is provided. For, if a periodic pattern is placed there, thinning will be produced in the fine line extending in the periodicity direction. Then, the phases are determined as shown in the drawing as a periodic pattern 2, so that adjacent patterns have alternate or opposite phases as 0 and π.

In the case of a positive resist as in the first embodiment, the pattern region of the standard exposure pattern comprises a light blocking area while the region other than the pattern region comprises a light transmitting area. For that reason, no periodic pattern is placed in the region where fine lines in a direction perpendicular to the periodicity are present. In place, the light transmitting area like the region other than the standard exposure pattern is used.

In the case of a negative type resist as of the present embodiment, however, the pattern region of the standard pattern comprises a light transmitting area while the region other than the pattern region comprises a Cr light blocking area. For this reason, no periodic pattern is placed in the region where fine lines in the direction of periodicity is present and, in place, this region is formed into a light blocking area.

Then, a light transmitting area is formed in such periodic pattern region to be superposed with the fine lines in the periodicity direction, such that light can pass therethrough. A periodic pattern 3 thus prepared is the periodic pattern to be used practically. In this example, the pattern is defined by a light transmitting area. Thus, in order to enable resolution of fine lines in the periodicity direction, an isolated line defined by this light transmitting area is provided. Therefore, in a case where the linewidth of a fine line of the pattern to be produced is 1 L, the light blocking area may have a slightly large width of 2 L–3 L, for example, to prevent unwanted exposure to diffraction light, for example. The linewidth of the periodic pattern is not limited to L, but it may be one satisfying a relation 0<"periodic pattern linewidth" <2 L.

As described above, no periodic pattern is placed in the region where fine lines in a direction orthogonal to the periodicity are present. In place, an isolated line defined by a light transmitting area (in the case of positive resist) or a light blocking area (in the case of negative resist) is provided.

As a result, even where a negative resist is used, by combining the periodic pattern 1 of FIG. 14A and the standard exposure pattern of FIG. 14B, being arranged as such, a good pattern can be produced satisfactorily for a pattern having fine lines in a direction different from the fine lines of the periodic pattern.

Embodiment 4

Figure 15A:
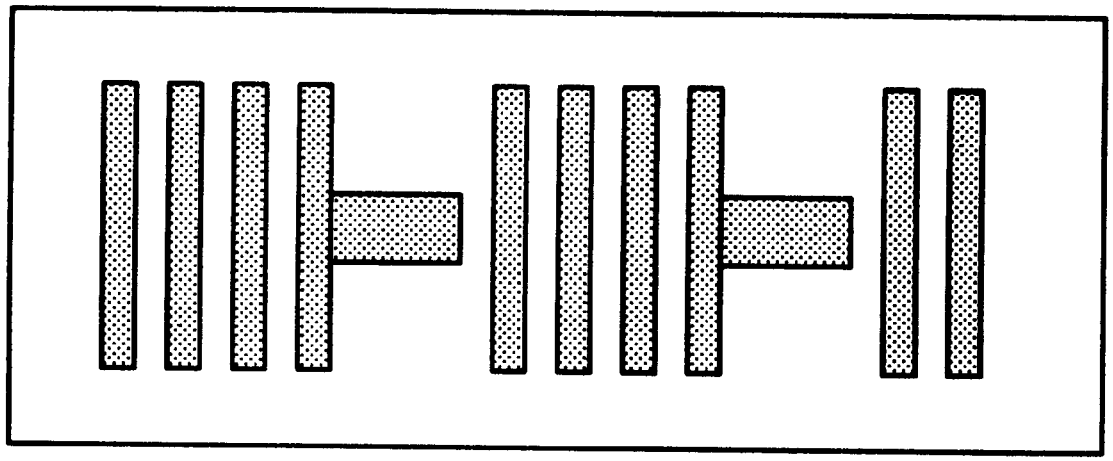
FIGS. 15A and 15B are schematic views, respectively, for explaining a procedure for making a periodic pattern, in a fourth embodiment of the present invention.
Figure 15B:
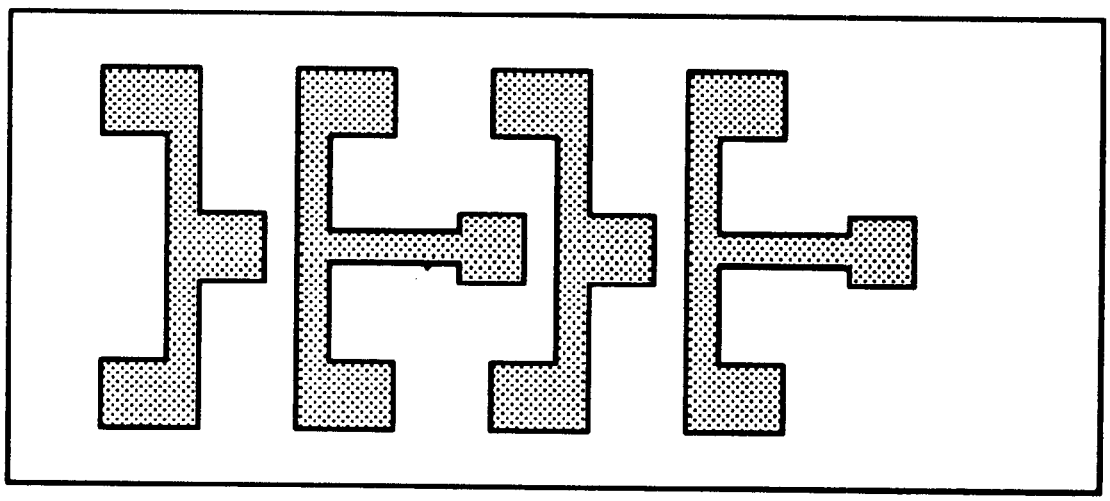

The fourth embodiment concerns preparing a periodic pattern by use of an oblique incidence illumination method and an ordinary mask. When an image is formed by illuminating a binary mask (without a phase shift method) in accordance with an oblique incidence illumination method, substantially the same advantageous result as of a phase shift mask is attainable in respect to a periodic pattern. FIGS. 15A and 15B show an example of a mask pattern for forming a periodic pattern on the basis of the oblique illumination method. The mask of FIGS. 15A and 15B concerns use of a positive resist. If a negative resist is to be used, the light transmitting area and the light blocking area in these drawings may be reversed. Substantially the same advantageous result is attainable in that occasion.

A fifth embodiment to a ninth embodiment to be described below concern examples of periodic patterns specifically for resolution of a pattern other than a T gate pattern.

These embodiments may be suitably applied to such ordinary patterns, other than the T gate pattern, as having very fine lines extending in different directions and being narrower than the resolution. Particularly, when a fine line and a pattern larger than it are juxtaposed with each other with a spacing not greater than the resolution, since the fine line may be pulled by the large pattern, separation is difficult to achieve.

In this case, it is assumed that, if the resolution is 2 L, the fine line has a width of L which is narrower than the resolution, for example. Embodiment to be described below relate to use of a positive type resist.

Embodiment 5

The fifth embodiment will be described in conjunction with FIGS. 16A and 16B and FIGS. 17A and 17B.

Figure 16A:
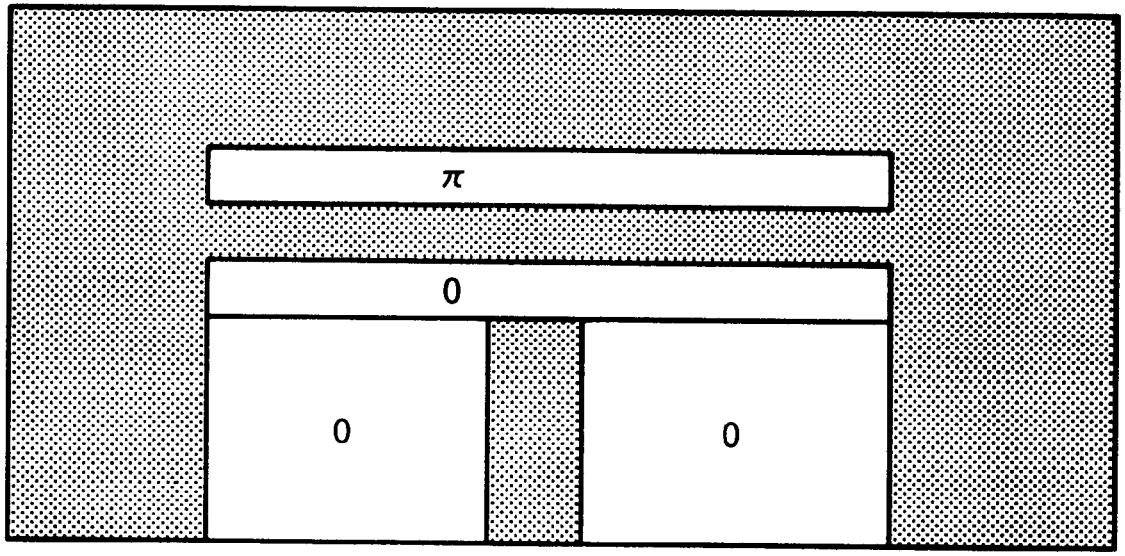
FIGS. 16A and 16B are schematic views, respectively, for explaining a procedure for making a periodic pattern, in a fifth embodiment of the present invention.
Figure 16B:
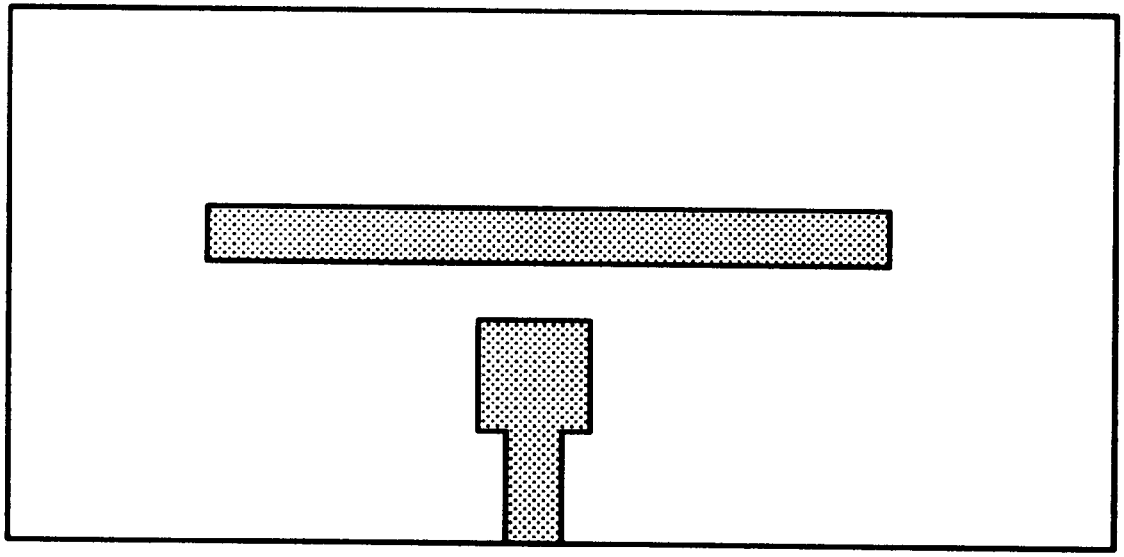

FIG. 16B shows a standard pattern not a T-gate pattern, but it includes a hard-resolution zone at a location similar to that of the T-gate pattern. Namely, it is the location where patterns are juxtaposed with each other, and separation of these patterns is not easy.

As regards a periodic pattern, as shown in FIG. 16A, like the first embodiment, a periodic pattern of opposite phases and having a periodicity not less than 2 is placed at the location where separation is difficult. A pattern of phase 0 may be placed at one side of a pattern of phase π where no pattern is present, to thereby increase the periodicity.

If there is a fine line extending in a direction different from the fine lines constituting the periodic pattern, no periodic pattern is placed but a large pattern of the same phase as of an adjacent periodic pattern is placed. At a portion to be superposed with such fine line pattern of the periodic pattern extending in the periodicity direction, an isolated pattern comprising a light blocking area is provided.

Figure 17A:
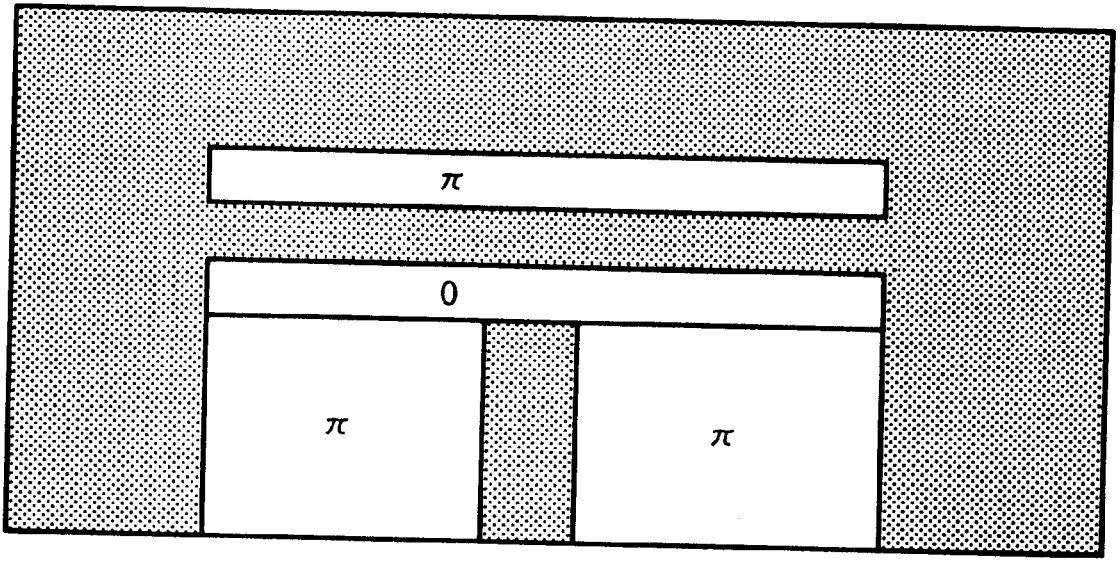
FIGS. 17A and 17B are schematic views, respectively, for explaining a procedure for making a periodic pattern, in the fifth embodiment of the present invention.
Figure 17B:
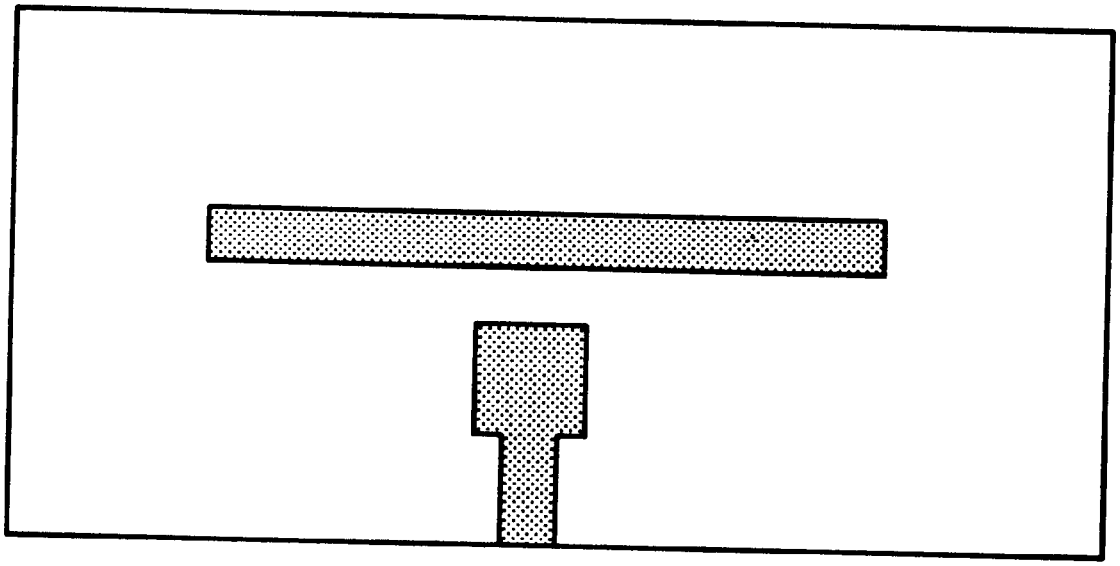

In the case of such standard pattern, the structure of the periodic pattern may be modified such as shown in FIG. 17A. Separation of adjacent patterns is attainable with such structure, too. If there is a fine line in a direction different from the fine line of the periodic pattern, no periodic pattern may not be placed but, in place, a large pattern having a phase opposite to an adjacent periodic pattern may be placed. An isolated pattern of light blocking area being larger than a predetermined pattern may be placed at the portion to be superposed with the fine pattern in the periodicity direction of the periodic pattern. When a large pattern of opposite phase is placed as such, an image to be produced by a multiple exposure process based on a standard exposure and a periodic pattern exposure, will be different from one obtainable in a case where a large pattern of the same phase is placed. However, in both of these cases, adjacent patterns can be separated.

If, however, the phases of large patterns placed on the opposite sides (left and right) of a portion to be superposed with a fine pattern in the periodicity direction, are made opposite to each other, in FIG. 17A the pattern of phase 0 as well as a pattern of the same phase contact with each other. Thus, separation of patterns is difficult to accomplish, in an image after a multiple exposure process. Even if pattern separation can be done in an image after the multiple exposure process, it is undesirable since the shape will be distorted.

Embodiment 6

The sixth embodiment will be described with reference to FIGS. 18A and 18B.

The standard pattern is formed by very fine lines extending in different directions and being narrower than the resolution. The spacing between adjacent patterns is not greater than the resolution. The pattern placement is not limited to being orthogonal.

In this example, it is assumed that, if the resolution when a stepper and a standard mask is used is 2 L, the fine line has a width of L which is narrower than the resolution, for example.

In this embodiment, a hard-resolution zone where resolution is difficult to achieve is the portion where a fine line and a patter larger than it are juxtaposed with each other with a spacing not greater than the resolution.

Figure 18A:
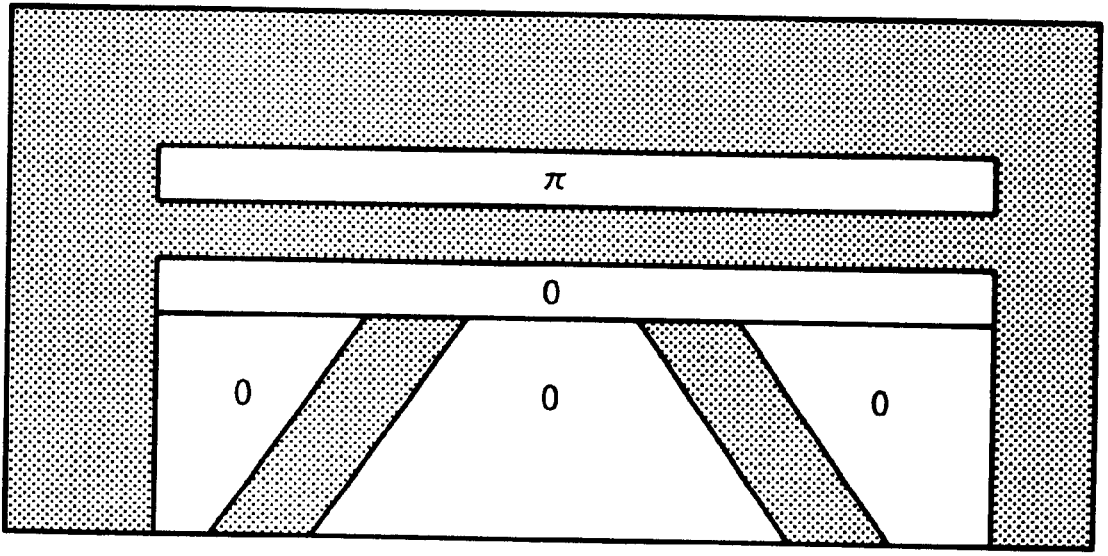
FIGS. 18A and 18B are schematic views, respectively, for explaining a procedure for making a periodic pattern, in a sixth embodiment of the present invention.
Figure 18B:
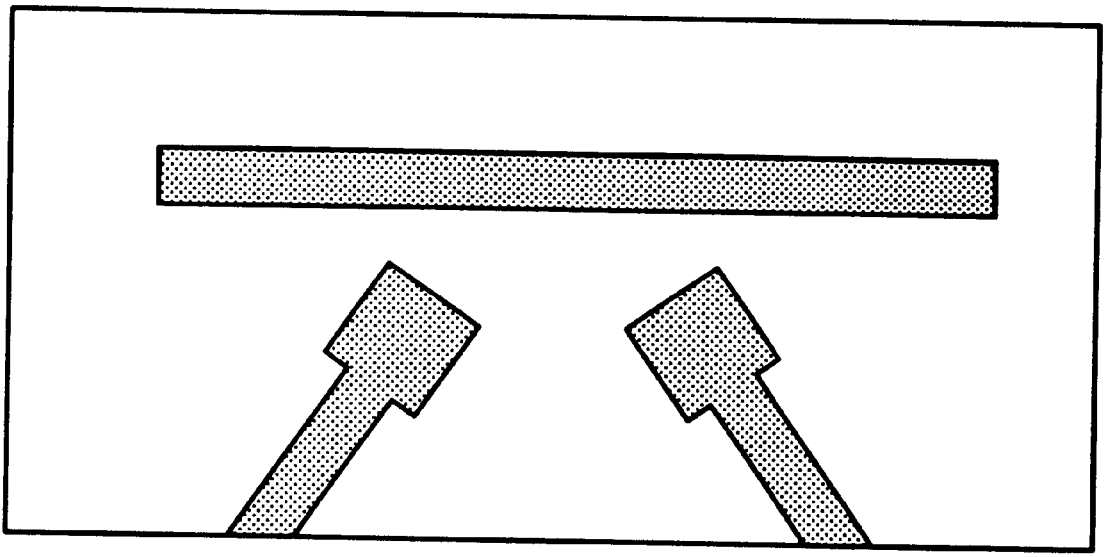

Like the first embodiment, as shown in FIG. 18A a periodic pattern of opposite phases and having a periodicity not less than 2 is placed at the location where separation is difficult. A pattern of phase 0 may be placed at one side of a pattern of phase π where no pattern is present, to thereby increase the periodicity.

If there is a fine line extending in a direction different from the fine lines constituting the periodic pattern, no periodic pattern is placed but a large pattern of the same phase as of an adjacent periodic pattern is placed. At a portion to be superposed with such fine line pattern of the periodic pattern extending in a direction different from the direction of the fine patterns of the periodic pattern, an isolated pattern comprising a light blocking area is provided.

Alternatively, no periodic pattern may be placed in the portion where a fine line extending in a direction different from the fine line of the periodic pattern is present, but, in place, a large pattern having a phase opposite to an adjacent periodic pattern may be placed. In that occasion, large patterns may be placed on the opposite sides of the portion to be superposed with the fine pattern in a direction different from the periodicity direction of the periodic pattern, such that these patterns may have the same phase. Also, an isolated pattern of light blocking area may be placed at the portion to be superposed with the fine pattern in the periodicity direction of the periodic pattern. When a large pattern of opposite phase is placed as such, an image to be produced by a multiple exposure process based on a standard exposure and a periodic pattern exposure, will be different from one obtainable in a case where a large pattern of the same phase is placed. However, in both of these cases, adjacent patterns can be separated.

Embodiment 7

The present invention is applicable also to an example wherein a pattern comprises fine lines extending in different directions and being smaller than the resolution, and wherein the spacing of adjacent patterns is not greater than the resolution. The seventh embodiment concerns such an example, and description will be made thereto in conjunction with FIGS. 19A and 19B.

Figure 19A:
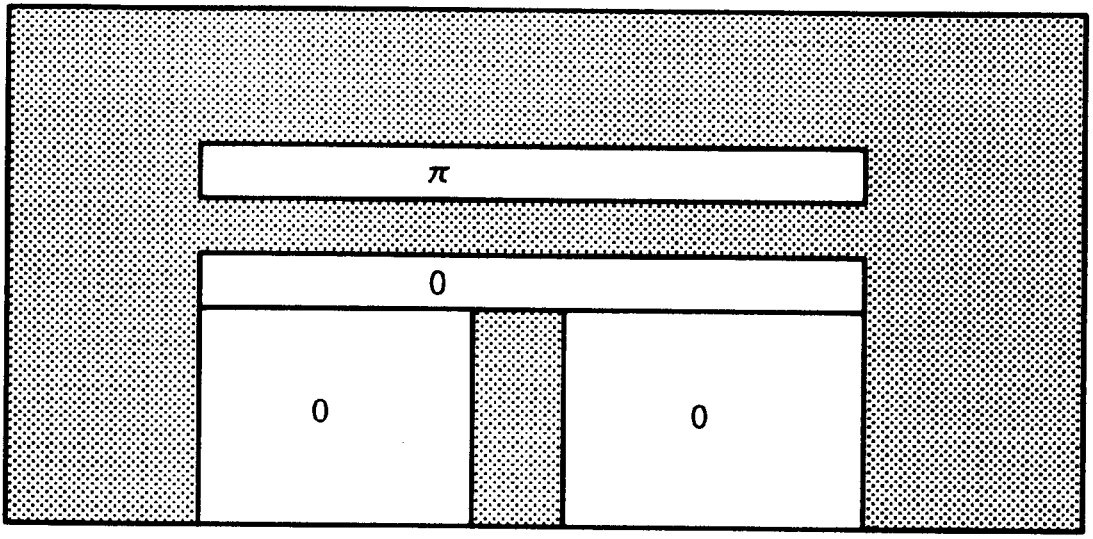
FIGS. 19A and 19B are schematic views, respectively, for explaining a procedure for making a periodic pattern, in a seventh embodiment of the present invention.
Figure 19B:
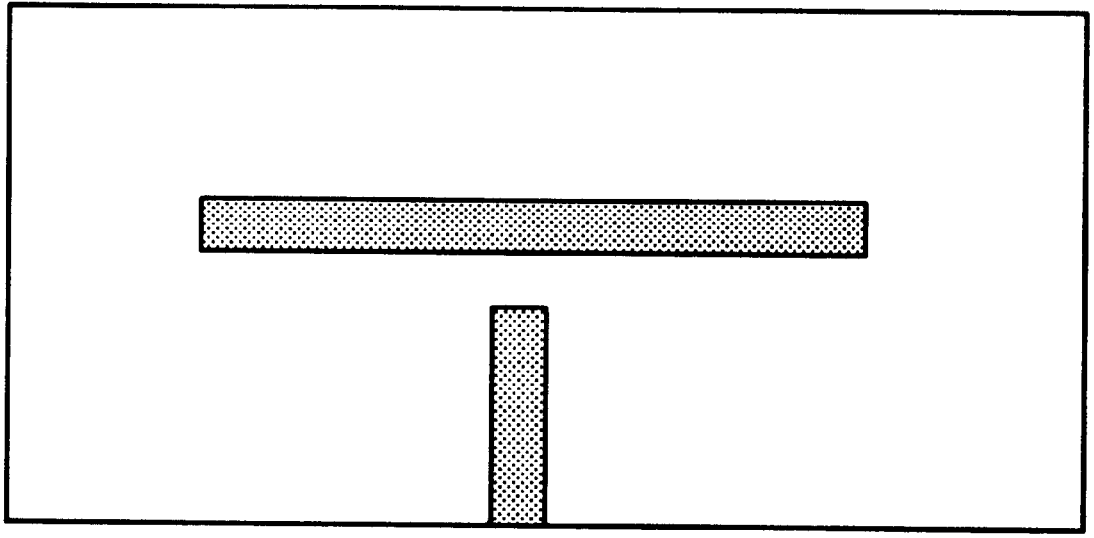

Here, it is assumed that, if the resolution when a stepper and a standard mask is used is 2 L, a fine line as shown in FIG. 19B has a width L, for example, which is narrower than the resolution 2 L. If a fine line and a pattern of the same linewidth are juxtaposed with each other with a spacing not larger than the resolution, even if the spacing is L being smaller than the resolution, there is no proximity effect. Rather, separation is easy due to contraction of the patterns. If, however, the spacing becomes smaller than L, separation of adjacent patterns becomes difficult, like the preceding embodiments.

As regards a periodic pattern to be used when a standard exposure pattern as shown in FIG. 19B is to be resolved by a multiple exposure process, like the first embodiment and as shown in FIG. 19A, a periodic pattern of opposite phases and having a periodicity not less than 2 is placed at the location where resolution of a fine line is difficult. A pattern of phase 0 may be placed at one side of a pattern of phase π where no pattern is present, to thereby increase the periodicity.

If there is a fine line extending in a direction different from the fine lines constituting the periodic pattern, no periodic pattern is placed but a large pattern of the same phase as of an adjacent periodic pattern is placed. At a portion to be superposed with such fine line extending in a direction different from the fine line of the periodic pattern, an isolated pattern comprising a light blocking area and being larger than a predetermined pattern is provided.

In the case of such standard pattern, the periodic pattern structure as shown in FIG. 17A is undesirable since an image after the multiple exposure process is degraded. For, in the pattern such as shown in FIG. 17A, the interaction caused between a patter of phase 0 and a large pattern of phase π influences over a light blocking area having no pattern, as a proximity effect, such that the shape of the light blocking area is distorted.

Namely, since there is phase reverse between the pattern of phase 0 and the large pattern of phase π, at the boundary the intensity becomes equal to zero, such that a dark line is produced. On the other hand, at the boundary with the light blocking area sandwiched between the pattern of phase 0 and the large pattern of phase π, the intensity becomes equal to zero because of the presence of the light blocking area thereat. However, since the dark line resulting from the phase reverse and the dark line produced by the light blocking area are different in respect to the tilt thereof, there occurs a wave in the dark line which applies, through the proximity effect, an influence to the surrounding portion. This causes distortion of the pattern of the light blocking area.

Where the pattern of the light blocking area of the periodic pattern is distorted, if the standard pattern to be superposed with this portion comprises fine lines, the distortion resulting from the periodic pattern does not disappear but is left there, after superposition. Distortion of a fine line leads to disadvantages of reduction of process margin such as defocus or exposure amount, for example, and it easily causes disconnection of the line.

If a fine line is formed with a thicker portion at its free end, as in the fifth embodiment, the intensity at that portion becomes stronger such that any distortion produced at the top free end of the fine line of the light blocking area, of the periodic pattern, can be cancelled. As a result, the fine line pattern being different from the periodicity direction of the composite image has not distortion. Rather, due to the proximity effect based on the dark line due to the phase inversion, the pattern at the light blocking area is pulled to the pattern orthogonal thereto. Therefore, these patterns can be made closer to each other.

Embodiment 8

The eighth embodiment will be described with reference to FIGS. 20A and 20B.

Figure 20A:
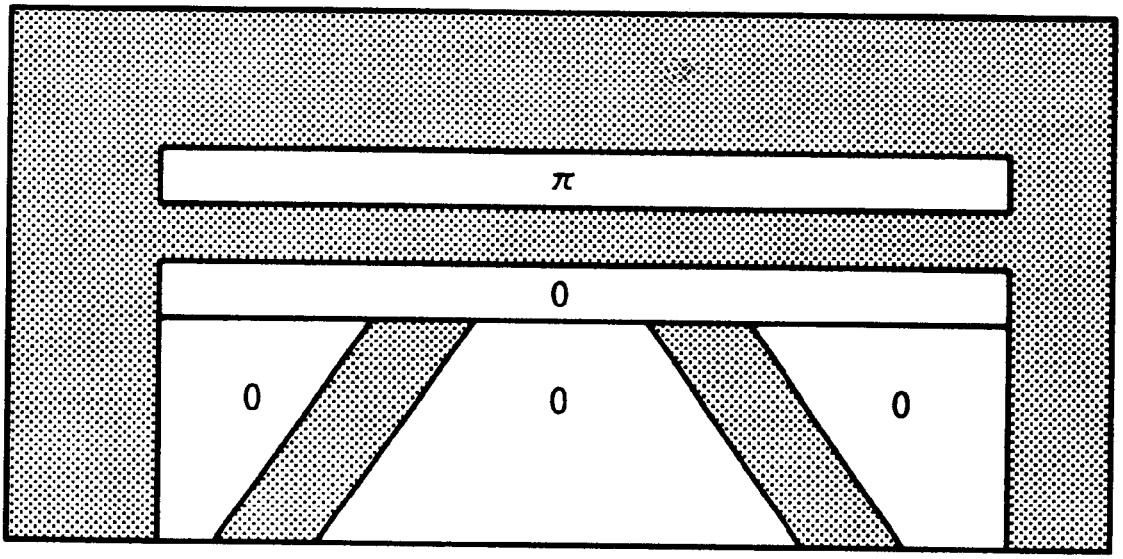
FIGS. 20A and 20B are schematic views, respectively, for explaining a procedure for making a periodic pattern, in an eighth embodiment of the present invention.
Figure 20B:
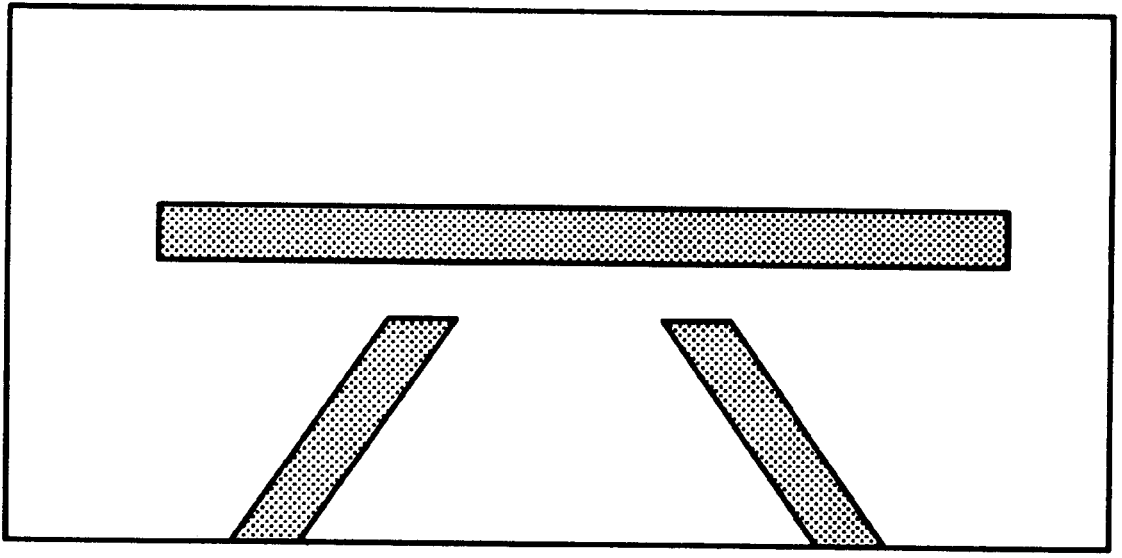

As regards a periodic pattern to be used when a standard exposure pattern as shown in FIG. 20B is to be resolved by a multiple exposure process, like the first embodiment and as shown in FIG. 20A, a periodic pattern of opposite phases and having a periodicity not less than 2 is placed at the location where resolution of a fine line is difficult. If there is a fine line extending in a direction different from the fine lines constituting the periodic pattern, no periodic pattern is placed but a large pattern of the same phase as of an adjacent periodic pattern is placed. At a portion to be superposed with such fine line extending in a direction different from the fine line of the periodic pattern, an isolated pattern comprising a light blocking area and being larger than a predetermined pattern is provided.

Embodiment 9

The method described above is applicable also to an example wherein there are a fine line narrower than the resolution as well as a fine line extending in a different direction but being not narrower than the resolution. The ninth embodiment concerns such an example. Description will be made with reference to FIGS. 21A and 21B.

Figure 21A:
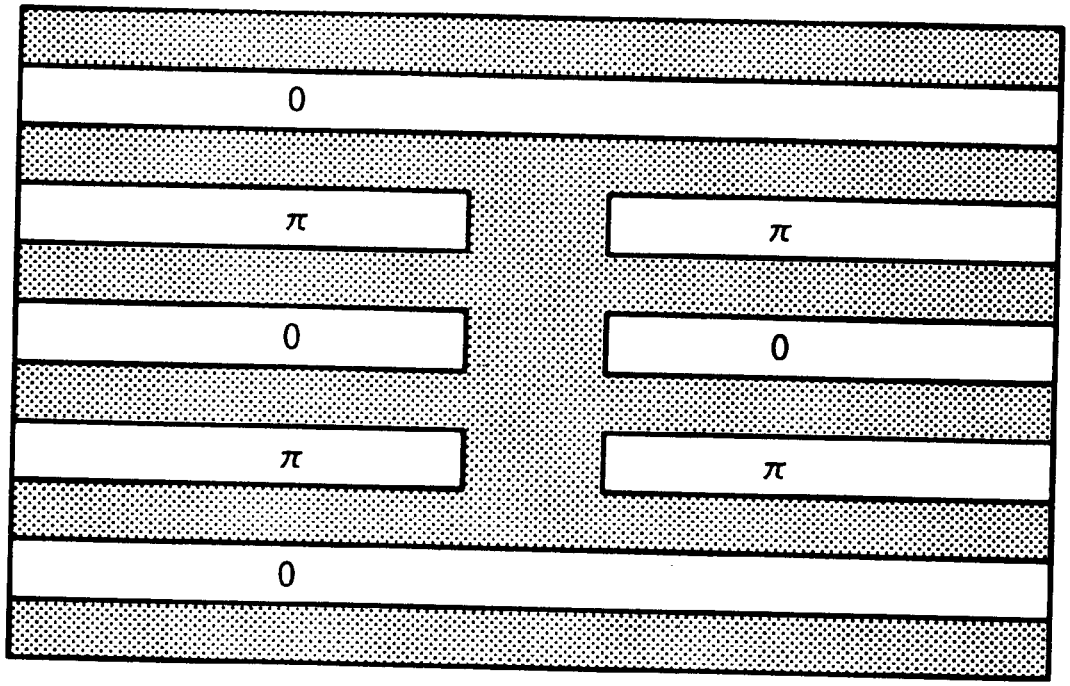
FIGS. 21A and 21B are schematic views, respectively, for explaining a procedure for making a periodic pattern, in a ninth embodiment of the present invention.
Figure 21B:
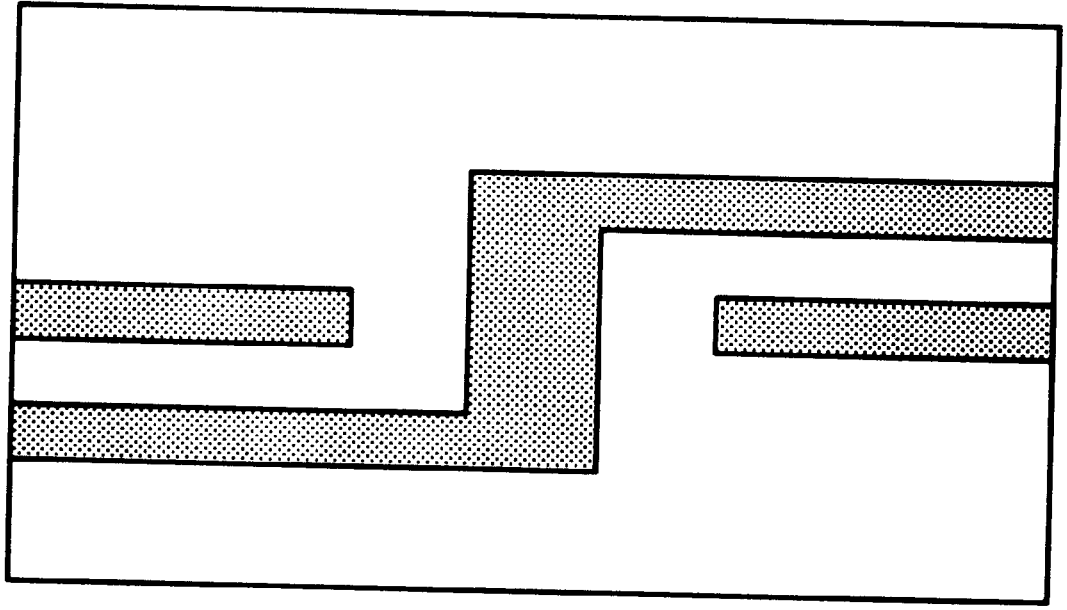

As shown in FIG. 21B, a case wherein there are fine lines extending in a lateral direction as well as fine lines in a different (longitudinal) direction and having a linewidth not less than the resolution, will be considered. Like the eighth embodiment, at an adjoining portion of patterns, separation is not particularly difficult.

When a multiple exposure process is performed to such a standard exposure pattern and a periodic pattern only in one direction, the linewidth of those fine lines in the direction different from the fine lines of the periodic pattern becomes uneven, due to the influence of an image of the periodic pattern. If such non-uniformness of linewidth is to be removed, use of a periodic pattern of this embodiment is desirable.

As regards a periodic pattern to be used when a standard exposure pattern as shown in FIG. 21B is to be resolved by a multiple exposure process, like the first embodiment and as shown in FIG. 21A, a periodic pattern of opposite phases and having a periodicity not less than 2 is placed at the location where resolution of a fine line is difficult. In a portion to be superposed with the pattern line in a direction different from the fine lines constituting the periodic pattern, no periodic pattern is placed but an isolated pattern comprising a light blocking area and being larger than the pattern having the different direction, is provided.

As described above, if the pattern in a direction different from the direction of the fine line narrower than the resolution comprises a fine line broader than the resolution, it is not necessary that, in the region where no periodic pattern is placed, a large pattern of the same phase as of its adjacent periodic pattern is placed. An isolated pattern of a light blocking area may well be placed there.

Figure 22A:
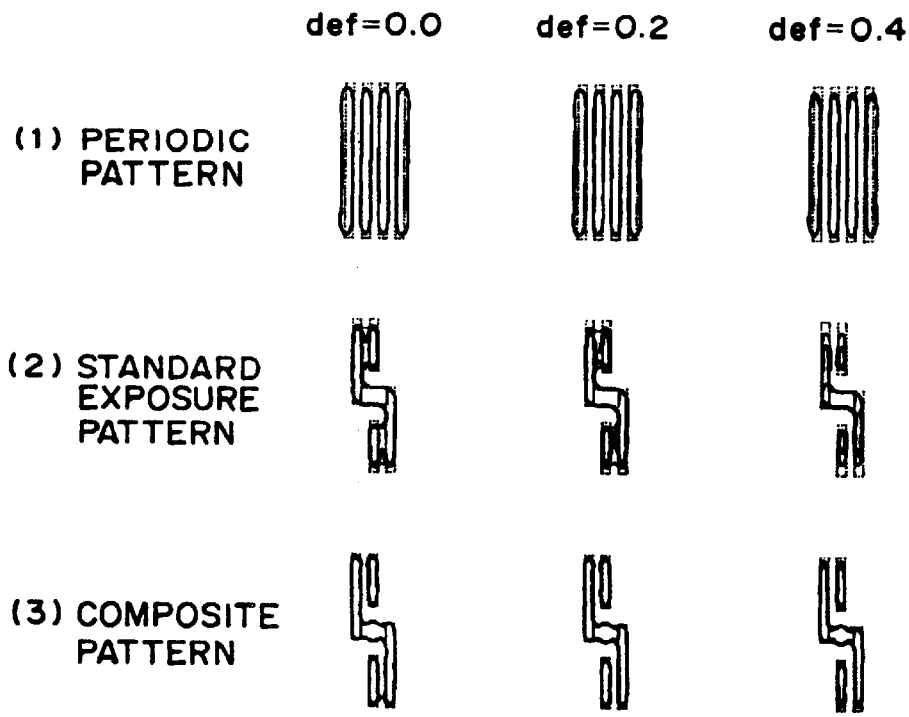
FIG. 22A is a schematic view for explaining results of a dual exposure process using a continuous periodic pattern and a standard pattern.
Figure 22B:
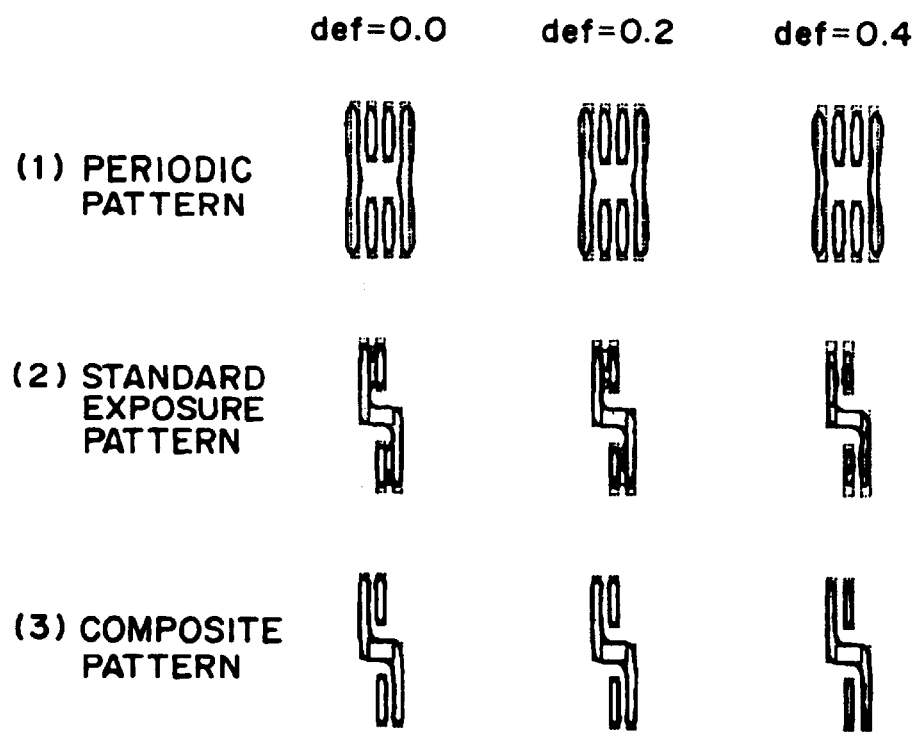
FIG. 22B is a schematic view for explaining results obtainable with the ninth embodiment of the present invention.

Referring to FIGS. 22A and 22B, advantageous effects of the ninth embodiment will be explained.

FIG. 22A illustrates the results of a dual exposure using a standard exposure pattern and a periodic pattern only in one direction. The results were obtained by resolving a pattern of fine lines of 0.12 micron, by using an exposure apparatus having a KrF excimer laser of a wavelength 248 nm and a projection optical system of NA=0.60. FIG. 22B illustrates the results of dual exposure using a standard exposure pattern and one wherein, as in the ninth embodiment, no periodic pattern is placed at a portion to be superposed with the line pattern of periodicity direction but an isolated pattern of light blocking area larger than this line pattern is placed. In composite patterns (3) in FIGS. 22A and 22B, as regards the longitudinal fine lines, they are resolved and contraction of the length is small. As compared with the composite pattern of FIG. 22A, the composite pattern of FIG. 22B has no thinning at the bent pattern and, like the fine lines, the linewidth of the line element broader than the resolution is well uniform.

The non-uniformness of linewidth is particularly poor in a case of a line pattern being orthogonal to the direction of the fine line of the periodic pattern. However, the direction of this line pattern is not limited to one orthogonal to the fine line of the periodic pattern. Further, when there are line patterns extending in plural directions different from the fine line of the periodic pattern, isolated patterns of light blocking areas may be provided in relation to these directions.

If the fine line is sufficiently larger than the resolution, no light blocking area may be provided. A periodic pattern being continuous in one direction may be used. In that occasion, the composite pattern obtainable by a multiple exposure process will not be degraded much. However, if the linewidth is close to the resolution, use of the periodic pattern of the ninth embodiment is effective.

Although the fifth to ninth embodiments described above use a Levenson type phase shift mask for the periodic pattern, substantially the same advantageous results are attainable by use of an edge type phase shift mask of the same pitch, as has been described with reference to the second embodiment. Alternatively, a binary mask wherein the light blocking area and the light transmitting area of the periodic pattern are reversed to provide constant phase, may be used in combination with the oblique incidence illumination method, as in the fourth embodiment.

Embodiment 10

The tenth embodiment concerns an example wherein the shape of a periodic pattern is changed relatively to a standard exposure pattern, to thereby correct pattern distortion due to an optical proximity effect. Description will be made in conjunction with FIGS. 23A and 23B.

FIG. 23A shows a periodic pattern and a standard exposure pattern to be used practically. By combining theses patterns, a pattern of the same shape as of a standard exposure pattern (2) of FIG. 23A, is just to be produced finally.

Where a periodic pattern (FIG. 8A) of the first embodiment is used, there is a possibility that, depending on the linewidth or any other condition, thinning occurs at the portion B (FIG. 23A) of the standard exposure pattern. The present embodiment is an example of a periodic pattern being able to correct such thinning. The basic procedure for preparing such a periodic pattern is the same as of the first embodiment.

The thinning portion B in FIG. 23A corresponds to the boundary between a light blocking area prepared to be superposed with fine lines in the periodicity direction and a light transmitting area corresponding to the periodic pattern. Due to the influence of unwanted exposure to diffraction light, for example, thinning may occur there.

In this embodiment, the light blocking area is arranged such as shown in FIG. 23A as a periodic pattern 1. More specifically, an auxiliary pattern comprising a light blocking area of 1 L square, the same as the width L of the fine line, is provided at the boundary portion, to thereby enlarge the size of the light blocking area, and to prevent unwanted exposure to diffraction light, for example. The undesirable thinning is thus prevented.

Figure 24A:
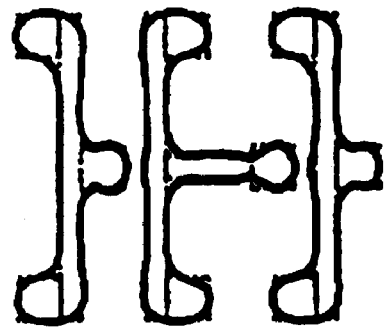
FIGS. 24A and 24B are schematic views for explaining results of simulation, according to another embodiment of the present invention.
Figure 24B:
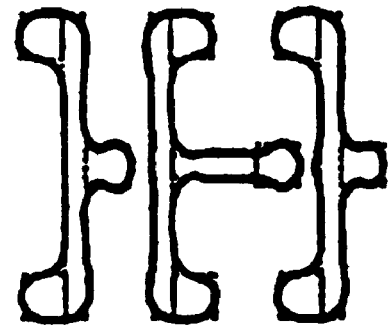

FIGS. 24A and 24B show the results of simulation made in relation to the periodic patterns of the first and tenth embodiments. FIG. 24A show a composite pattern (image) of the first embodiment, before thinning correction. FIG. 24B shows a composite pattern (image) after the dual exposure in the tenth embodiment, wherein an auxiliary pattern based on a light blocking area is added to perform thinning correction. Broken lines depict a desired pattern placement, while solid lines depict light intensity distributions obtained through the simulation.

It has been confirmed also from the simulation results that resolution for such region where resolution is difficult is resolved, and that, with use of a periodic pattern (1) of FIG. 23A having an auxiliary pattern for thinning correction, a good composite pattern can be produced even if a periodic pattern is combined with a standard exposure pattern (2) of FIG. 23A having fine lines extending in the periodicity direction.

The shape of the auxiliary pattern for thinning correction is not limited to one described here. Namely, in relation to a dual exposure process, when an isolated line is to be placed in such periodic pattern region to be superposed with a fine line, of the standard exposure, extending in the periodicity direction of the periodic pattern, the shape of the isolated line may be locally expanded into a predetermined shape while expecting contraction (thinning) of the isolated line due to the optical proximity effect. By doing so, the shape of a composite image finally produced can be reproduced satisfactorily.

The advantageous effects described above are attainable not only with a case of preparing a light blocking pattern but also with a case of preparing a pattern by a light transmitting area.

Also, when a periodic pattern and a standard exposure pattern such as shown in FIG. 23B are used, the shape of an isolated line may be locally expanded into a predetermined shape while expecting contraction (thinning) of the isolated line placed in the periodic pattern (1) of FIG. 23B, due to the optical proximity effect. By doing so, the shape of a composite image finally produced can be reproduced satisfactorily.

As described above, by using a periodic pattern wherein, in a portion thereof without a periodic structure, the shape is locally changed, the optical proximity effect due to unwanted exposure to diffracted light, for example, can be corrected. Therefore, the shape of a composite image finally produced by multiple exposure can be improved significantly.

Embodiment 11

The eleventh embodiment concerns a periodic pattern having a light blocking area, for adjusting a light quantity so that only a desired pattern is produced. Referring to FIGS. 25A and 25B, an example of T-gate pattern wherein a pattern is formed by a light transmitting area, will be explained.

In this embodiment, a T-gate pattern of the same shape as of a standard exposure pattern (2) of FIG. 25A should be produced.

When the pattern (2) of FIG. 25A is used as a standard exposure pattern for the dual exposure with a periodic pattern, a particular note is given to the fine lines in a lateral direction, and a periodic pattern is prepared in accordance with the first embodiment, for good reproduction of these fine lines. To this end, it is necessary to use a periodic pattern (1) such as shown in FIG. 24A.

It should be noted here that, at the central portion of the periodic pattern, fine lines can be produced if the adjacent patterns have alternate phases. Since the pattern is to be formed by a light transmitting area, if the pattern at the central portion is too large, the light quantity at the central portion becomes higher than that by the fine lines. Therefore, when a composite image is produced by the dual exposure, the pattern at the central portion also remains, and it ends in failure to produce only desired fine lines.

In the eleventh embodiment, a portion of a large pattern is blocked against light such as shown in FIG. 24A as the periodic pattern (2), and the periodic pattern is formed by fine lines, so as to make the light quantity uniform as a whole. Also, adjacent phases should be reversed, and the linewidth of the large pattern should be narrowed similarly to the fine line.

Namely, when a periodic pattern is formed by a light transmitting area and when pattern of a linewidth larger than the fine line may be produced in a region other than a design pattern, it is necessary to modify the periodic pattern by adding a light blocking area to the thick linewidth pattern, for coordination with the light quantity of the fine line. Further, by removing the thick linewidth pattern, the light quantity is balanced and, moreover, the effect of the phase shift mask is enhanced.

The advantageous effects described above are attainable not only with a case of preparing a light transmitting pattern but also with a case of preparing a pattern by a light blocking area such as shown in FIG. 25B.

When a periodic pattern and a standard exposure pattern shown in FIG. 25B are used, if it is expected that a patter of a thick linewidth larger than the fine line is produced, a light blocking area should be added to the thick pattern for registration with the light quantity of the fine line pattern.

In FIG. 25B, the linewidth denoted by C in the drawing should be 1.5 to 3 times larger than the fine line element. For, unless the region C is wide to some extent, an adverse influence will be applied to the image quality of the isolated line.

In FIG. 25A, the periodic pattern is formed by a light transmitting area. Thus, the fine line is to be formed by the effect of zero light intensity, produced at the peripheral light blocking region and the light transmitting region (pattern). Therefore, it is necessary to provide a thick linewidth pattern with a light blocking area and, by making this area wide, to make the light intensity in the peripheral portion close to zero.

In FIG. 25B, on the other hand, the pattern is formed by a light blocking area. Thus, a fine line is to be formed by the effect of zero intensity, produced at the peripheral light transmitting region and the light blocking region (pattern). Therefore, it is necessary to provide the thick linewidth pattern with a light blocking area and, by making the peripheral light transmitting region wider than that of FIG. 25A, to make the peripheral portion light intensity close to 1.

As described above, while an optimum linewidth differs with situation, in order to attain balance of light quantity over the whole periodic pattern, if the linewidth of the fine lines of the periodic pattern is L, a pattern of a linewidth not greater than 3 L is used. By doing so, the linewidth becomes constant, over the whole periodic pattern. Thus, when the periodic pattern (1) and the standard exposure pattern (2) (FIGS. 25A and 25B) are combined, a good reproduction is attainable even with a standard exposure pattern (circuit pattern) having a fine line different in direction from the fine line of the periodic pattern.

Embodiment 12

Figure 26A:
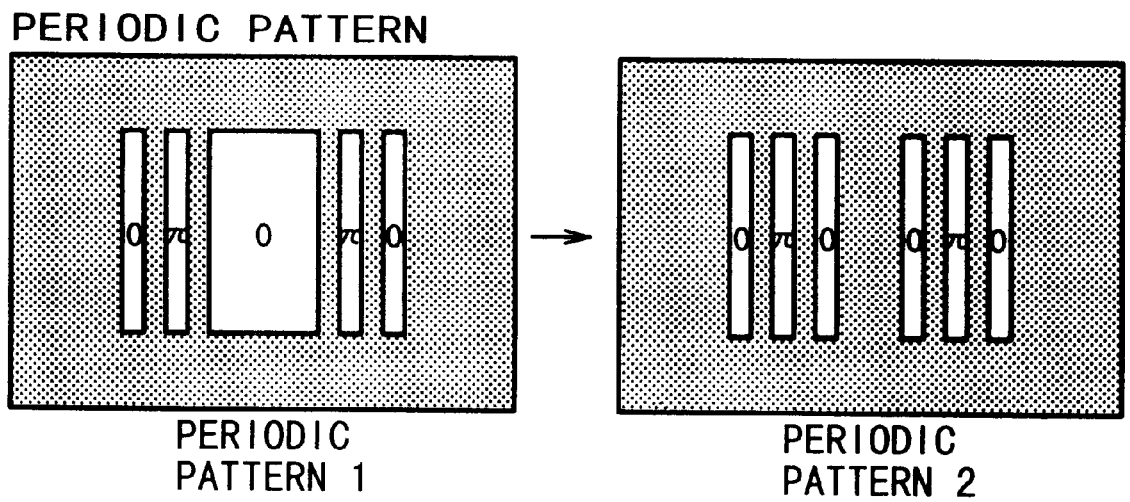
FIGS. 26A and 26B are schematic views, respectively, for explaining a procedure for making a periodic pattern in a still further embodiment of the present invention.
Figure 26B:
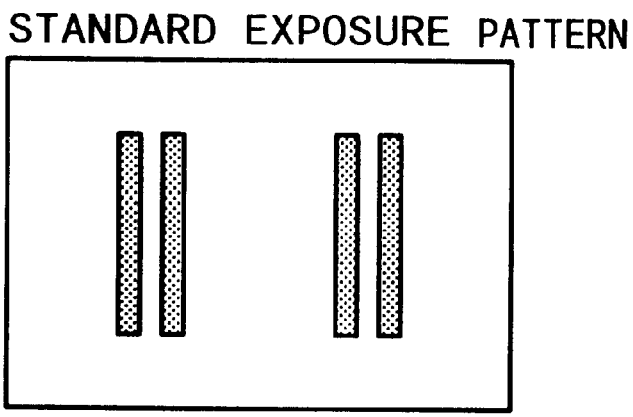

This embodiment concerns a periodic pattern to which a light blocking area is added to adjust the light quantity over the whole periodic pattern. Referring to FIGS. 26A and 26B, an example wherein a pattern is formed by a light blocking area, will be explained.

In this embodiment, a pattern of the same shape as of a standard exposure pattern (2) of FIG. 26A should be produced. This standard exposure pattern has a pitch being varied, such that a continuous periodic pattern is not usable.

When the pattern (2) of FIG. 26A is used as a standard exposure pattern for the dual exposure, a particular note is given to the fine lines, and the phases are determined, for good reproduction of these fine lines. The periodic pattern (1) of FIG. 26A is arranged so.

It should be noted here that, for formation of a fine line, adjacent periodic patterns should have reversed phases. In this respect, the two periodic patterns of FIG. 26A satisfy this condition. However, in the periodic pattern 1 of FIG. 26A, only the linewidth of the central pattern of a phase 0 is thick. Thus, the light passes only this area much. This causes a large difference in light quantity between the fine line and this thick line, and it may adversely affect a composite image.

In consideration of it, as shown in the periodic pattern 2 of FIG. 26A, a light blocking area is added to the thick linewidth region of the periodic pattern to assure that all the periodic pattern to be used in the dual exposure have the same linewidth. By doing so, the light quantity over the whole periodic pattern can be balanced, and a good composite image can be produced in the dual exposure. Further, the effect of phase shift can be enhanced.

Embodiment 13

Figure 27A:
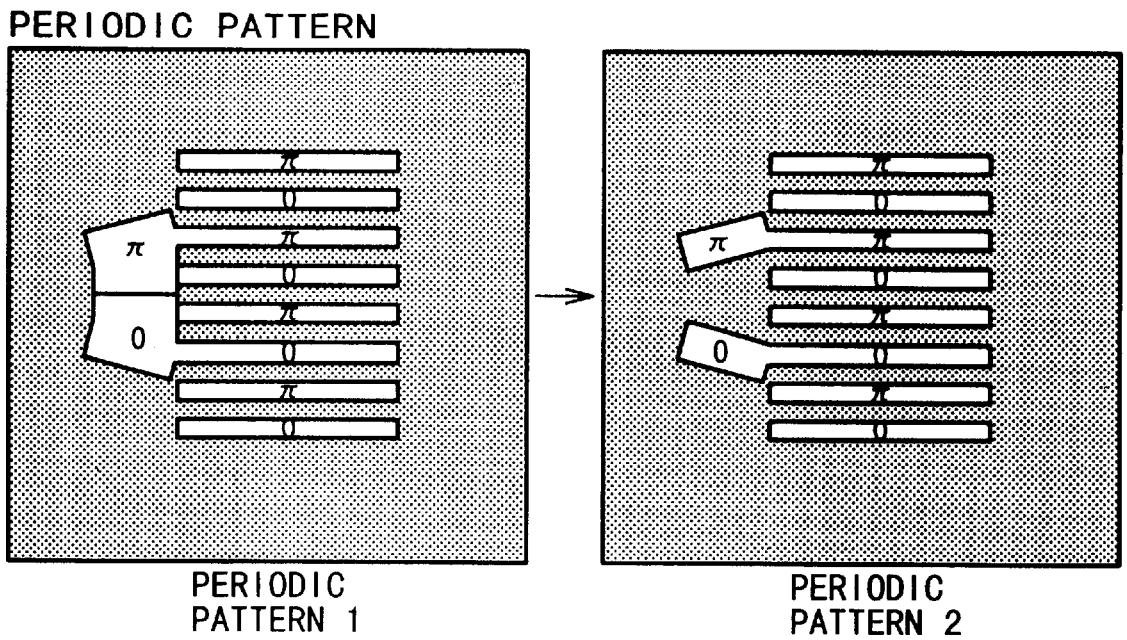
FIGS. 27A and 27B are schematic views, respectively, for explaining a procedure for making a periodic pattern in a yet further embodiment of the present invention.
Figure 27B:
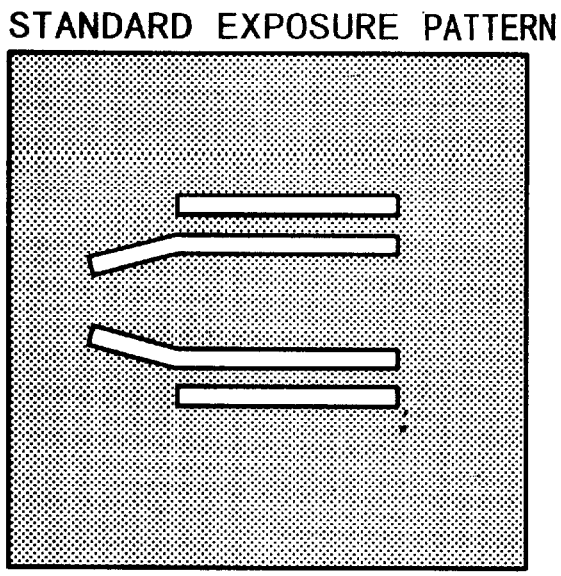

This embodiment concerns a periodic pattern to which a light blocking area is added to adjust the light quantity over the whole periodic pattern. Referring to FIGS. 27A and 27B, an example wherein a pattern is formed by a light transmitting area, will be explained.

In this embodiment, a pattern which is to be finally produced is one such as shown in FIG. 27B.

When the pattern (2) of FIG. 27B is used as a standard exposure pattern for the dual exposure, a particular note is given to the fine lines, and the phases are determined, for good reproduction of these fine lines. The periodic pattern (1) of FIG. 27A is arranged to meet this.

It should be noted here that, for formation of a fine line, adjacent periodic patterns should have reversed phases. In this respect, the two periodic patterns of FIG. 27A comprise the same pattern. However, in the periodic pattern 1, inclined line areas are thick. Thus, the light passes only this area much. This causes a large difference in light quantity between the fine line and this thick line, and it may adversely affect a composite image. Particularly, if a pattern is formed by a light transmitting area, light passes a large linewidth region much. As a result, an unwanted portion may remain as a pattern.

In consideration of it, as shown in the periodic pattern 2 of FIG. 27A, a light blocking area is added to each thick linewidth region of the periodic pattern to assure that the light quantity over the whole periodic pattern is balanced. Thus, a good composite image can be produced in the dual exposure.

Embodiment 14

This embodiment concerns another example of a pattern having fine lines extending laterally and longitudinally. In this embodiment, a pattern of the same shape as of a standard exposure pattern of FIG. 28B should be produced.

Figure 28A:
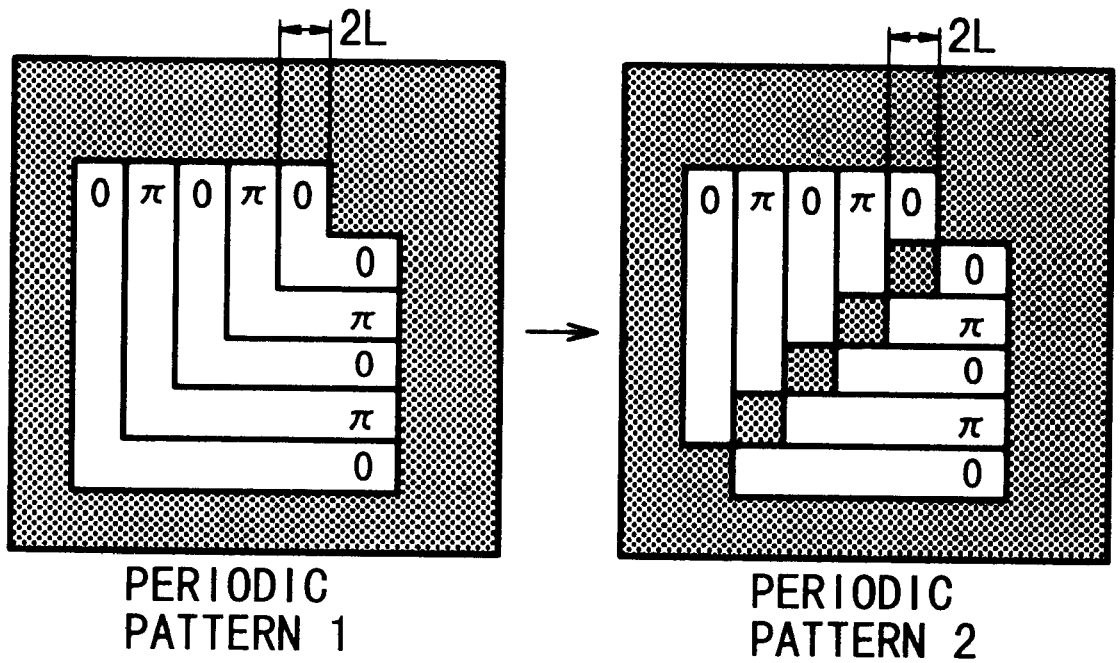
FIGS. 28A and 28B are schematic views, respectively, for explaining a procedure for making a periodic pattern in a still further embodiment of the present invention.
Figure 28B:
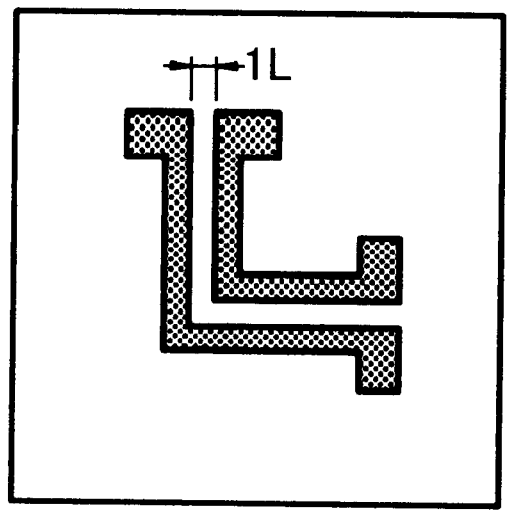

The standard exposure pattern of FIG. 28B has fine lines extending both in longitudinal and lateral direction. The spacing of adjacent lines is not greater than the resolution. In order to prepare such a pattern, it is necessary to use a periodic pattern such as shown in FIG. 28A.

Such periodic pattern should include a region of fine lines not larger than the resolution in the standard exposure pattern and a region wherein the spacing between adjacent patterns is not greater than the resolution. In this embodiment, since the standard exposure pattern is provided solely by a fine line region and a region where patterns are juxtaposed with each other with a spacing not greater than the resolution, the periodic pattern region is made not smaller than the standard exposure pattern.

Here, in the periodic pattern 1 of FIG. 28A, edges are added to the fine line portion for enhancement of resolution, so as to attain resolution of the fine line of the standard exposure pattern of FIG. 28B.

FIGS. 29A–29D show the results of simulation made in relation to a composite image obtainable by periodic patterns 1 and 2 of FIGS. 28A and 28B as well as those through dual exposure using these periodic pattern and the standard exposure pattern. Broken lines depict a pattern to be produced practically, and solid lines depict a light intensity distribution of a composite image, calculated by the simulation.

Figure 29A:
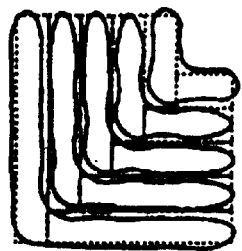
FIGS. 29A–29D are schematic views, respectively, showing results of simulation in this embodiment.

From the results of simulation of FIG. 29A, it is seen that, in the light intensity distribution provided by the periodic pattern 1 of FIG. 28A, there is a wave in orthogonal fine lines. Also, in the image of FIG. 29B after the dual exposure, a similar wave is clearly shown. Such wave is undesirable because it may cause disconnection of line.

Figure 29C:
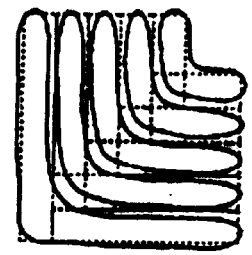
Figure 29B:
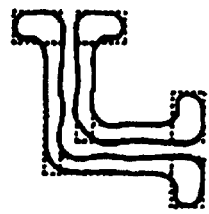
Figure 29D:
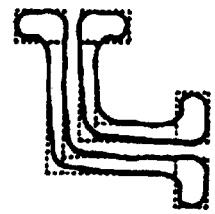

In order to avoid such wave, as shown in the right-hand periodic pattern 2 of FIG. 28A, a periodic pattern wherein a portion of the light transmitting area, defining an edge, is covered by a light blocking material, is used. By this, as shown in FIGS. 29C and 29D, the wave of fine lines is removed, and a good composite image is produced.

Figure 30A:
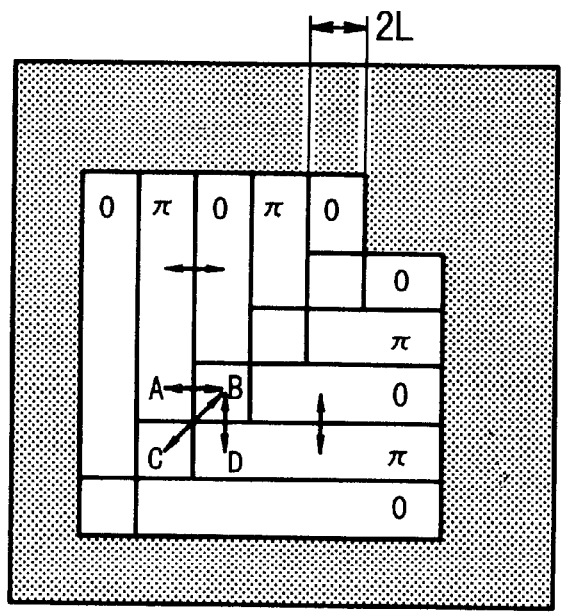
FIGS. 30A and 30B are schematic views, respectively, for explaining advantageous effects of a periodic pattern according to this embodiment of the present invention.
Figure 30B:
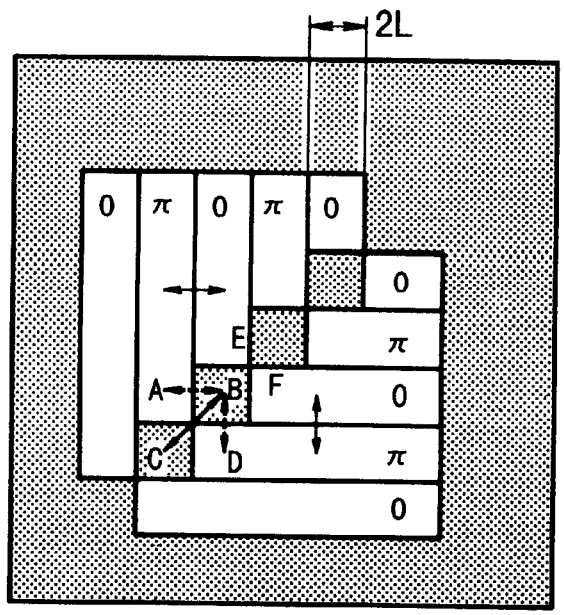

Referring to FIGS. 30A and 30B, advantageous effects of the periodic pattern of this embodiment will be described.

In this periodic pattern, fine lines are formed on the basis of a phenomenon (edge effect) that the light intensity at the edge portion of adjacent patterns having opposite phases becomes equal to zero.

In the periodic pattern 1 of FIG. 30A, at the corner of the L shape, the edge effect of opposite phases occurs between A and B, between B and C, and between B and D, in the drawing. In other portions, the edge effect occurs in a similar direction as of between A and B or B and D. However, at the corner of L shape, the effect in an inclined direction of B and C is added. Therefore, the edge effect due to phase reverse occurs in duplication only at the corner of the L shape, and the intensity concentration arises. This causes a wave in a fine line.

On the other hand, a periodic pattern 2 of FIG. 30B shows a case wherein a portion of the light transmitting area that defines an edge is formed into a light blocking area. In this example, the L-shape corner is defined by using the edge effect of the light transmitting area and the light blocking area, between A and B and between B and D in the drawing. Since the edge effect produced in an oblique direction, which causes intensity concentration in the periodic pattern 1, is removed. Therefore, the wave can be prevented.

The edges to be actually superposed with a standard exposure pattern are those two at the center of FIG. 28A. By adding one edge at each side thereof, not only the resolution for the fine line can be improved but also good resolution of a pattern of a square contact hole connection, attached to an end of the fine line, can be assured.

As described above, for resolution of L-shaped fine lines being arrayed, a L-shaped phase shift mask edge type is used and, additionally, the portion about the intersection of the L shape is covered by Cr, to thereby avoid intensity concentration. By doing so, a good composite image can be produced.

Figure 31A:
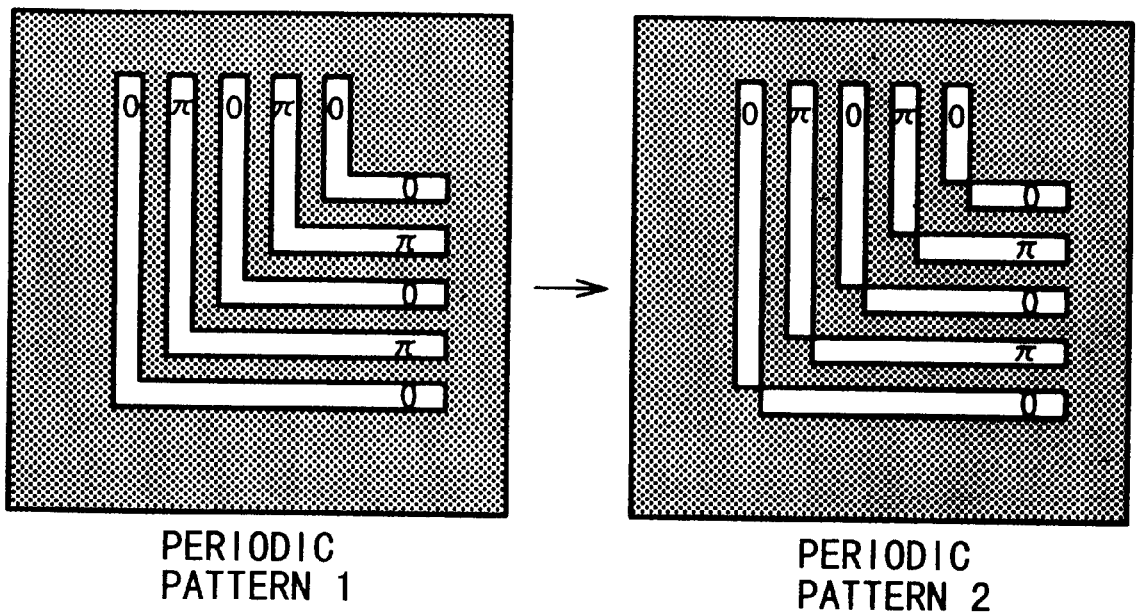
FIGS. 31A and 31B are schematic views, respectively, for explaining a procedure for making a periodic pattern in this embodiment, wherein a Levenson type pattern is used.
Figure 31B:
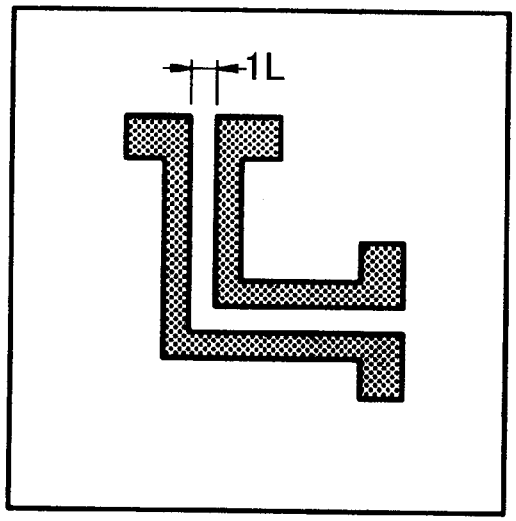

In that occasion, the mask is not limited to the edge type. If the pitch of the periodicity of the periodic pattern fine lines is 2 L, a relation 0<"periodic pattern linewidth" <2 L is good. Therefore, such L-shaped pattern can be formed even by using a Levenson type pattern such as shown in FIG. 31A or 31B. In that occasion, the portion adjacent the intersection of L-shape is light-blocked by Cr to avoid intensity concentration. By doing so, a good composite pattern (image) can be produced through a dual exposure process.

Embodiment 15

Figure 32A:
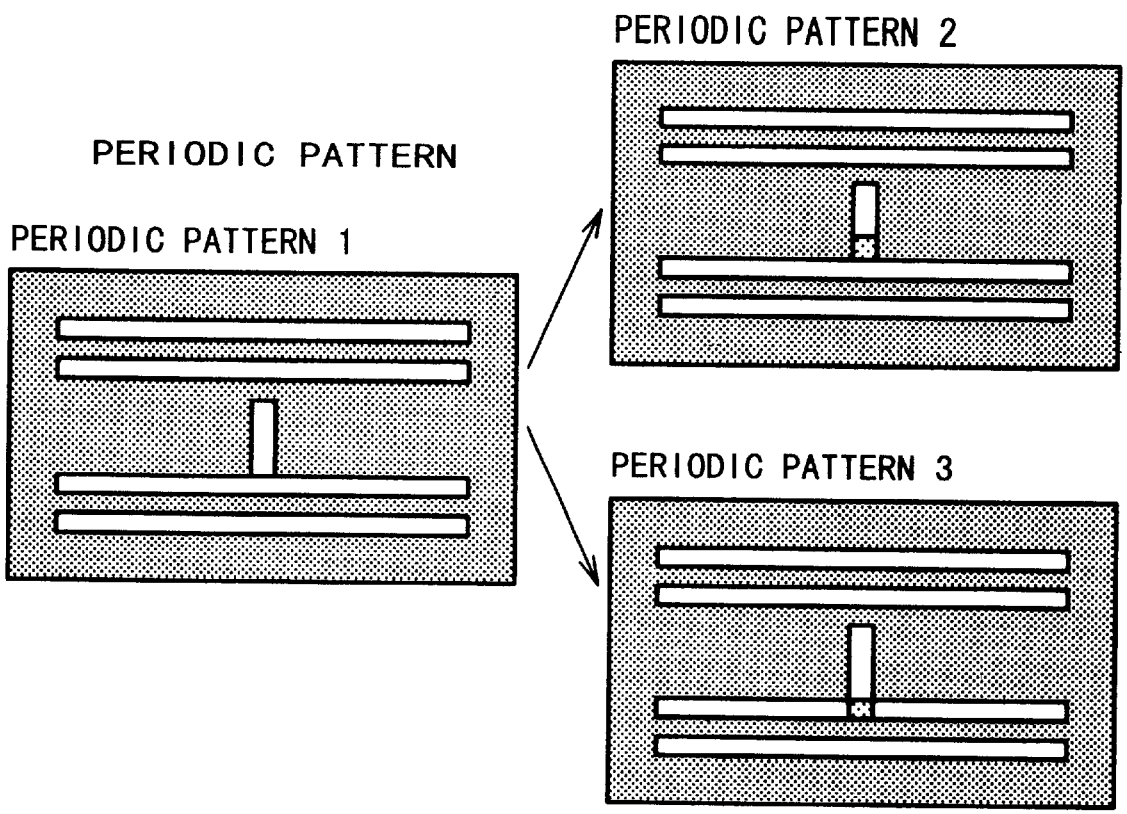
FIGS. 32A and 32B are schematic views, respectively, for explaining a procedure for making a periodic pattern in a still further embodiment of the present invention.
Figure 32B:
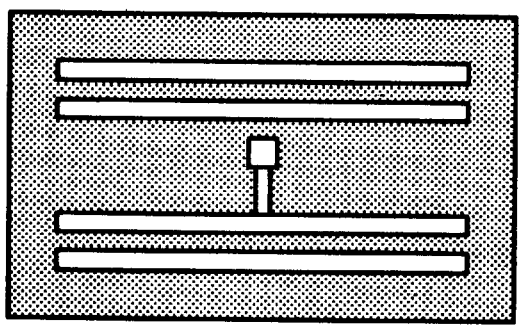

This embodiment concerns an example of a pattern having longitudinal and lateral fine lines which are juxtaposed into a T shape. Referring to FIGS. 32A and 32B, the embodiment will be described with reference to an example wherein a pattern is formed by a light transmitting area.

In this embodiment, a pattern of the same shape as of a standard exposure patter of FIG. 32B is going to be produced finally through a dual exposure process.

The standard exposure pattern of FIG. 32B includes fine lines extending both in longitudinal and lateral directions, and they are juxtaposed with each other with a spacing not greater than the resolution. In order to prepare such a pattern, it is necessary to use a periodic pattern such as shown in FIG. 32A.

Like the first embodiment, as a periodic pattern 1 of FIG. 32A, a periodic pattern only in one direction is used. As regards fine lines in a different direction, there is an isolated line provided. Here, the periodic pattern of FIG. 32A is arranged so that, a periodic pattern is superposed on the fine line portion for enhancement of resolution, so as to attain resolving the fine lines of the standard exposure pattern of FIG. 32B.

FIGS. 33A–33C show the results of simulation made to the periodic patterns 1 and 2 of FIGS. 32A and 32B as well as to a composite image of the periodic patterns and the standard exposure pattern. In each of these drawings, a periodic pattern, a standard exposure pattern and a light intensity distribution of a composite pattern (image) after the dual exposure, are illustrated in the order from the above. Broken lines depict a pattern to be produced practically, and solid lines depict those calculated by the simulation.

From the results of simulation, it is seen that light intensity concentration occurs at a portion of intersection of the T shape, and that a pattern much thicker than a design value is produced there. As a result, in a composite image, the intersection portion of the T shape is thick.

In consideration of it, a light blocking area is defined at the connection of the longitudinal line of the T-shape such as shown in the periodic pattern 2 of FIG. 32A. By doing so, the pattern can be reproduced satisfactorily. FIG. 33B shows the result. Comparing the simulation results of different periodic pattern shape in FIGS. 33A and 3B, it is seen that, in FIG. 33B, the rounding of T shape is removed, and a good image is produced.

Further, a light blocking area may be formed at the intersection of T shape, as in the periodic pattern 2. In that occasion, while the intersection of the T shape in the periodic pattern of FIG. 33C may be thinned, since the standard exposure pattern has a round shape, good reproducibility of the connection of T shape in a composite image (FIG. 33C) is assured by execution of the dual exposure. Also in FIGS. 33A and 33B, the fine line at the T-shape connection of the composite image swells leftwardly, by using the periodic pattern 3 of FIG. 33C, such swelling of the T-shape connection can be avoided.

For correction of a standard exposure pattern, in that occasion, a periodic pattern of over-correction as can be provided by combining pattern of FIGS. 33B and 33C, may be used. It this is done, even if the light intensity distribution of the periodic pattern is deviated slightly from a predetermined shape, the composite image after the dual exposure can be formed with a predetermined shape.

As described above, by adding a light blocking area to the connection of longitudinal element of the T shape or to the intersection of the T shape, good reproducibility for the connection of T can be accomplished.

In accordance with these embodiments, a periodic patter being specifically arranged is used by which correction of pattern distortion due to the optical proximity effect, even for a pattern having fine lines extending in different directions, can be achieved. Thus, a good composite image (i.e., a circuit pattern) can be produced. While the fourteenth and fifteenth embodiments have been described with reference to examples of L shape and T shape patterns, respectively, the pattern is not limited to these shapes. If a pattern contains an intersection, the pattern distortion can be avoided by providing a light blocking area at the intersection or in a portion about it.

An image of a periodic pattern can be formed by illuminating a binary mask in accordance with the oblique incidence illumination method. Substantially the same advantageous results as of a phase shift mask are attainable, in that occasion.

Further, either a negative resist or a positive resist may be used, by inverting the light blocking area and the light transmitting area of the mask.

Embodiment 16

A multiple exposure process is such that exposures of a periodic pattern and a standard exposure pattern are made with appropriately set exposure amounts, respectively, by which a composite image of a desired shape is produced.

As the sum of these exposure amounts reaches a sensitivity (photoprinting) threshold of a resist, a pattern of a desired shape and desired size is formed. While the size of a pattern produced may become larger or smaller than a desired, due to shortage or excess of exposure, the extent for the tolerable range of exposure amount wherein variation is acceptable, is called an exposure amount latitude.

In the multiple exposure process, in addition to such total exposure amount, the ratio of respective exposure amounts is influential to the pattern shape.

More specifically, in the multiple exposure process, there exists an optimum value for the ratio of exposure amounts. With reference to such optimum exposure amount ratio, the exposure latitudes for respective exposures are determined. For example, if the exposure amount of a standard exposure pattern becomes relatively large, then the pattern shape as a whole becomes close to a desired pattern shape. However, the contract at a fine pattern portion becomes low, and the image is blurred.

On the other hand, if the exposure amount of the periodic pattern becomes relatively large, a good contrast image is obtainable for a fine pattern. However, in place, the image based on the periodic pattern becomes strong, such that distortion occurs at the pattern portion which ranges to the periodic pattern. Particularly, where a positive resist is used and the standard exposure pattern is defined by a light blocking area, this tendency is notable.

The sixteenth embodiment concerns an example wherein the length of a periodic pattern is adjusted so that, even if the exposure amount ratio of the periodic pattern is raised, production of distortion in the pattern portion ranging to the periodic pattern can be suppressed, and that the latitude for exposure amount ratio as well as the latitude for exposure amount can be made higher.

Figure 34:
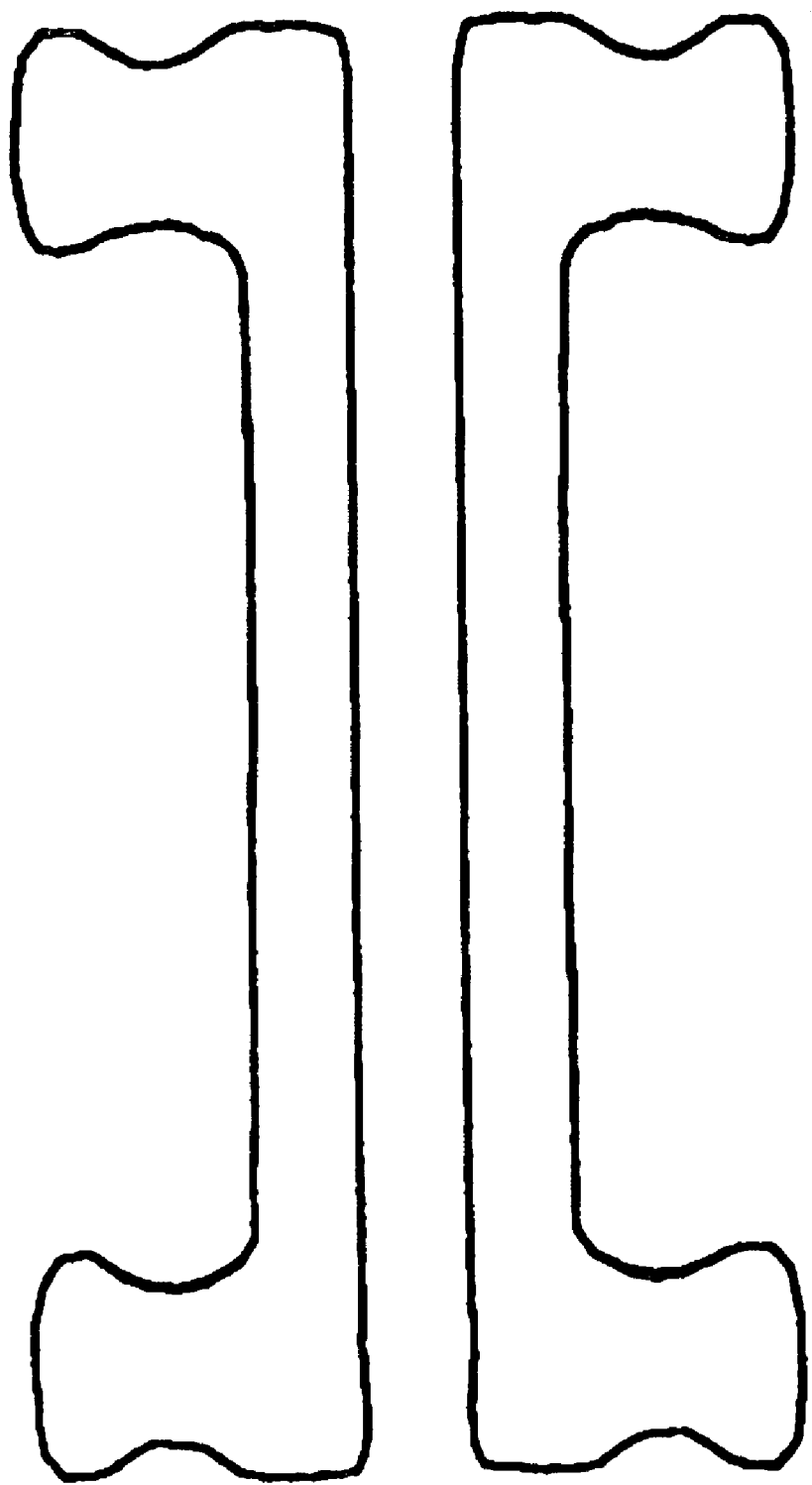
FIG. 34 is a schematic view for explaining a phenomenon of distortion in a pattern portion ranging to a periodic pattern, to be produced in a dual exposure process.

As described, if the exposure amount ratio of a periodic pattern becomes relatively large, as shown in FIG. 34 there distortion in the pattern portion which extends up to the periodic pattern. Details of it will be described with reference to FIGS. 39A–39D. Here, description will be made on an assumption of a condition for enhancement of distortion, that is, the exposure amount of the periodic pattern is relatively large as compared with the standard exposure pattern.

As shown in FIG. 39A, the standard pattern is depicted as a pattern 1 while the periodic pattern is depicted as a pattern 2. The length of the periodic pattern in its lengthwise direction is not particularly specified, and normally, it is sufficiently longer than that of the pattern 1 in its lengthwise direction.

In the multiple exposure process, as shown in FIG. 39B, the patterns 1 and 2 are exposed superposedly while their centers being aligned with each other, without intervention of a development process. As regards the alignment, since the pattern 1 comprises a pattern defined by a light blocking area, it is registered with respect to the light blocking portion of the periodic pattern.

FIGS. 39C and 39D each shows light intensity distributions on sectional planes along lines A–A', B–B' and C–C' in FIG. 39B, as for the light intensity distribution of a pattern image after being combined. Since each light intensity distribution is symmetrical with respect to the center of the pattern, only a half on the left hand side is illustrated. The section A–A' extends through the center of the fine line portion of the light blocking area of the patterns 1 and 2. The section B–B' extends through the center of the fine line portion of the light transmitting area of the pattern 2, adjacent to its light blocking area. The section C–C' extends through the center of the fine line portion of the light blocking area of the pattern 2, adjacent to that light transmitting area.

FIG. 39C illustrates light intensity distributions, along theses sections, of the patterns 1 and 2 before being combined. Broken lines depict the intensity of the pattern 1 upon the reticle, namely, an idealistic intensity distribution of the pattern 1 to be produced on the wafer.

Since a light blocking pattern is used for each of the patterns 1 and 2, it is seen from FIG. 39C, showing the light intensity distributions before being combined, that in the section A–A' of the pattern 1 where fine lines are present, the intensity on the right hand side of the pattern is lowered. Due to the presence of such blurring of fine pattern, the blurring of the fine line applies an influence to the B–B' section, such that in the B–B' section the intensity on the right hand side is lowered. Thus, it is deviated from an idealistic intensity distribution.

In the C–C' section, on the other hand, because the influence of blurring of the fine pattern is reduced and, at the pattern portion, it becomes close to zero. Thus, the intensity becomes very close to the idealistic intensity distribution.

As regards the pattern 2, along the section A–A' and section C–C', the intensity is zero because the pattern is a light blocking area. In the section B–B', a uniform intensity appears. While the intensities of the patterns 1 and 2 are depicted as a certain intensity ratio, as described above, it is the intensity ratio that enhances the distortion.

FIG. 39D shows light intensity distributions after being combined. Broken lines depict an idealistic shape of a light intensity distribution of a composite image. The intensity peak (smallest value) thereof is adjusted with the resist threshold level. Thus, such portion as having an intensity lower than this threshold can be formed as an image.

As regards the composite pattern, those in the section A–A' and section C–C' corresponds to the pattern 1 before the composition. The section B–B' corresponds to the sum of the patterns 1 and 2 before composition, but since the pattern 2 has uniform intensity, the distribution is such that the shape of the pattern 1 is raised uniformly.

Comparing them with the resist threshold, in the sections A–A' and C–C' of the composite pattern, an image shape close to an idealistic shape are obtained. However, on the section B–B', as compared with the sections A–A' and C–C', due to the presence of uniformly raised distribution, the intensity is higher than the threshold.

FIGS. 40A–40D concern an embodiment of the present invention wherein a periodic pattern is optimized to reduce thinning at a portion where fine lines intersect orthogonally.

FIG. 40A shows patterns 1 and 2 before combined. FIG. 40B shows patterns 1 and 2 when superposed with each other. FIG. 40C shows light intensity distributions before combined, and FIG. 40D shows light intensity distributions after being combined.

As shown in FIG. 40A, the pattern 1 for a standard exposure pattern is just the same as of a conventional one. As regards the pattern 2 for a periodic pattern, while the pitch and the linewidth are conventional, the length thereof in the lengthwise direction of the patterns is made equal to the length of the pattern 1 in its lengthwise direction.

The alignment process in the multiple exposure process was in a conventional manner, and intensity distributions along the sections A–A', B–B' and C–C' before and after being combined, were illustrated.

As regards the pattern before composition, as shown in FIG. 40C, only in the section B–B' of the pattern 2, the distribution is not uniform. There is an edge having a small tilt (as circled in the drawing) at a portion where no pattern is present. The intensity on the left hand side thereof is zero.

As regards the pattern after composition, as shown in FIG. 40D, the light intensity distributions on the sections A–A' and C–C' are conventional. The light intensity distribution on the section B–B', since the tilt of the edge of the pattern 2 before combined is opposite to that of the edge of the pattern 1, they cancel with each other. As a result of it, the edge (as circled in the drawing) of the pattern (light intensity distribution) after being combined is gentle.

Comparing them with the resist threshold, it is clear from FIG. 40D that, in the section B–B', the distribution on the right hand side is uniformly raised as compared with FIG. 39D, whereas since the edge on the left hand side is gentle, the pattern portion lower than the threshold is expanded such that the distribution becomes close to an idealistic size.

Thus, like the sections A–A' and C–C' of the composite pattern, also with respect to the section B–B' an image shape close to the idealistic shape is produced. Viewing from the above, the pattern has no thinning or reduced thinning at the portion where fine patterns intersect orthogonally.

Further, as shown in FIG. 39D, since the tilt of intensity along the section B–B' of the composite pattern, in the vicinity of the resist threshold, is very strong, there may arise a problem that only a small change in exposure amount intensity about the resist threshold level will cause a large change in size of the pattern. However, in the example of FIG. 40, since the tilt of intensity in the B–B' section of the composite pattern, about the resist threshold level, is made gentle. As a result, a small change in exposure amount intensity near the resist threshold level does not cause a large change in pattern size.

Next, the effects of optimization of the length of a periodic pattern will be explained in greater detail, while comparing an example of FIG. 41 (without optimization of periodic pattern length) and an example of FIG. 42 (with optimization of periodic pattern length), and also by comparing an example of FIG. 43A (without optimization of periodic pattern length while changing light quantity ratio) and an example of FIG. 434B (with optimization of periodic pattern length in this embodiment).

In FIGS. 41, 42, 43A and 43B, a gate pattern with fine lines of a linewidth 0.12 micron was resolved by using a stepper having a KrF excimer laser of 248 nm in wavelength, as an exposure light source, and a projection optical system with a numerical aperture NA=0.60.

FIGS. 41–43B each shows a result of exposure of only a periodic pattern at (1), a result of exposure of only a standard pattern (gate pattern) at (2), and a result of dual exposure of these patterns at (3).

FIG. 42 shows an example wherein the length of the periodic pattern is made sufficiently longer than that of the standard exposure pattern. FIG. 43 shows an example wherein the length of the periodic pattern is made equal to that of the standard exposure pattern (optimization).

In FIGS. 42 and 43, the light quantity ratio of the standard exposure pattern and the periodic pattern is the same. The light quantity rate of the periodic pattern, as the highest intensity of the periodic pattern and the standard exposure pattern is taken as 1, is set to 17%.

FIG. 43A shows the same periodic pattern as of FIG. 41, and the light quantity rate of the periodic pattern is 20%. FIG. 43B shows the same periodic pattern as of FIG. 42, and the light quantity ratio of the periodic pattern is 25%.

Comparing FIGS. 41 and 42, it is seen that distortion of the composite pattern is reduced in the best focus state and in the defocus state. Also, comparing the composite patterns of FIGS. 43A and 43B, distortion of the composite pattern is substantially even in the best focus state and in the defocus state.

Here, it is seen the light quantity proportion of the periodic pattern without its length optimized changes from 17% to 20%, while the proportion of the periodic pattern with its length optimized changes from 17% to 25%, but that distortion of the composite pattern is substantially at the same level in the best focus state and in the defocus state.

In these periodic patterns, if the light quantity proportion of the periodic pattern is made not greater than 17%, while the shape becomes closer to an idealistic shape, the contract in the fine line portion decreases, and the image is blurred. The tolerance for such image blur is different in accordance with the contrast level as resolved by the resist. Thus, even if the lower limit of the light quantity proportion is determined by the contrast level that can be resolved by the resist, by optimizing the length of the periodic pattern, the upper limit of the light quantity proportion can be raised. Therefore, the latitude for exposure amount can be increased.

Namely, from the results, it is seen that degradation in shape is reduced even if the light quantity proportion of an optimized periodic pattern is enlarged. Also, it is seen that the latitude of exposure amount ratio, which is from 17% to 20% in relation to a periodic pattern not optimized, can be extended to 17% to 25% for a periodic pattern being optimized. Thus, the latitude for exposure amount ratio can be improved significantly.

For comparison of the intensity distributions in the one-dimensional section of FIGS. 41 and 42, description will be made in conjunction with FIGS. 36A, 36B and 38A and 38B.

Figure 35:
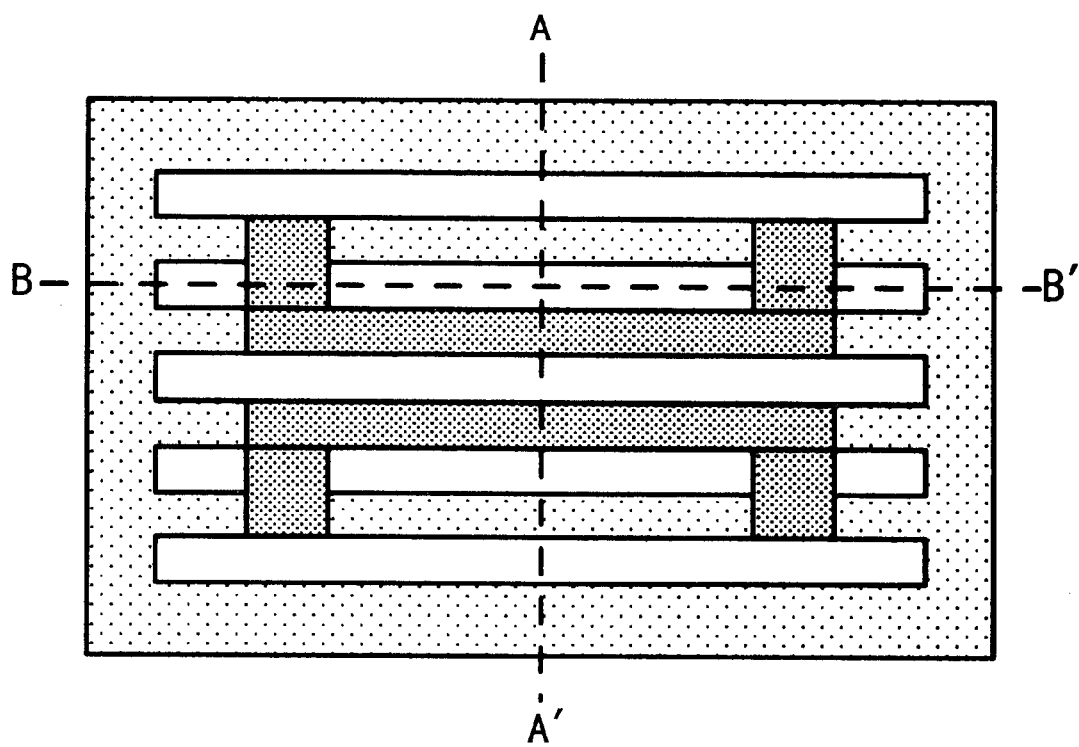
FIG. 35 is a schematic view for explaining an example wherein optimization of the length of a periodic pattern is not carried out.
Figure 36A:
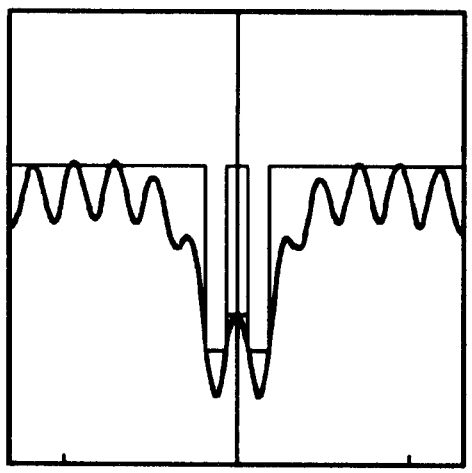
FIGS. 36A and 36B are schematic views, respectively, for explaining a phenomenon that, with a resist threshold with which in a section A–A' fine line elements can be idealistically separated, pattern contraction is produced in a section B–B' where distortion occurs.
Figure 36B:
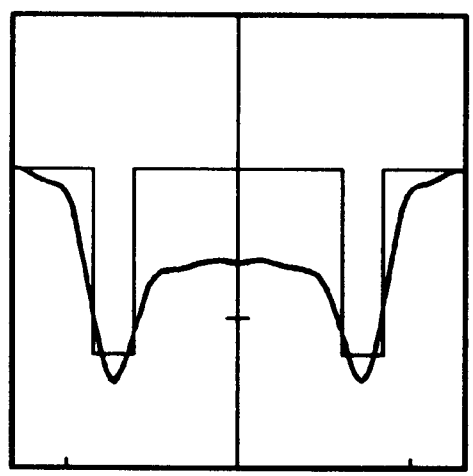
Figure 37:
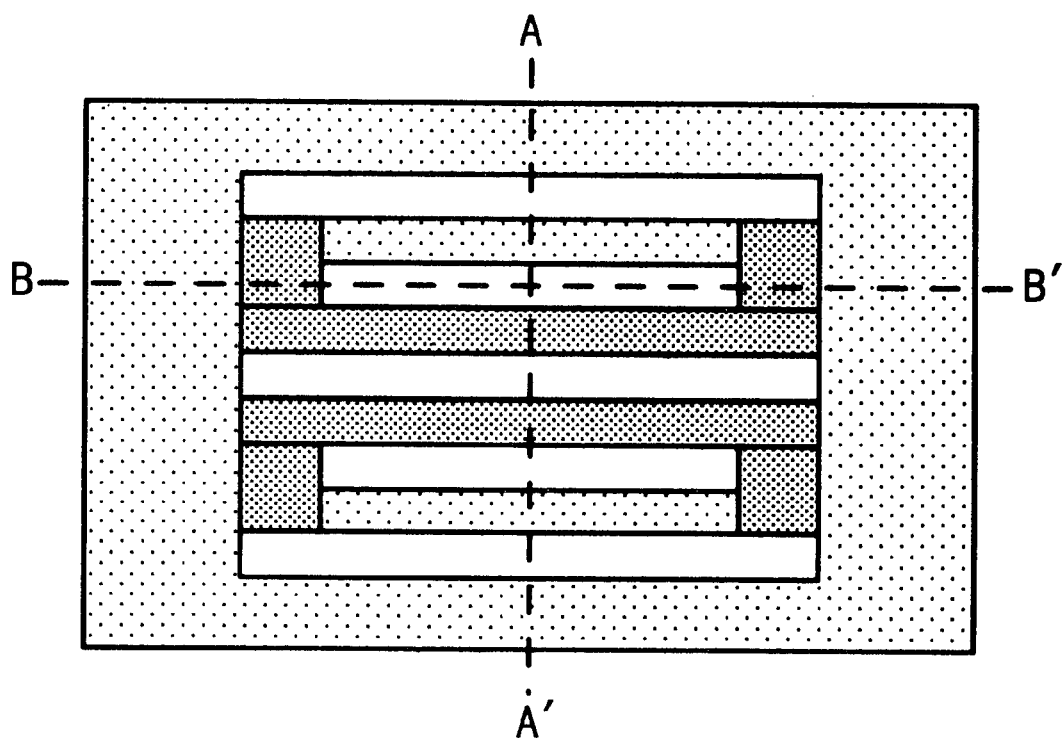
FIG. 37 is a schematic view of an example wherein optimization of the length of a periodic pattern is carried out, in an embodiment of the present invention.
Figure 38A:
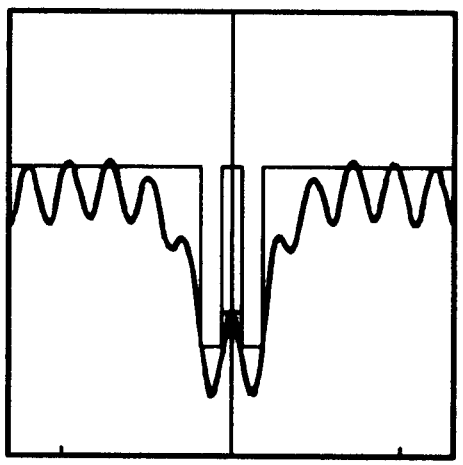
FIGS. 38A and 38B are schematic views, respectively, for explaining a phenomenon that, with a resist threshold with which in a section A–A' fine line elements can be idealistically separated, no pattern contraction is produced in a section B–B' where distortion occurs.
Figure 38B:
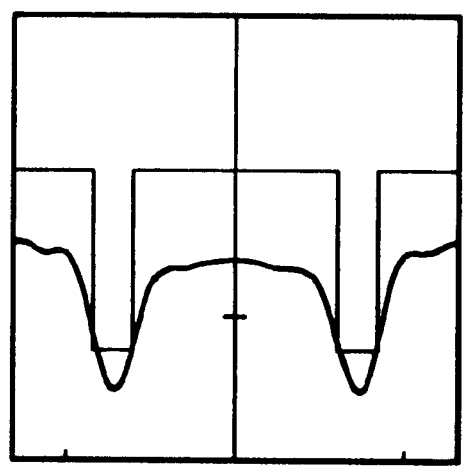

FIGS. 36A and 36B show light intensity distributions of the pattern of FIG. 35, in the A–A' section and B–B' section, wherein the length of the pattern is not optimized. FIGS. 38A and 38B show light intensity distributions of the pattern of FIG. 37, in the A–A' section and B–B' section, wherein the length of the pattern is optimized. In these drawings, each distribution can be compared with an idealistic intensity distribution shape, and the intensity peak (smallest value) of the idealistic image shape is adjusted with the resist threshold. The portion having an intensity not greater than the resist threshold can be formed as an image.

In FIG. 36, at the resist threshold for separation of fine lines in the section A–A', there occurs contraction of the pattern in the section B–B'. As compared therewith, in FIG. 38, at the resist threshold for separation of fine lines in the section A–A', there occurs substantially no contraction of the pattern in the section B–B'.

In this embodiment, as described above, the length of a periodic pattern is optimized and, on the basis of that an edge of a periodic pattern (sectional intensity distribution) and an edge of a standard exposure pattern have opposite tilts, the edge of a composite pattern is made gentle. The size of the image at the resist threshold is thus enlarged, and distortion or thinning can be removed.

Further, since the tilt of the light intensity distribution near the resist threshold level is made gentle, a small change in exposure amount intensity about the resist threshold does not cause a large change in size of the pattern.

Thus, the latitude for exposure amount ratio is enlarged, and also the latitude for the whole exposure amount corresponding to the sum of exposure amounts is also enlarged.

Further, in accordance with this embodiment, on the basis of that an edge of a periodic pattern (exposure amount distribution) and an edge of a standard exposure pattern have opposite tilts, the edge of a composite pattern is made gentle. Also, distortion of a portion ranging to the periodic pattern is made smaller, and the latitude for exposure amount and for the exposure amount ratio can be widened.

In such case, the length of a periodic pattern comprising a pattern 2 is made equal, upon a wafer, to the length of a standard exposure pattern comprising a pattern 1. If the spacing of patterns in the standard exposure pattern is not smaller than the resolution but it has a width that can be resolved, the length of the periodic pattern may be set to be equal to the fine pattern length upon the wafer.

Namely, as shown in FIG. 44, the length L of the periodic pattern should desirably be in a range from the length L1 of the fine pattern of the standard exposure pattern to the length L2 of the standard pattern.

On the other hand, since the length of the periodic pattern may be contracted, the length may preferably be set to be slightly longer while expecting the contraction, so that a desired length is provided after the contraction. If the contraction is denoted by α, then the length L of the periodic pattern upon the mask should preferably be from L1+α to L2+α. Here, the periodic pattern is described as being a Levenson type phase shift mask, the pattern is not limited to it. An edge type phase shift mask such as shown in FIG. 45A, or a binary mask of constant phase such as shown in FIG. 45B, are usable, if the edge of an end of the periodic pattern is made with a tilt opposite to that of an edge of the standard exposure pattern.

FIGS. 46A and 46B each shows a periodic pattern and a standard exposure pattern. FIG. 46A shows a case wherein the length of the periodic pattern is L1+α in the above-described range, while FIG. 46B shows a case wherein the length is L2+α.

Figure 47A:
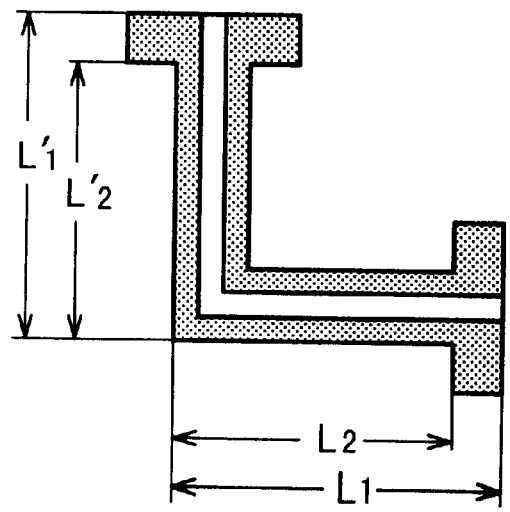
FIGS. 47A, 47B and 47C are schematic views for explaining an example wherein a pattern to be produced finally has fine line elements of L-shaped, in another embodiment of the present invention.
Figure 47B:
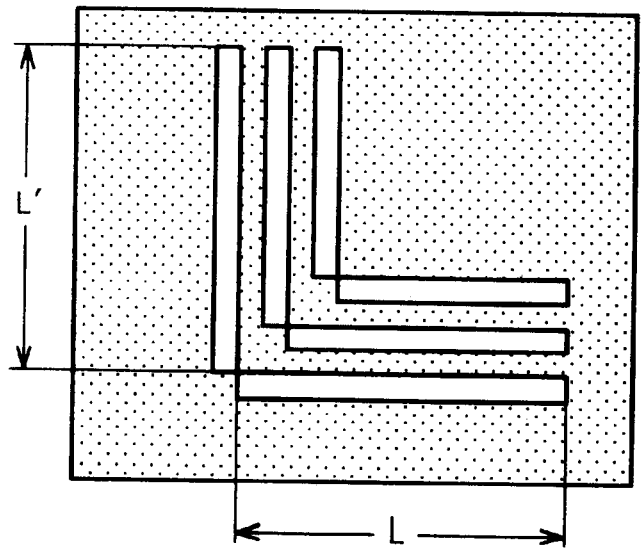
Figure 47C:
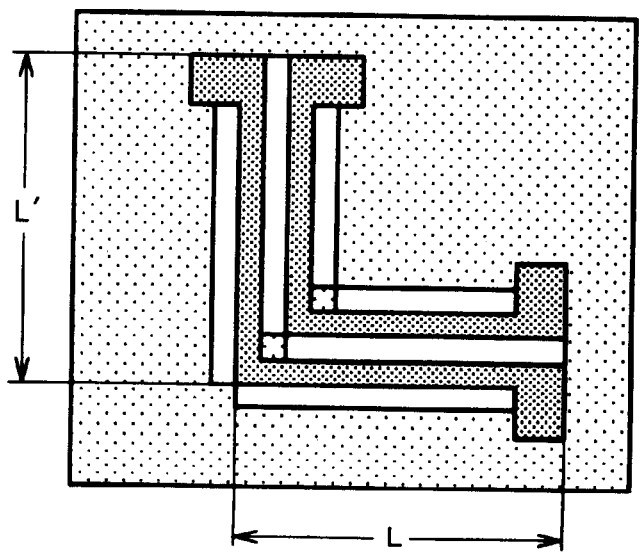

Referring to FIGS. 47A–47C, another embodiment will be described. This embodiment concerns an example wherein a pattern to be produced finally has fine lines arrayed in an L shape.

When a pattern to be produced is a gate pattern of L shape, the standard pattern is made as a pattern having a similar shape or size as the desired pattern, such as shown in FIG. 47A.

As regards the periodic pattern, a periodic pattern having longitudinal and lateral fine lines are formed such as shown in FIG. 47B, in parallel to the fine lines of the standard exposure pattern.

As shown in FIG. 47C, these pattern are aligned so that the central position of the fine lines is registered with the edge position, and then these patterns are photoprinted, whereby a desired pattern is produced.

The periodic pattern comprises parallel lines formed inside a rectangular having two sides parallel to the fine lines of the standard exposure pattern, and being formed with the pitch corresponding to the sum of the linewidth and spacing of the fine lines of the standard exposure pattern.

Here, in order to prevent superposition of fine lines, as shown in FIG. 47B, the length is so adjusted that, at the intersection of the fine lines, they engage with each other at a single point. As regards the size of the rectangular shape, each side has a length of L or L'. The length L should be, upon the wafer, from L1 of the fine pattern of the standard exposure pattern to L2 of the standard pattern length.

As regards L', it should be from L1' of the fine pattern of the standard exposure pattern to L2' of the standard pattern length.

Figure 48A:
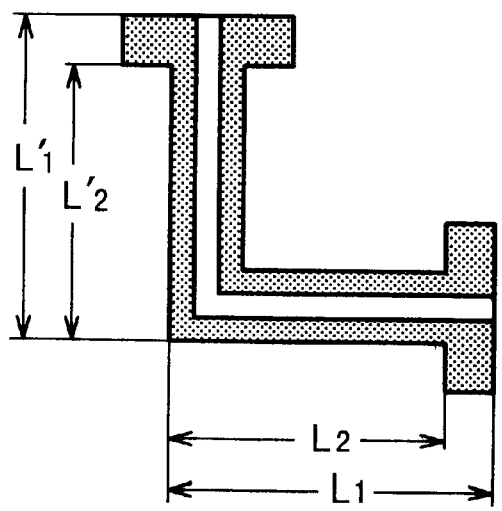
FIGS. 48A, 48B and 48C are schematic views for explaining another example wherein a pattern to be produced finally has fine line elements of L-shaped, in an embodiment of the present invention.
Figure 48B:
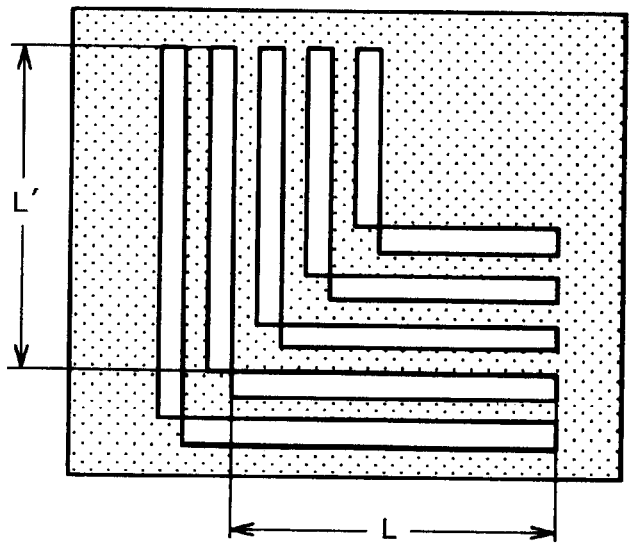
Figure 48C:
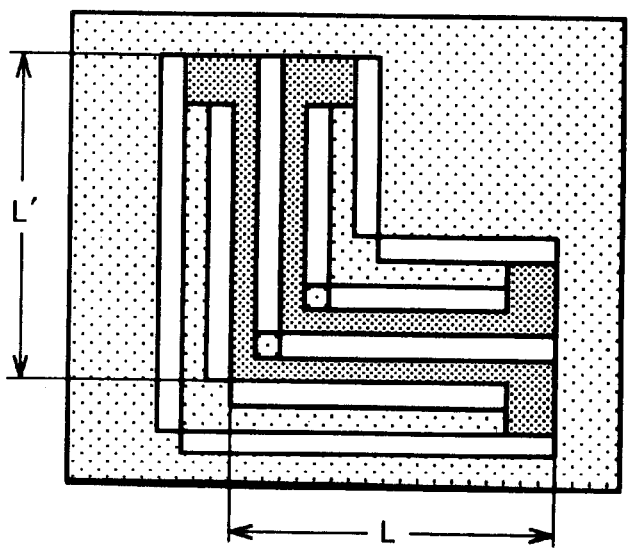

As an alternative, a periodic pattern such as shown in FIG. 48B may be printed in combination with the same standard exposure pattern.

Fine lines may be added in the outside of the rectangular shape having two sides parallel to the fine line of the standard exposure pattern. Also in that occasion, the length of the fine line should not be longer than the edge portion of the standard exposure pattern, and it should be such that, at the opposite side of the edge, the fine lines engage at a single point and do not superpose one upon another.

As described, even if the shape of the pattern is different, a particular note is given to the edge of the pattern. It is thus important to set the length of the periodic pattern and to place the same so that the edges of the standard exposure pattern and of the periodic pattern are superposed one upon another.

When the edges of these patterns are superposed, the edges having opposite tilts are cancelled with each other. As a result, the edge of a composite pattern is gentle. This effectively reduces the distortion of the portion ranging to the periodic pattern of the composite image, and to enlarge the latitude for exposure amount and for the exposure amount ratio.

Figure 49A:
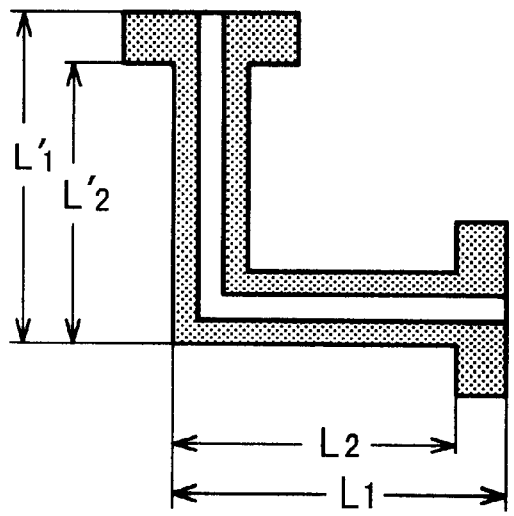
FIGS. 49A, 49B and 49C are schematic views for explaining a further example wherein a pattern to be produced finally has fine line elements of L-shaped, in an embodiment of the present invention.
Figure 49B:
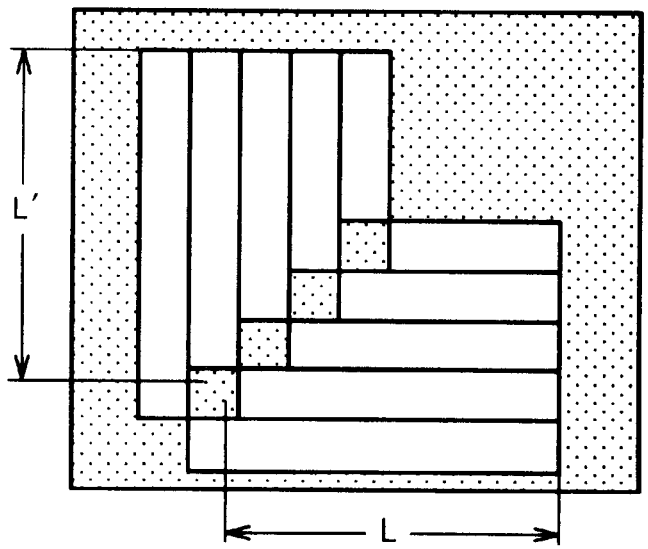
Figure 49C:
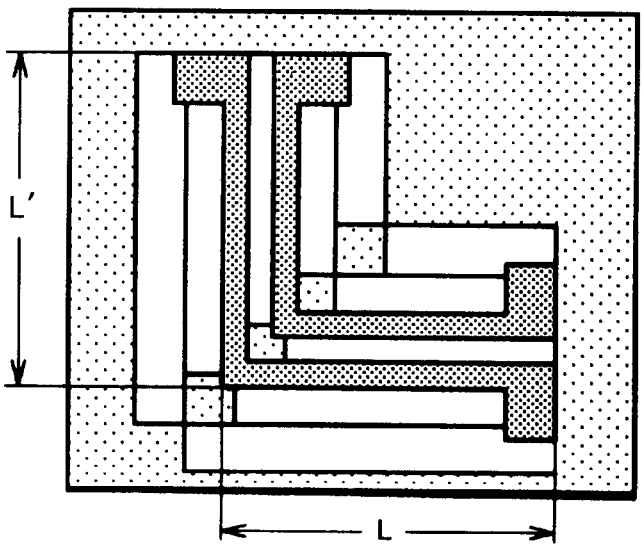

In that occasion, since the length of the periodic pattern may be contracted, the length may preferably be set slightly longer while expecting the contraction. If the contraction is denoted by α, then the length L of the periodic pattern upon the mask should preferably be from L1+α to L2+α. Here, the periodic pattern is described as being a Levenson type phase shift mask, the pattern is not limited to it. An edge type phase shift mask such as shown in FIGS. 49A–49C, or a binary mask of constant phase with oblique incidence illumination (not shown), are usable, if the edge of an end of the periodic pattern is made with a tilt opposite to that of an edge of the standard exposure pattern.

Figure 50:
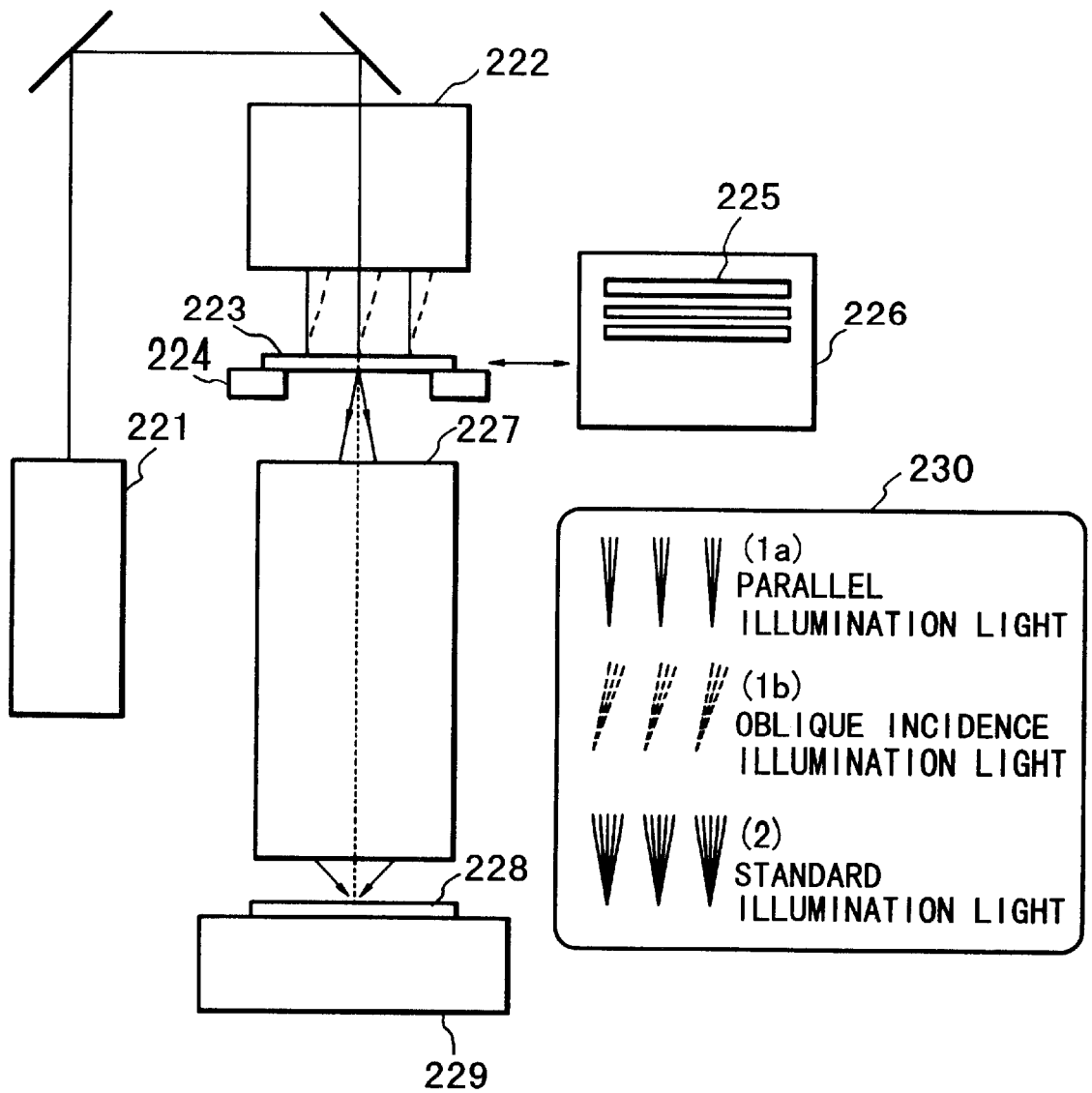
FIG. 50 is a schematic view of a high resolution exposure apparatus arranged to perform both a standard projection exposure and a dual-beam interference exposure for a periodic pattern.

FIG. 50 is a schematic view of a high-resolution exposure apparatus which is arranged to perform both a dual-beam interference exposure with which a periodic pattern of the present invention is usable, and a standard projection exposure.

Denoted in FIG. 50 at 221 is a KrF or ArF excimer laser, and denoted at 222 is an illumination optical system. Denoted at 223 is a mask (reticle), and denoted at 224 is a mask stage. Denoted at 227 is a projection optical system for projecting in a reduced scale a circuit pattern of the mask 223 onto a wafer 228. Denoted at 225 is a mask (reticle) changing mechanism for selectively supplying, to the stage 224, one of a standard reticle, a Levenson type phase shift mask (reticle), an edge shifter type mask (reticle), and a periodic pattern mask (reticle) without a phase shifter.

Denoted in FIG. 50 at 229 is an X-Y-Z stage which is used both for the dual-beam interference exposure and for the projection exposure. The stage 229 is movable along a plane perpendicular to the optical axis of the projection optical system 227 as well as along that optical system. The position of the stage with respect to the X, Y and Z directions can be controlled exactly by means of a laser interferometer, for example.

The exposure apparatus of FIG. 50 comprises a reticle alignment optical system, a wafer alignment optical system (off-axis alignment optical system, TTL alignment optical system or TTR alignment optical system), not shown in the drawing.

The illumination optical system 222 of FIG. 50 is arranged to interchangeably perform partially coherent illumination with large σ and partially coherent illumination with small σ. For the coherent illumination with small σ, illumination light (1a) or (1b) illustrated in the block 230 in the drawing is supplied to one of the Levenson type phase shift reticle, the edge shifter type reticle, and the periodic pattern reticle (binary mask) without a phase shifter. For partially coherent illumination with large σ, illumination light (2) shown in the block 230 is supplied to a desired reticle. Changing from the partially coherent illumination with large σ to coherent illumination with small σ can be done by replacing an aperture stop for large σ as disposed just after a fly's eye lens of the optical system 222 by a stop for small-σ coherent illumination.

Figure 51:
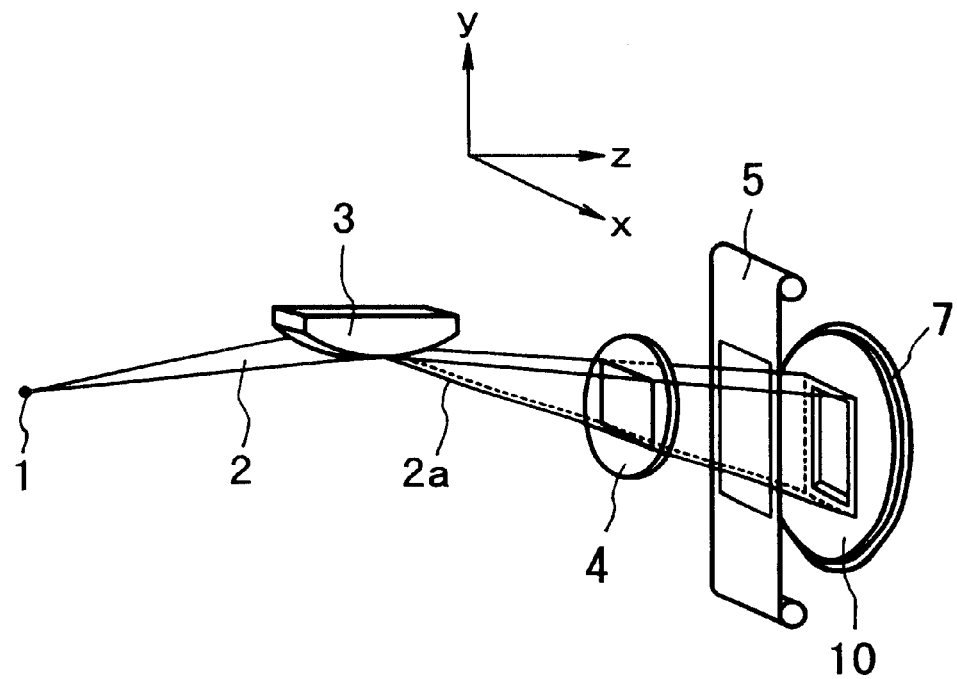
FIG. 51 is a schematic view of an X-ray proximity exposure apparatus.

Further, the methods of the present invention may be executed by using an X-ray exposure apparatus such as shown in FIG. 51.

Figure 52:
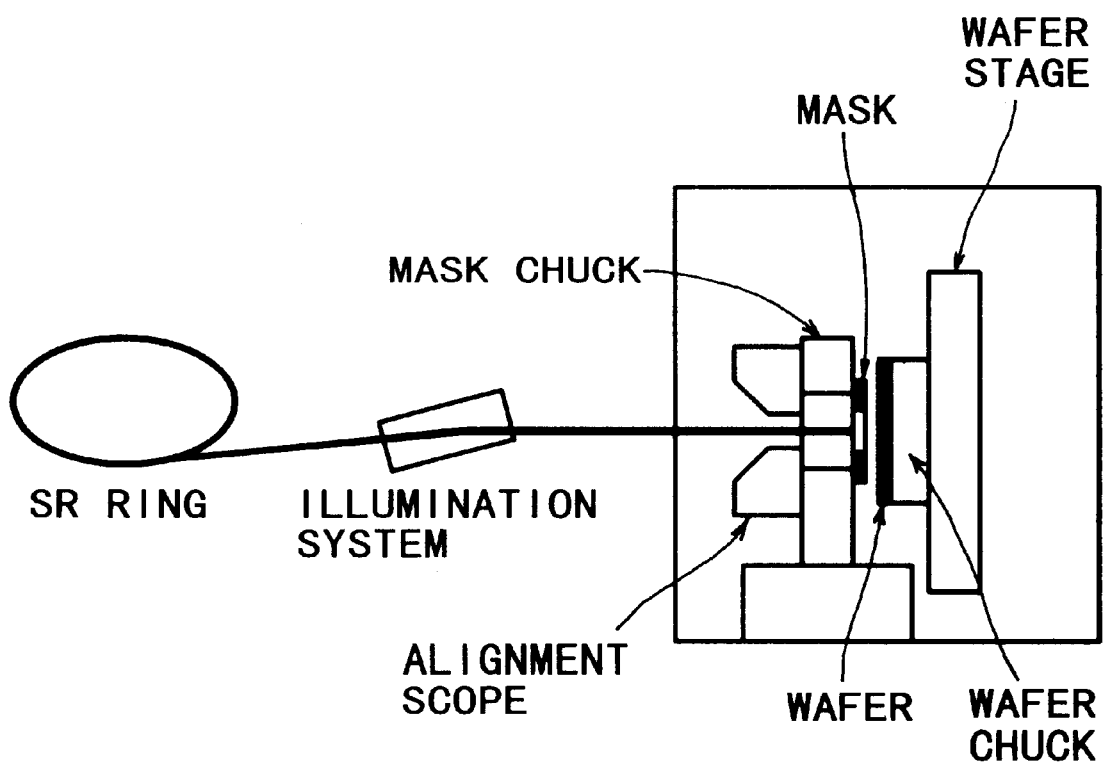
FIG. 52 is a schematic view of a general structure of an X-ray exposure apparatus.

FIG. 52 shows an example of X-ray proximity exposure apparatus (e.g., Japanese Laid-Open Patent Application, Laid-Open No. 100311/1990). Denoted in the drawing at 1 is an X-ray source (emission point) such as a synchrotron radiation orbit (SOR). Denoted at 2 is a SOR X-ray beam being expanded in a slit-like shape in X direction. Denoted at 3 is a convex mirror (made of SiC, for example) for expanding the slit-like X-ray beam 2 in Y direction. Denoted at 2a is an X-ray beam as expanded by the mirror 3. Denoted at 7 is a workpiece such as a semiconductor wafer being coated with a resist. Denoted at 10 is a mask.

Denoted at 4 is a beryllium film for separating the ambience at the SOR side and the ambience at the mask and workpiece side, from each other. Denoted at 5 is a focal plane shutter for adjusting the exposure amount.

In the exposure process, the mask 10 and the workpiece 7 are juxtaposed with each other, with a spacing (gap) of about 10 microns maintained therebetween. Then, the shutter 5 is opened, such that the slit-like high luminance X-ray beam from the SOR and being expanded by the mirror 3 into a plane beam X2a, is projected to the workpiece 7 through the mask 10, whereby an image of the pattern of the mask 10 is transferred to the workpiece 7 at a unit magnification.

As an alternative, an X-ray exposure apparatus such as shown in FIG. 52 may be used to execute the method of the present invention.

By using the exposure methods and exposure apparatuses as described hereinbefore, various devices such as semiconductor chips (e.g., IC or LSI), display devices such as (e.g., liquid crystal panel), detecting devices (e.g., magnetic head) or image pickup devices (e.g., CCD), can be produced.

While the invention has been described with reference to the structures disclosed herein, it is not confined to the details set forth and this application is intended to cover such modifications or changes as may come within the purposes of the improvements or the scope of the following claims.

What is claimed is:

1. An exposure method for exposing a substrate through a multiple exposure process including a first exposure using a first pattern having fine line elements of different directions, and a second exposure using a second pattern including a periodic pattern: wherein a periodicity direction of the periodic pattern is registered with a direction along which fine line elements of a predetermined direction, of the different directions, are arrayed, while, at least in a portion of the periodic pattern, a pattern or a boundary between adjacent patterns as well as a portion of or the whole of the fine line elements of the particular direction are adapted to be printed at the same location; and wherein the second pattern is so structured that one or those of the fine line elements of the first pattern extending in a particular direction different from the predetermined direction are not superposed with the periodic pattern.

2. An exposure method for exposing a substrate through a multiple exposure process including a first exposure using a first pattern having fine line elements of different directions, and a second exposure using a second pattern including a periodic pattern: wherein a periodicity direction of the periodic pattern is registered with a direction along which fine line elements of a predetermined direction, of the different directions, are arrayed, while, at least in a portion of the periodic pattern, a light blocking region or a boundary of a phase serviceable as a light blocking area as well as a portion of or the whole of the fine line elements of the particular direction are adapted to be printed at the same location; and wherein the second pattern is so structured that one or those of the fine line elements of the first pattern extending in a particular direction different from the predetermined direction are not superposed with the periodic pattern.

3. A method according to claim 1 or 2, wherein the periodicity direction of the periodic pattern is registered with a direction along which most fine line elements are arrayed.

4. A method according to claim 1 or 2, wherein the particular direction different from the predetermined direction corresponds to the periodicity direction.

5. A method according to claim 1 or 2, wherein the periodic pattern comprises a periodic pattern having a periodicity of not less than two and being provided by one of a Levenson type phase shift mask, an edge type phase shift mask and a binary type mask.

6. A method according to claim 1 or 2, wherein the second pattern has a region where no periodic pattern is formed, and wherein an isolated line element is formed in that region so that the isolated line element is to be superposed with a fine line element of a direction different from the predetermined direction.

7. A method according to claim 6, wherein the periodic pattern and the isolated line element are defined by one of a light blocking area and a light transmitting area.

8. A method according to claim 6, wherein the isolated line element has a size or a shape which is different in accordance with a fine line element of a direction different from the predetermined direction.

9. A method according to claim 1 or 2, wherein those of the fine line elements of a direction different from the predetermined direction include at least one having a linewidth larger than a resolution.

10. An exposure method for exposing a substrate through a multiple exposure process including a first exposure using a first pattern and a second exposure using a second pattern: wherein the first pattern includes a periodic pattern and has a region for correcting pattern distortion due to an optical proximity effect in the exposure of the second pattern.

11. A method according to claim 10, wherein the region for correcting pattern distortion due to the optical proximity effect is provided by a region inside a pattern region for the periodic pattern of the first pattern where no periodic structure is formed.

12. A method according to claim 10, wherein the second pattern is adapted to produce a light intensity distribution of multiple levels, upon a surface of the substrate.

13. A method according to claim 10, wherein the second pattern has a shape directly corresponding to a design pattern to be produced on the substrate or similar to the design pattern.

14. A method according to claim 13, wherein the first pattern is arranged so that the correction of pattern distortion due to the optical proximity effect is performed such that a light intensity distribution to be provided thereby becomes similar to the design pattern.

15. A method according to claim 13, wherein the first and second patterns are arranged so that the correction of pattern distortion due to the optical proximity effect is performed such that a light intensity distribution of a composite image to be produced by superposed exposures of the first and second patterns, becomes similar to the design pattern.

16. A method according to claim 11, wherein, in the region inside the periodic pattern region of the first pattern where there is no periodic structure, a region having a locally thickened linewidth is defined by which the correction of pattern distortion due to the optical proximity effect is performed.

17. A method according to claim 16, wherein, in the region inside the periodic pattern region of the first pattern where there is no periodic structure, and in such portion where a fine line element of the second pattern, of a direction not orthogonal to a periodicity direction of the first pattern, there is an isolated line element formed, and wherein a linewidth of the isolated line element is made larger than the linewidth of the fine line element of the second pattern.

18. A method according to claim 17, wherein the linewidth of the isolated line element is optimized so that a fine line element of a composite image to be produced by the periodic pattern of the first pattern and a fine line element of a composite image to be produced by the isolate line element have substantially the same linewidth.

19. A method according to claim 11, wherein a correction pattern is formed in a region inside the periodic pattern region of the first pattern where no periodic structure is formed, by which the correction of pattern distortion due to the optical proximity effect is performed.

20. A method according to claim 19, wherein, when an isolated line element to be superposed with a fine line element of the second pattern, of a direction not orthogonal to the periodicity direction of the first pattern, is present in the region inside the periodic pattern region of the first pattern where no periodic structure is formed, the correction pattern is formed to substantially correct contraction of the isolated line element.

21. A method according to claim 10, wherein, in the first pattern, a pattern having a linewidth at least three times larger than the narrowest line element of the second pattern is formed with a light blocking area, for light quantity adjustment.

22. A method according to claim 10, wherein, in the first pattern, the linewidth is adjusted to adjust the whole light quantity balance of the first pattern.

23. A method according to claim 10, wherein the first pattern includes intersecting patterns, and wherein a light blocking area is defined at or adjacent an intersection of the intersecting patterns.

24. A method according to claim 10, wherein the first pattern includes L-shaped orthogonal patterns, and wherein a light blocking area is defined at or adjacent an intersection of the orthogonal patterns.

25. A method according to claim 10, wherein the first pattern includes T-shaped orthogonal patterns, and wherein a light blocking area is defined at or adjacent an intersection of the orthogonal patterns.

26. A method according to claim 10, wherein the first pattern comprises a periodic pattern having a periodicity not less than 2 and being provided by one of a Levenson type phase shift mask and a binary type mask.

27. An exposure method for exposing a substrate through a multiple exposure process including a first exposure using a first pattern having a fine line and a second exposure using a second pattern having a periodic pattern: wherein a length of a predetermined light passing region of the periodic pattern is made shorter than another light passing region of the periodic pattern, to thereby suppress distortion in a predetermined portion of the first pattern ranging to the predetermined light passing region in the multiple exposure process.

28. An exposure method for exposing a substrate through a multiple exposure process including a first exposure using a first pattern having a fine line and a second exposure using a second pattern having a periodic pattern: wherein a length of a predetermined light passing pattern of the periodic pattern is set so that an exposure amount distribution at an edge of the predetermined light passing pattern of the periodic pattern has a tilt opposite to that of an exposure amount distribution at an edge of a predetermined portion of the first pattern, ranging to the predetermined light passing pattern, such that they are combined with each other during the multiple exposure process.

29. An exposure method for exposing a substrate through a multiple exposure process including a first exposure using a first pattern having a fine line and a second exposure using a second pattern having a periodic pattern: wherein the second pattern is arranged so as to suppress distortion in a predetermined portion of the first pattern during the multiple exposure process.

30. A method according to claim 28, wherein a length of the periodic pattern is adjusted such that a length of a periodic pattern upon the substrate in its lengthwise direction is made equal to the length of the first pattern in the same direction as the lengthwise direction of the periodic pattern.

31. A method according to claim 30, wherein the length of the periodic pattern upon the substrate is set within an extent from the length equal to a length of a fine line element of the first pattern in the same direction as the lengthwise direction of the periodic pattern, to a length as determined by subtracting, from the length of the fine line element, a pattern width of of a pattern portion of the first pattern, ranging from the periodic pattern.

32. A method according to claim 31, wherein, as regards the length of the periodic pattern upon the substrate, a length corresponding to the periodic pattern length plus a length corresponding to contraction of the periodic pattern are accumulated.

33. A method according to claim 27, wherein the periodic pattern comprises a periodic pattern having a periodicity not less than two and being provided by one of a Levenson type phase shift mask, an edge type phase shift mask and a binary type mask.

34. A mask usable with an exposure method as recited in any one of claims 1–33, for supplying the first pattern in that exposure method.

35. A mask usable with an exposure method as recited in any one of claims 1–33, for supplying the second pattern in that exposure method.

36. A device manufacturing method including a process for producing a device by use of an exposure method as recited in any one of claims 1–33.

* * * * *

UNITED STATES PATENT AND TRADEMARK OFFICE
CERTIFICATE OF CORRECTION

PATENT NO. : 6,351,304 B1
DATED : February 26, 2002
INVENTOR(S) : Miyoko Kawashima et al.

It is certified that error appears in the above-identified patent and that said Letters Patent is hereby corrected as shown below:

Drawings,
Sheet 41, FIG. 45A, in (1), "PHASSE" should read -- PHASE --.

Column 1,
Line 17, "use" should read -- uses --.

Column 3,
Line 4, "producing" should read -- produce --.
Line 39, "lines" should read -- lines in --.

Column 5,
Line 67, "isolate" should read -- isolated --.

Column 7,
Line 8, "of of" should read -- of --.

Column 8,
Line 1, "view" should read -- views --.

Column 10,
Line 5, "L-shaped," should read -- L-shape, --.
Line 9, "L-shaped," should read -- L-shape, --.
Line 13, "L-shaped," should read -- L-shape, --.
Line 29, "solved," should read -- resolved, --.

Column 14,
Line 23, "anyone" should read -- any one --.
Line 33, "having" should be deleted.
Line 35, "portion" should read -- a portion --.
Line 37, "consist" should read -- consists --.
Line 43, "they" should read -- and --.

Column 15,
Line 48, "theses" should read -- these --.
Line 50, "is just to" should read -- can --.

UNITED STATES PATENT AND TRADEMARK OFFICE
CERTIFICATE OF CORRECTION

PATENT NO. : 6,351,304 B1
DATED : February 26, 2002
INVENTOR(S) : Miyoko Kawashima et al.

It is certified that error appears in the above-identified patent and that said Letters Patent is hereby corrected as shown below:

Column 16,
Line 14, "region" should read -- regions --.

Column 17,
Line 29, "theses" should read -- these --.

Column 18,
Line 40, "theses" should read -- these --.
Line 42, "is just to" should read -- can --.

Column 20,
Line 9, "Embodiment" should read -- Embodiments --.
Line 39, "not" should be deleted.

Column 21,
Line 10, "patter" should read -- pattern --.

Column 22,
Line 19, "patter" should read -- pattern --.

Column 24,
Line 34, "theses" should read -- these --.
Line 36, "is just to" should read -- can --.

Column 26,
Line 24, "patter" should read -- pattern --.

Column 30,
Line 23, "patter" should read -- pattern --.

Column 31,
Line 1, "contract" should read -- contrast --.
Line 18, "there" should read -- there is --.
Line 33, "being" should read -- are being --.
Line 53, "theses" should read -- these --.

UNITED STATES PATENT AND TRADEMARK OFFICE
CERTIFICATE OF CORRECTION

PATENT NO. : 6,351,304 B1
DATED : February 26, 2002
INVENTOR(S) : Miyoko Kawashima et al.

It is certified that error appears in the above-identified patent and that said Letters Patent is hereby corrected as shown below:

Column 32,
Line 32, "before" should read -- before being --.
Line 35, "before" should read -- before being --.
Line 55, "The" should read -- As regards the --.
Line 57, "before" should read -- before being --.

Column 33,
Line 24, "434B" should read -- 43B --.
Line 65, "contract" should read -- contrast --.

Column 34,
Line 32, "AS" should read -- As --.
Line 37, "that" should read -- the fact that --.
Line 52, "that" should read -- the fact that --.

Column 35,
Line 32, "pattern" should read -- patterns --.
Line 37, "rectangular" should read -- rectangular shape --.

Column 37,
Line 17, "SOR and" should read -- SOR, --.

Signed and Sealed this

Eighteenth Day of June, 2002

Attest:

JAMES E. ROGAN
Attesting Officer          Director of the United States Patent and Trademark Office